(12) United States Patent
Higashitani et al.

(10) Patent No.: US 12,349,353 B2
(45) Date of Patent: Jul. 1, 2025

(54) THREE-DIMENSIONAL NOR ARRAY AND METHOD OF MAKING THE SAME

(71) Applicant: SANDISK TECHNOLOGIES LLC, Addison, TX (US)

(72) Inventors: Masaaki Higashitani, Cupertino, CA (US); Peter Rabkin, Cupertino, CA (US); Hiroyuki Kinoshita, San Jose, CA (US); Satoshi Shimizu, Yokkaichi (JP); Yanli Zhang, San Jose, CA (US); Johann Alsmeier, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 207 days.

(21) Appl. No.: 18/352,025

(22) Filed: Jul. 13, 2023

(65) Prior Publication Data
US 2024/0206171 A1    Jun. 20, 2024

Related U.S. Application Data

(60) Provisional application No. 63/387,398, filed on Dec. 14, 2022.

(51) Int. Cl.
*G11C 16/34* (2006.01)
*G11C 16/10* (2006.01)
(Continued)

(52) U.S. Cl.
CPC .............. *H10B 43/27* (2023.02); *G11C 16/10* (2013.01); *G11C 16/14* (2013.01); *G11C 16/26* (2013.01); *H10B 43/30* (2023.02)

(58) Field of Classification Search
CPC .................................................... G11C 16/34
See application file for complete search history.

(56) References Cited

U.S. PATENT DOCUMENTS 9,842,651 B2   12/2017  Harari
9,892,800 B2    2/2018  Harari
(Continued)

FOREIGN PATENT DOCUMENTS

WO    WO2021118621 A1    6/2021

OTHER PUBLICATIONS

ISR—Notification of Transmittal of The International Search Report and Written Opinion of the International Searching Authority for International Patent Application No. PCT/US2023/036229, mailed Feb. 28, 2024, 12 pages.
(Continued)

*Primary Examiner* — Jason Lappas
(74) *Attorney, Agent, or Firm* — THE MARBURY LAW GROUP PLLC

(57) ABSTRACT

A semiconductor structure includes a vertical stack of repetition units, where each instance of the repetition unit extends along a first horizontal direction and includes a first electrically conductive strip, a first memory film located over the first electrically conductive strip, discrete semiconductor channels that are laterally spaced apart from each other along the first horizontal direction and located above the first memory film, a second memory film located above the discrete semiconductor channels, a second electrically conductive strip located above the second memory film, and an insulating strip located above the first electrically conductive strip. Source/drain openings are arranged along the first horizontal direction, interlaced with the discrete semiconductor channels, and vertically extending through the vertical stack of repetition units, and source/drain pillar structures are located in respective source/drain openings, and vertically extending through the vertical stack of repetition units.

20 Claims, 82 Drawing Sheets

(51) Int. Cl.
  *G11C 16/14* (2006.01)
  *G11C 16/26* (2006.01)
  *H10B 43/27* (2023.01)
  *H10B 43/30* (2023.01)

(56) References Cited

U.S. PATENT DOCUMENTS

| | | | |
|---|---|---|---|
| 10,593,692 | B2 | 3/2020 | Borukhov |
| 10,950,626 | B2 | 3/2021 | Kai et al. |
| 11,018,153 | B2 | 5/2021 | Kai et al. |
| 11,069,410 | B1 | 7/2021 | Cui et al. |
| 11,114,534 | B2 | 9/2021 | Rajashekhar et al. |
| 11,164,890 | B2 | 11/2021 | Zhang et al. |
| 11,251,199 | B2 | 2/2022 | Zhang et al. |
| 11,482,531 | B2 | 10/2022 | Said et al. |
| 11,631,686 | B2 | 4/2023 | Said et al. |
| 2020/0168630 | A1 | 5/2020 | Borukhov |
| 2021/0166773 | A1* | 6/2021 | Xu ............... G11C 11/5642 |
| 2021/0175251 | A1 | 6/2021 | Zhang et al. |
| 2021/0242241 | A1 | 8/2021 | Rajashekhar et al. |
| 2022/0254797 | A1 | 8/2022 | Said et al. |
| 2022/0310655 | A1 | 9/2022 | Rabkin et al. |
| 2022/0310656 | A1 | 9/2022 | Rabkin et al. |

OTHER PUBLICATIONS

Eitan, B. et al., "NROM: A novel localized trapping, 2-bit nonvolatile memory cell," in *IEEE Electron Device Letters*, vol. 21, No. 11, pp. 543-545, Nov. 2000, doi:10.1109/55.877205.

U.S. Appl. No. 17/534,528, filed Nov. 24, 2021, SanDisk Technologies LLC.

U.S. Appl. No. 17/664,542, filed May 23, 2022, SanDisk Technologies LLC.

U.S. Appl. No. 17/664,550, filed May 23, 2022, SanDisk Technologies LLC.

U.S. Appl. No. 17/673,137, filed Feb. 16, 2022, SanDisk Technologies LLC.

* cited by examiner

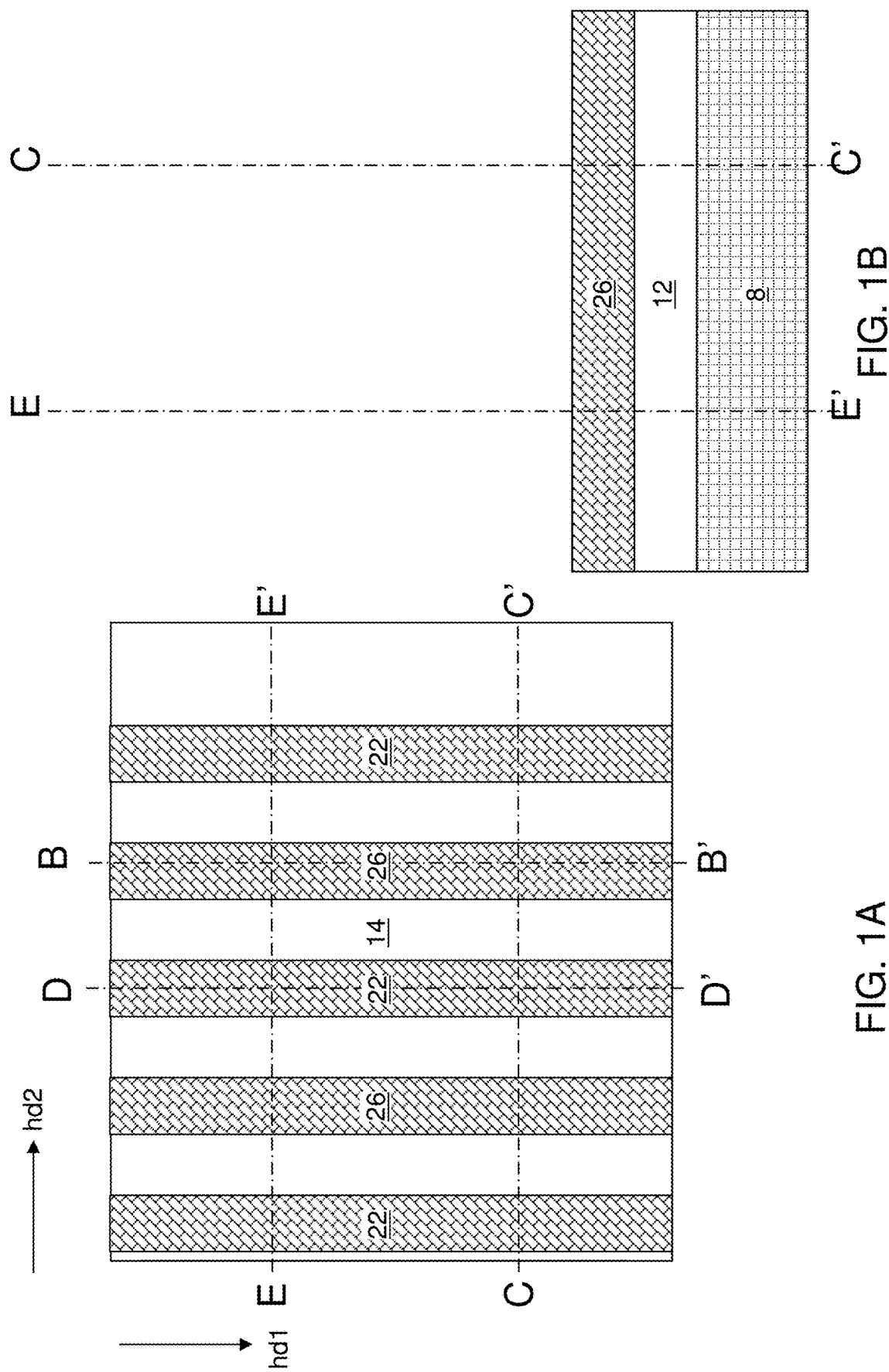

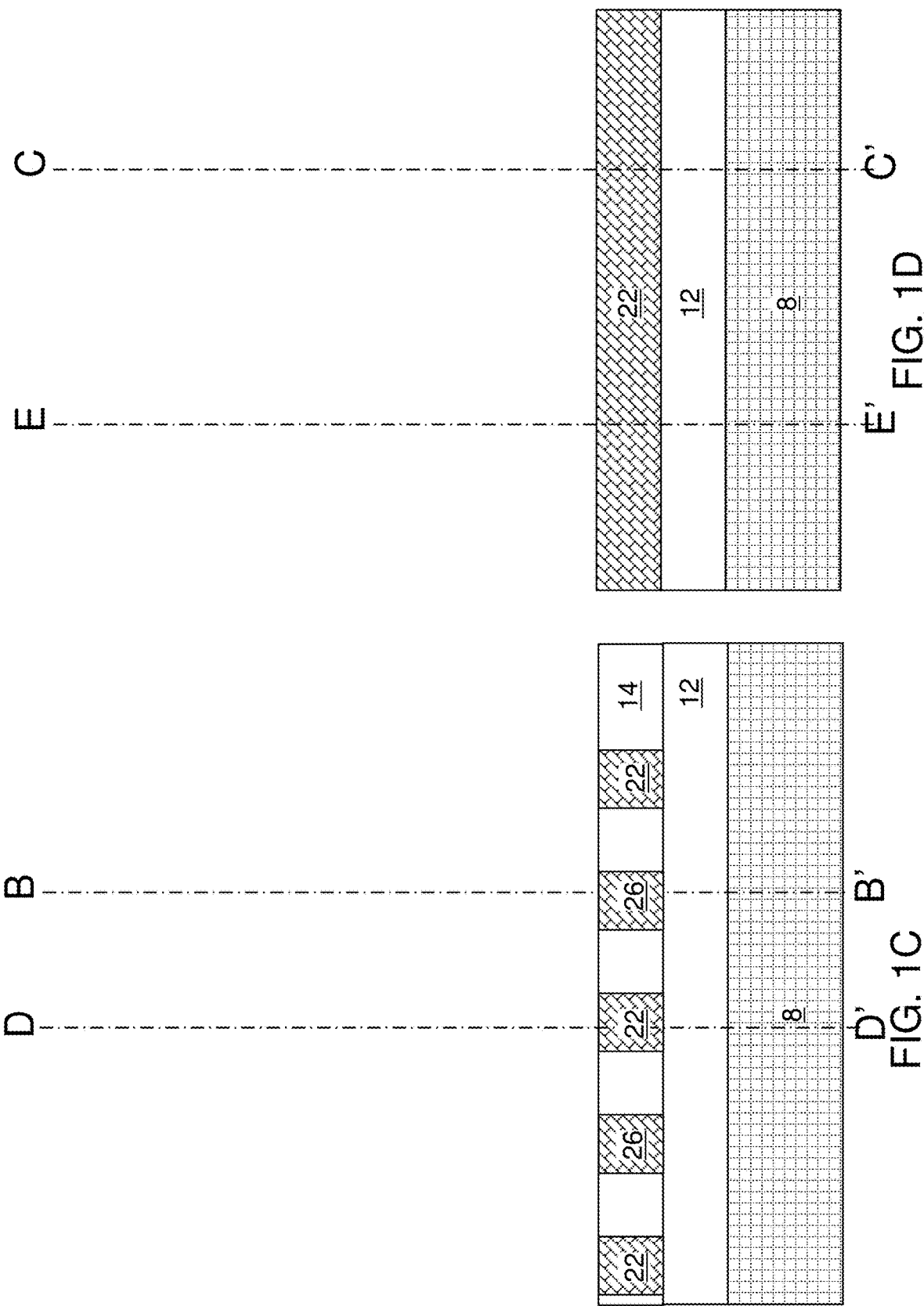

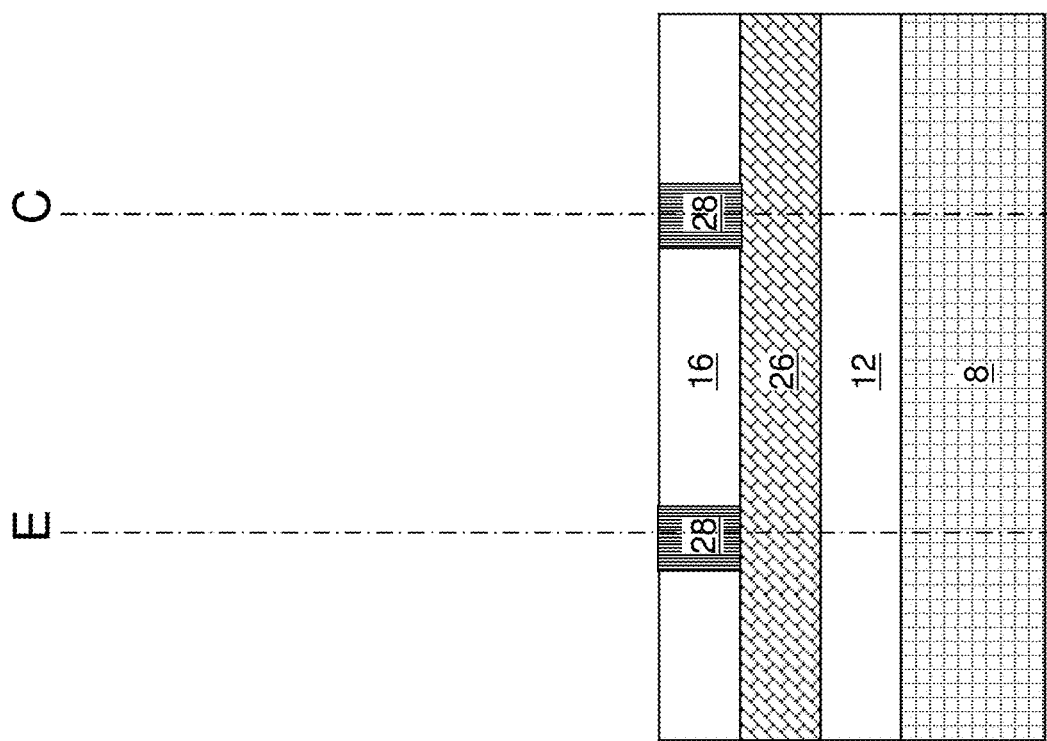
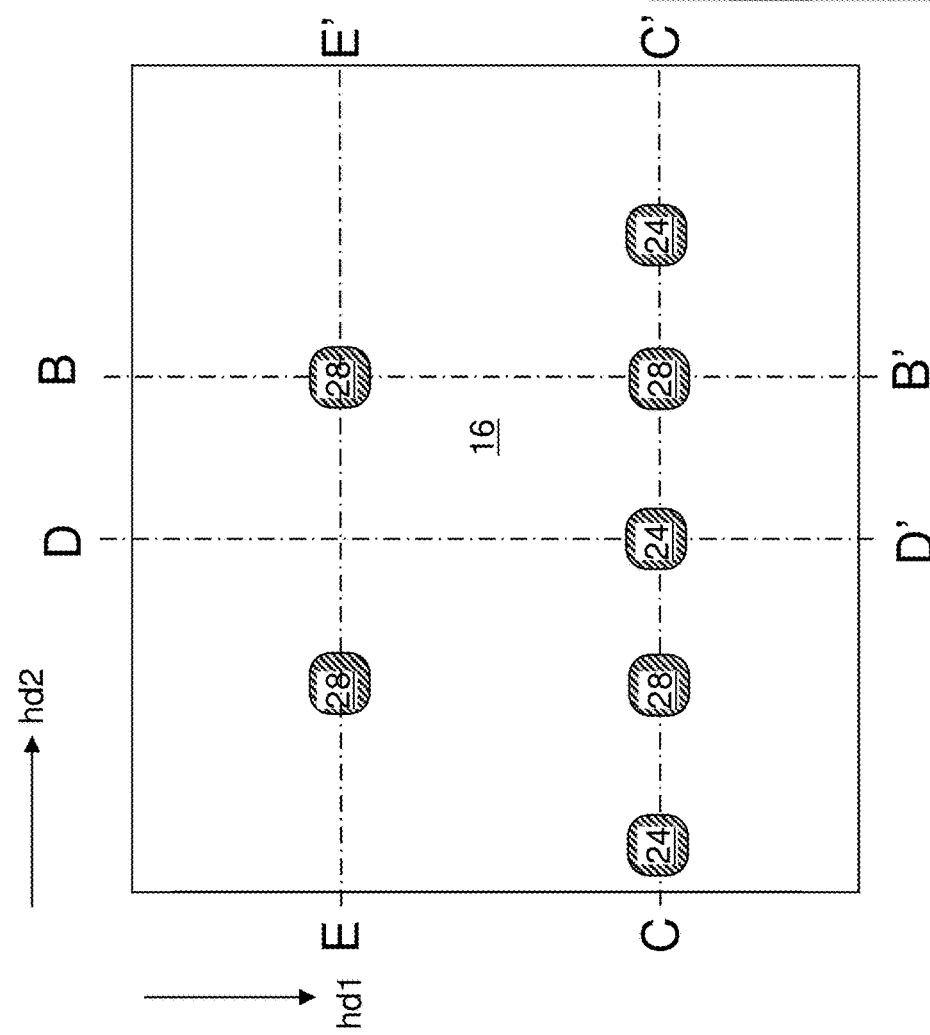
FIG. 2B
FIG. 2A

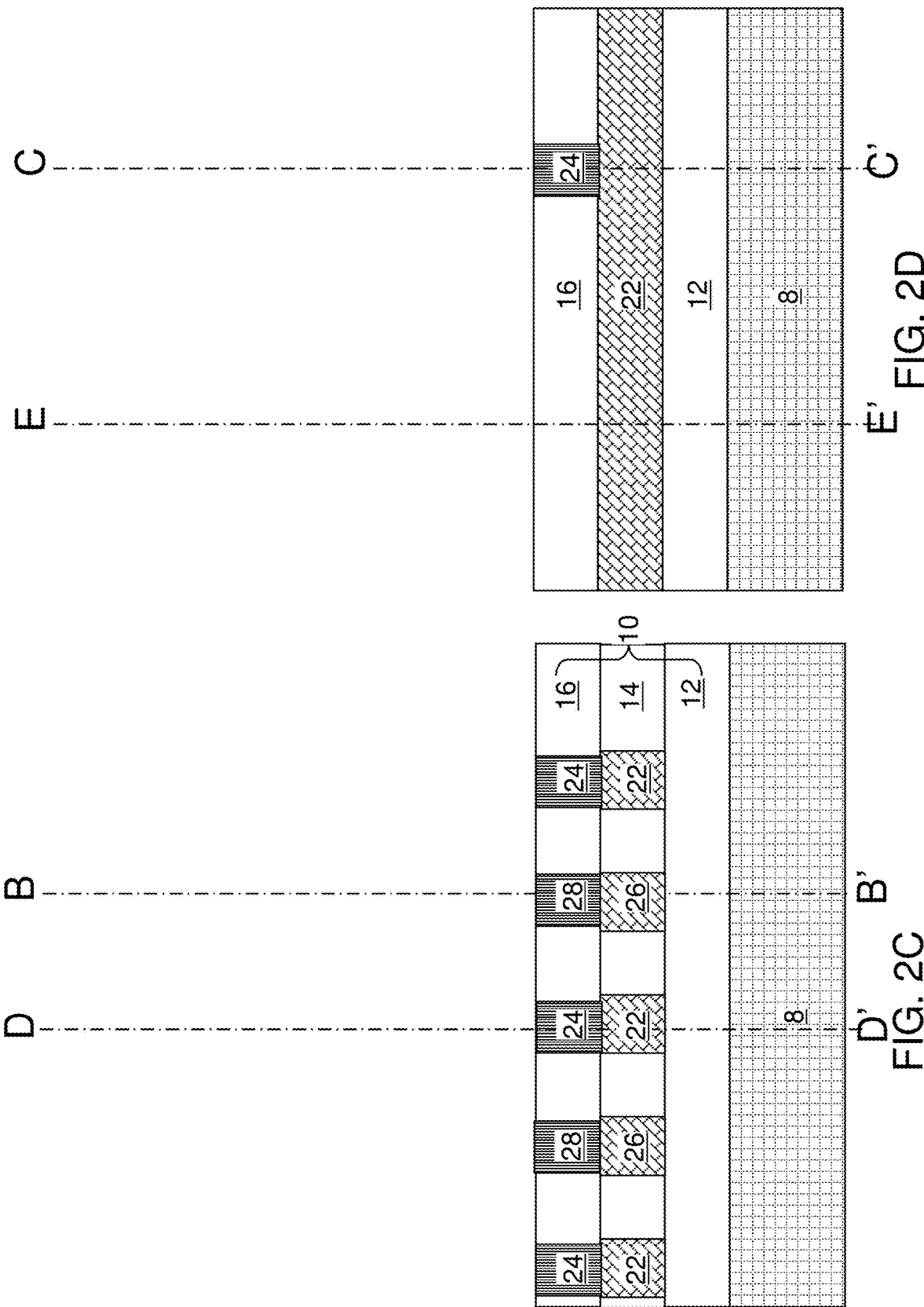

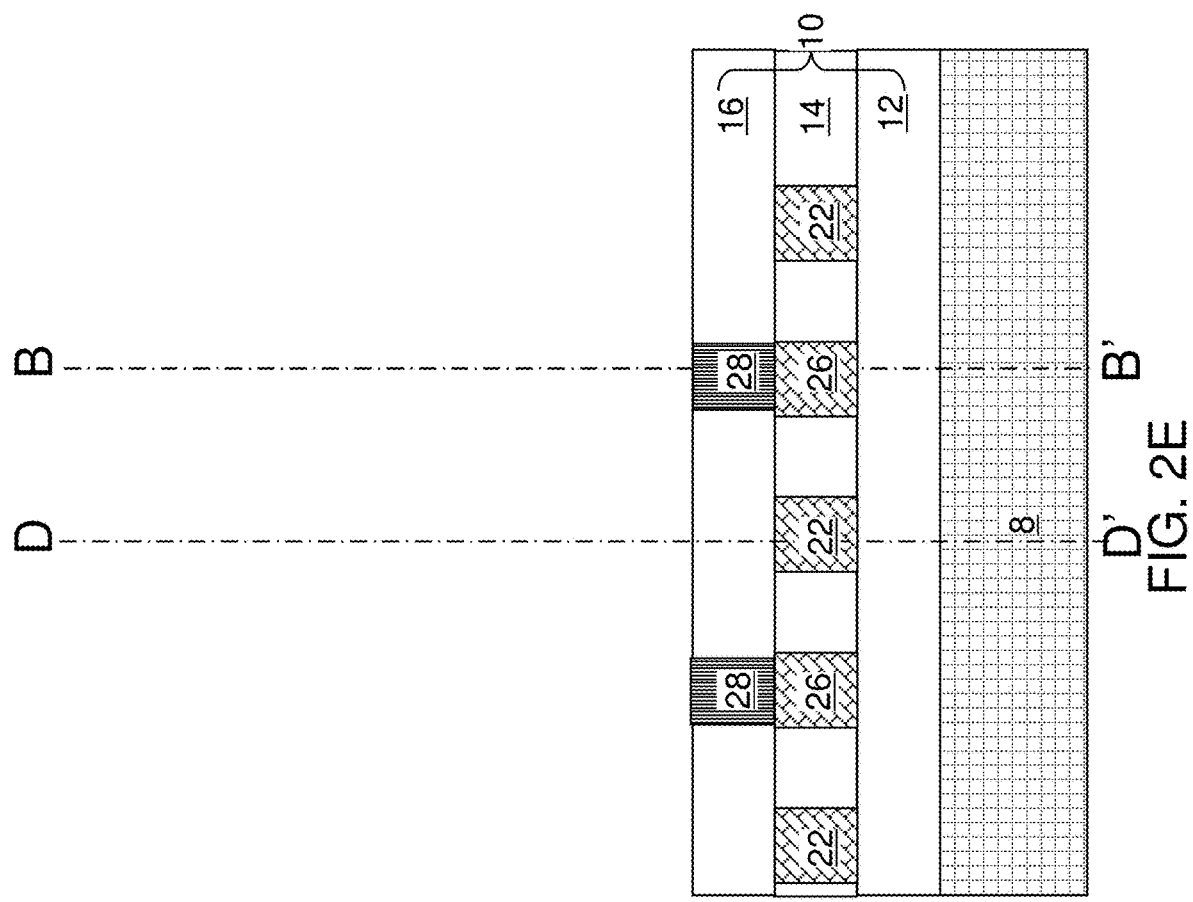

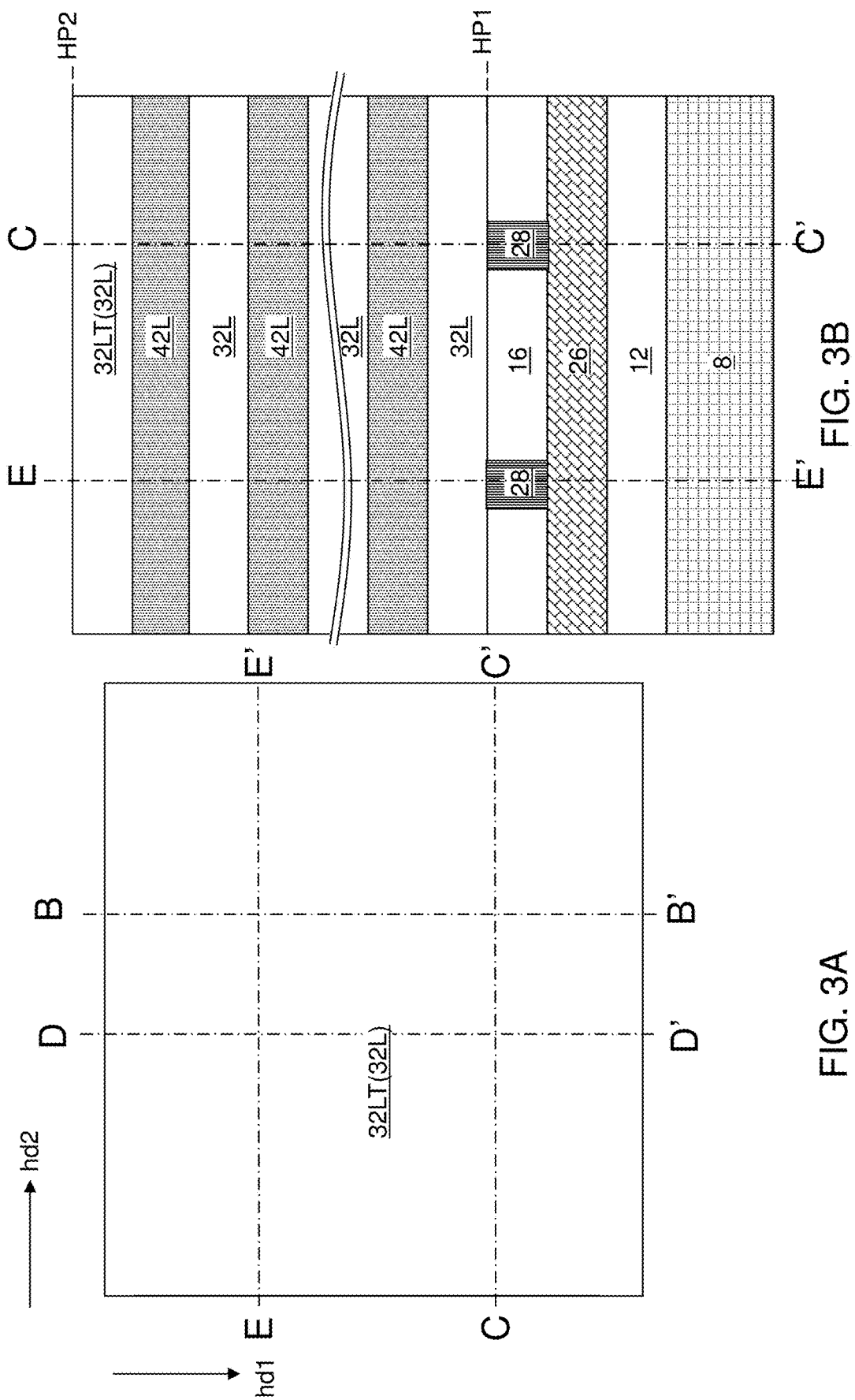

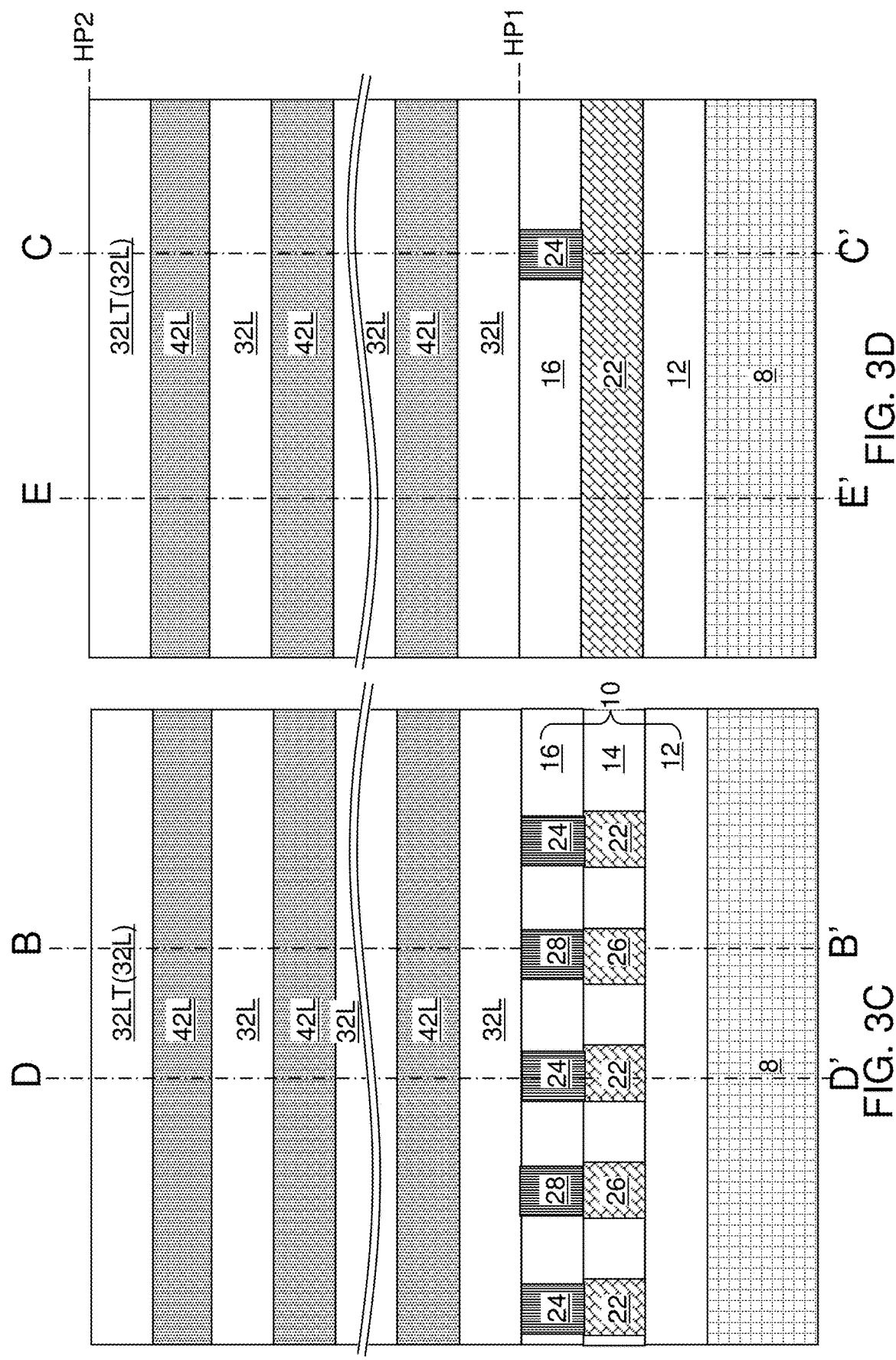

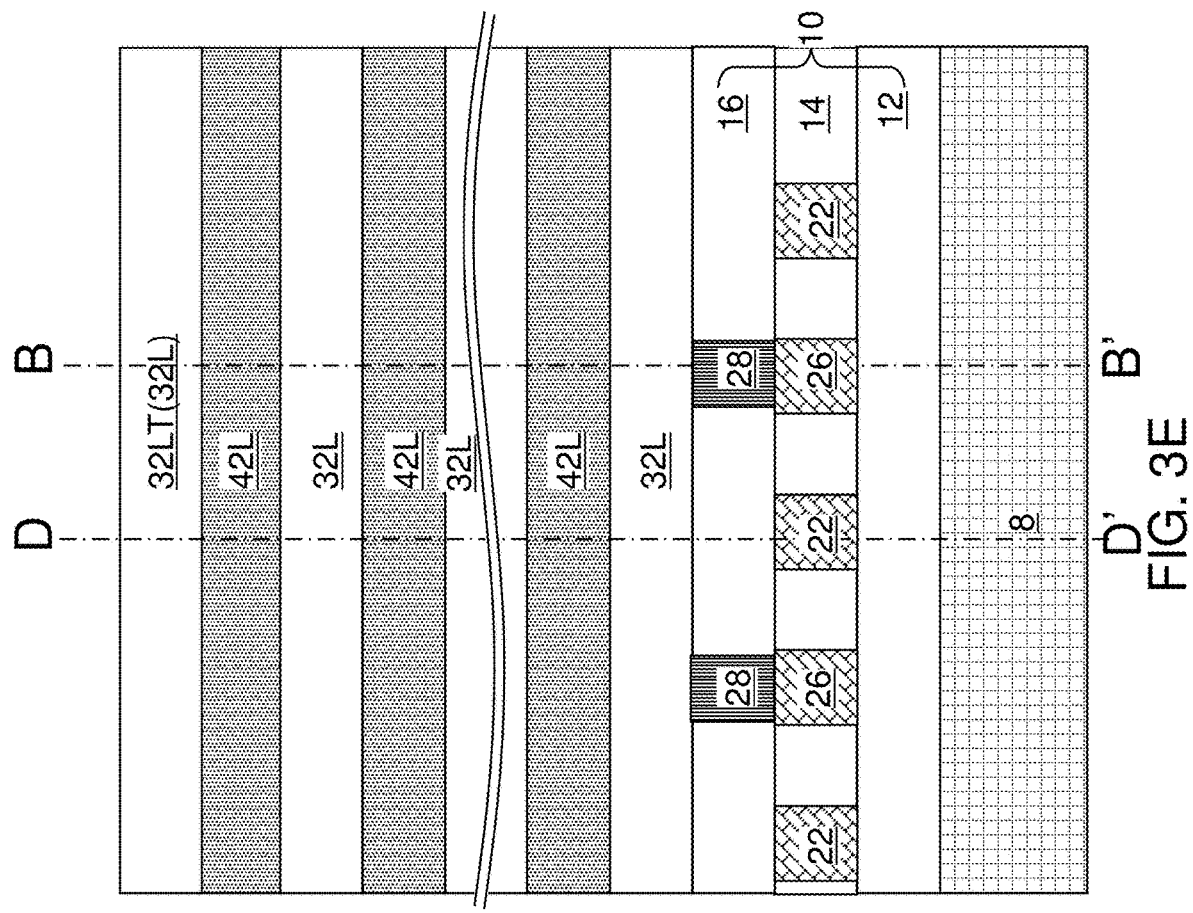

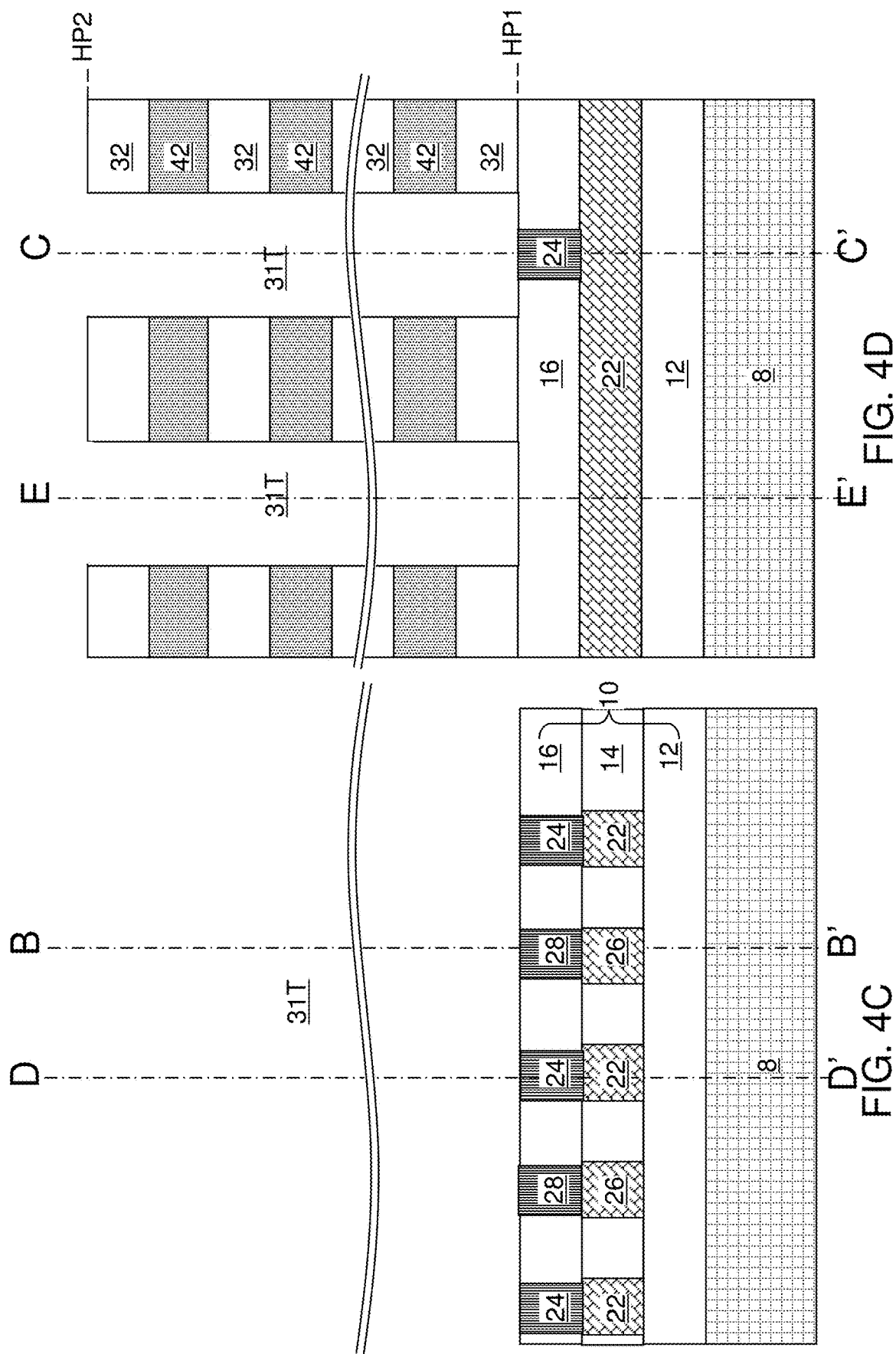

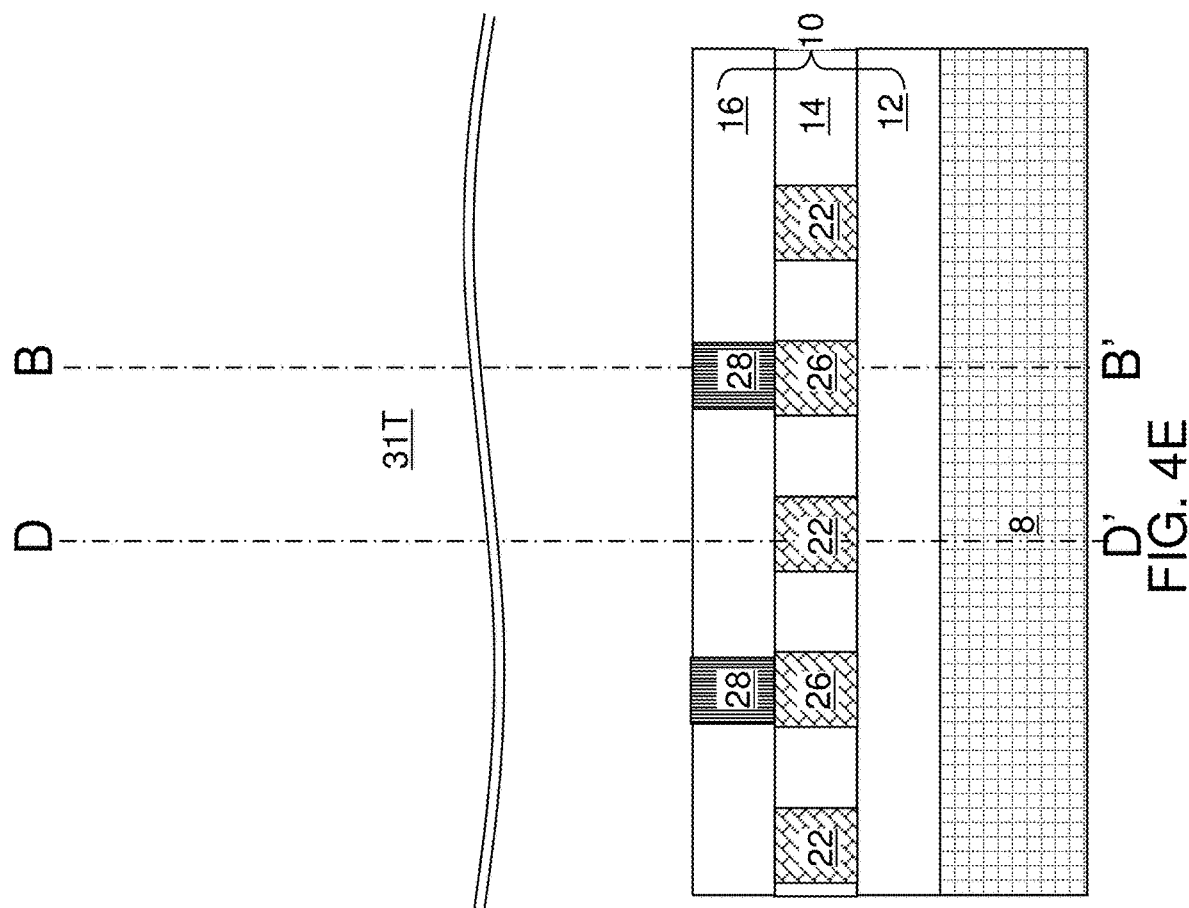

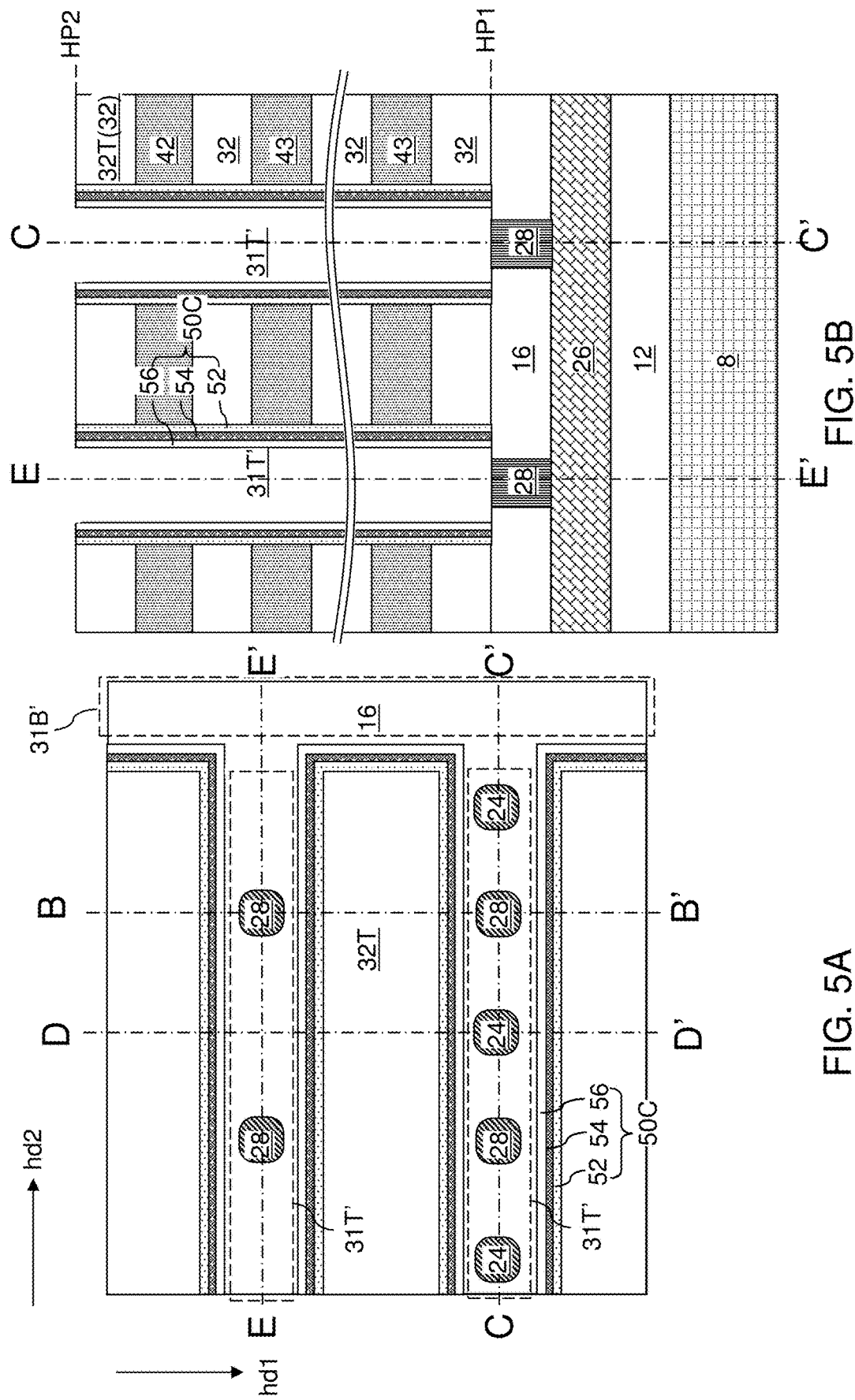

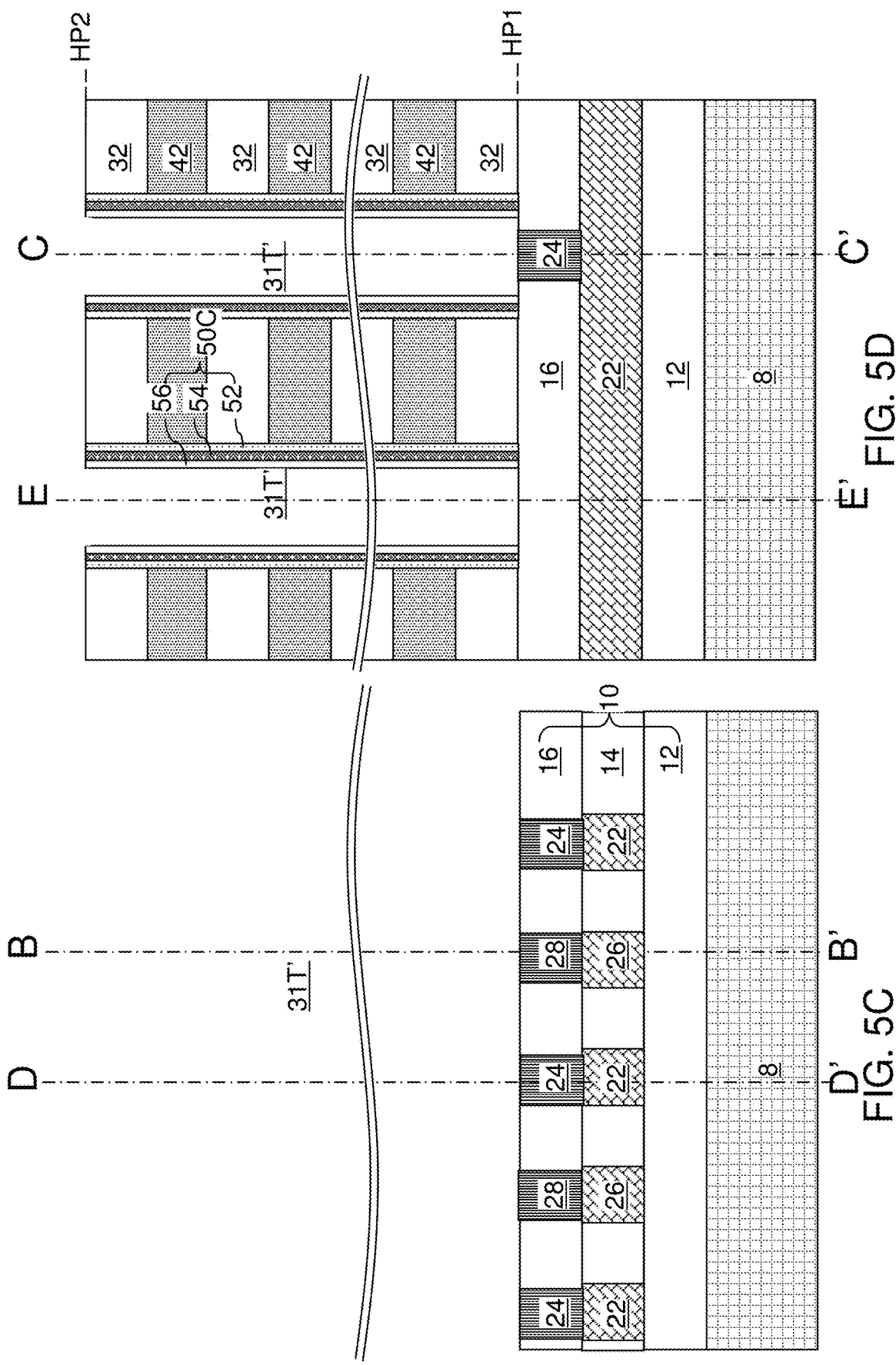

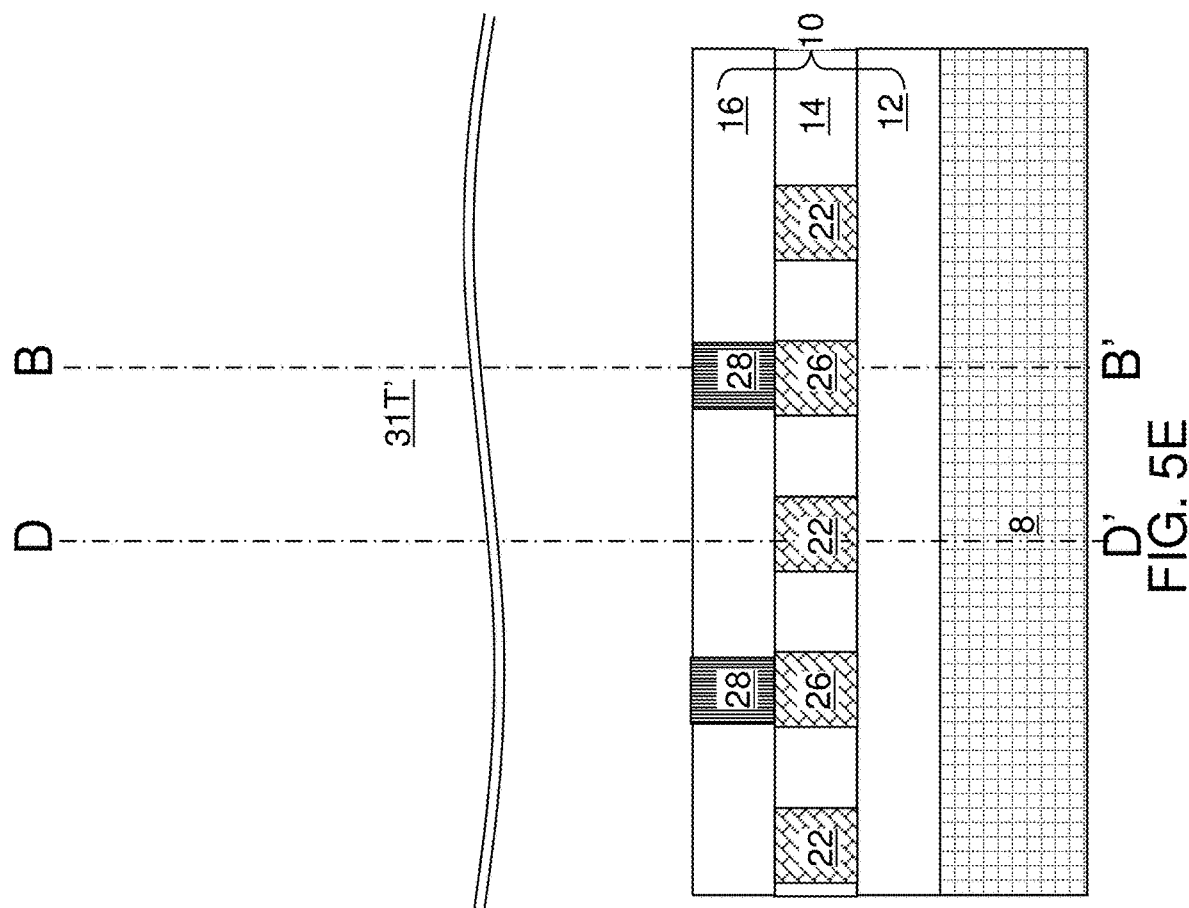

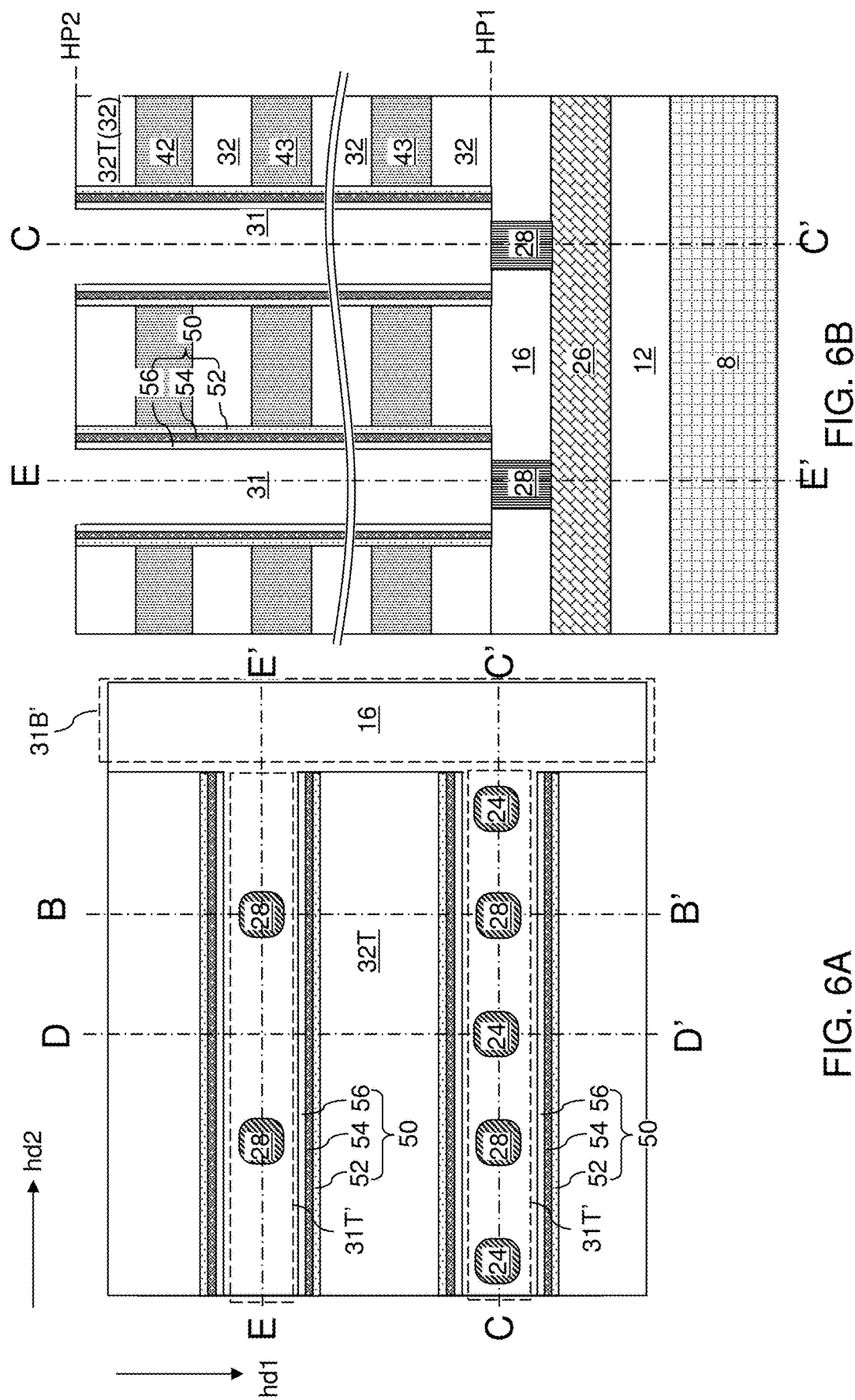

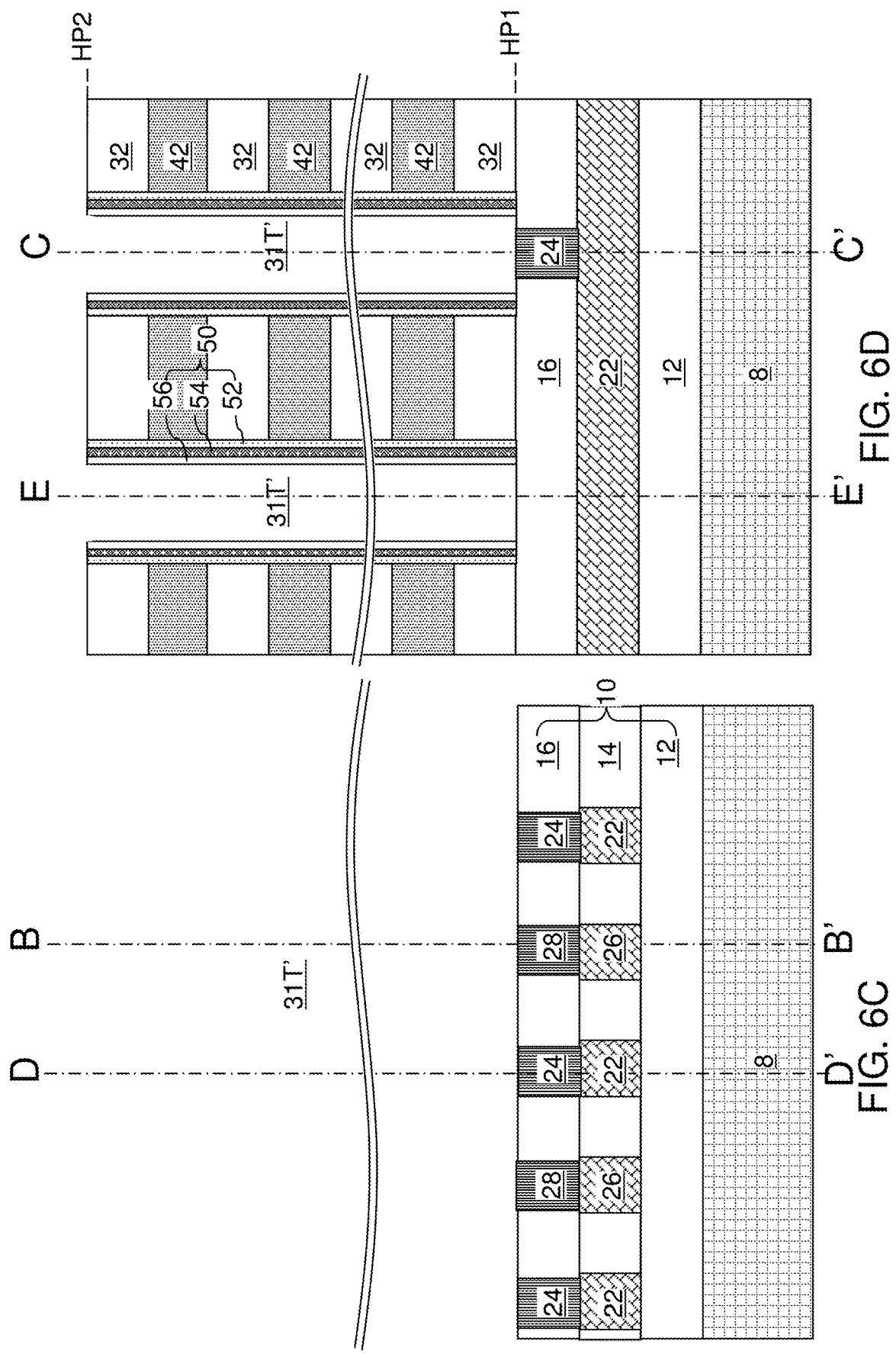

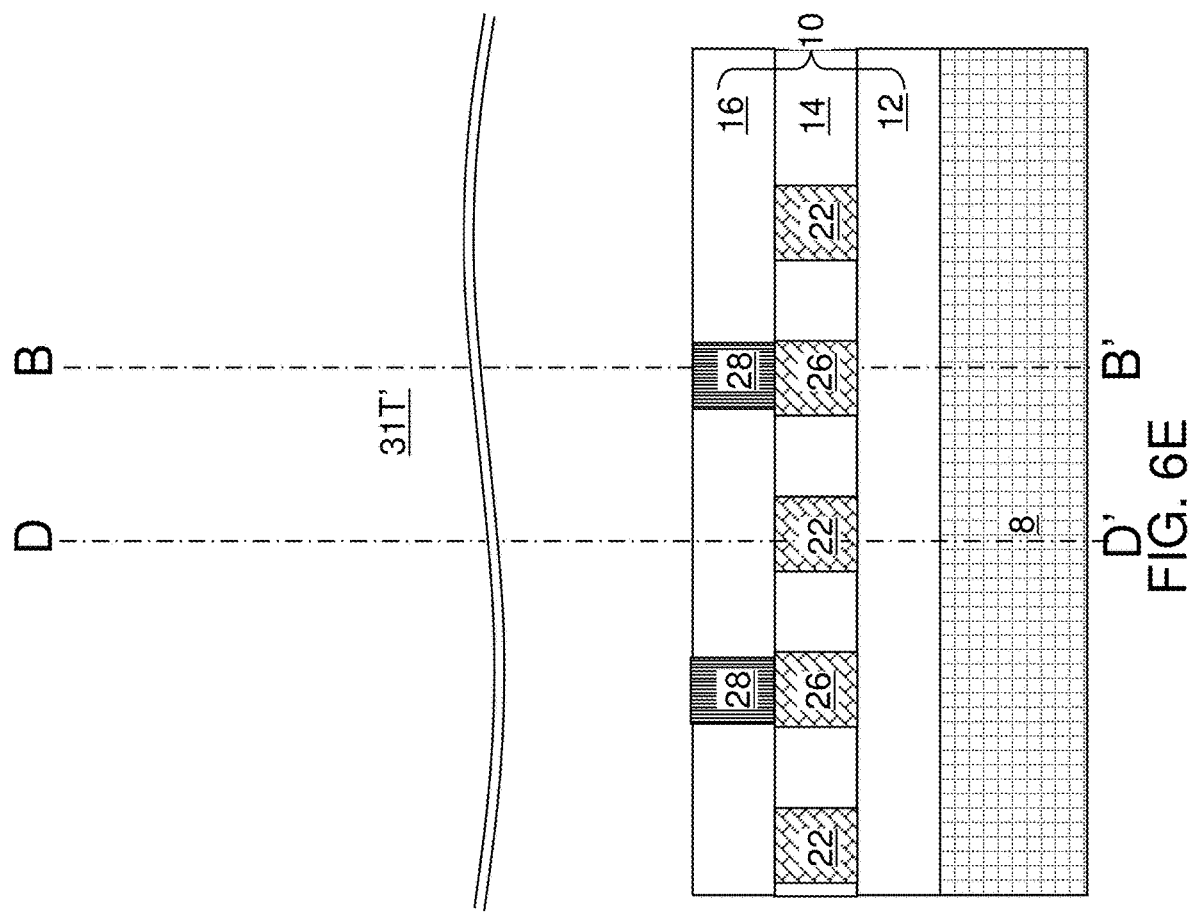

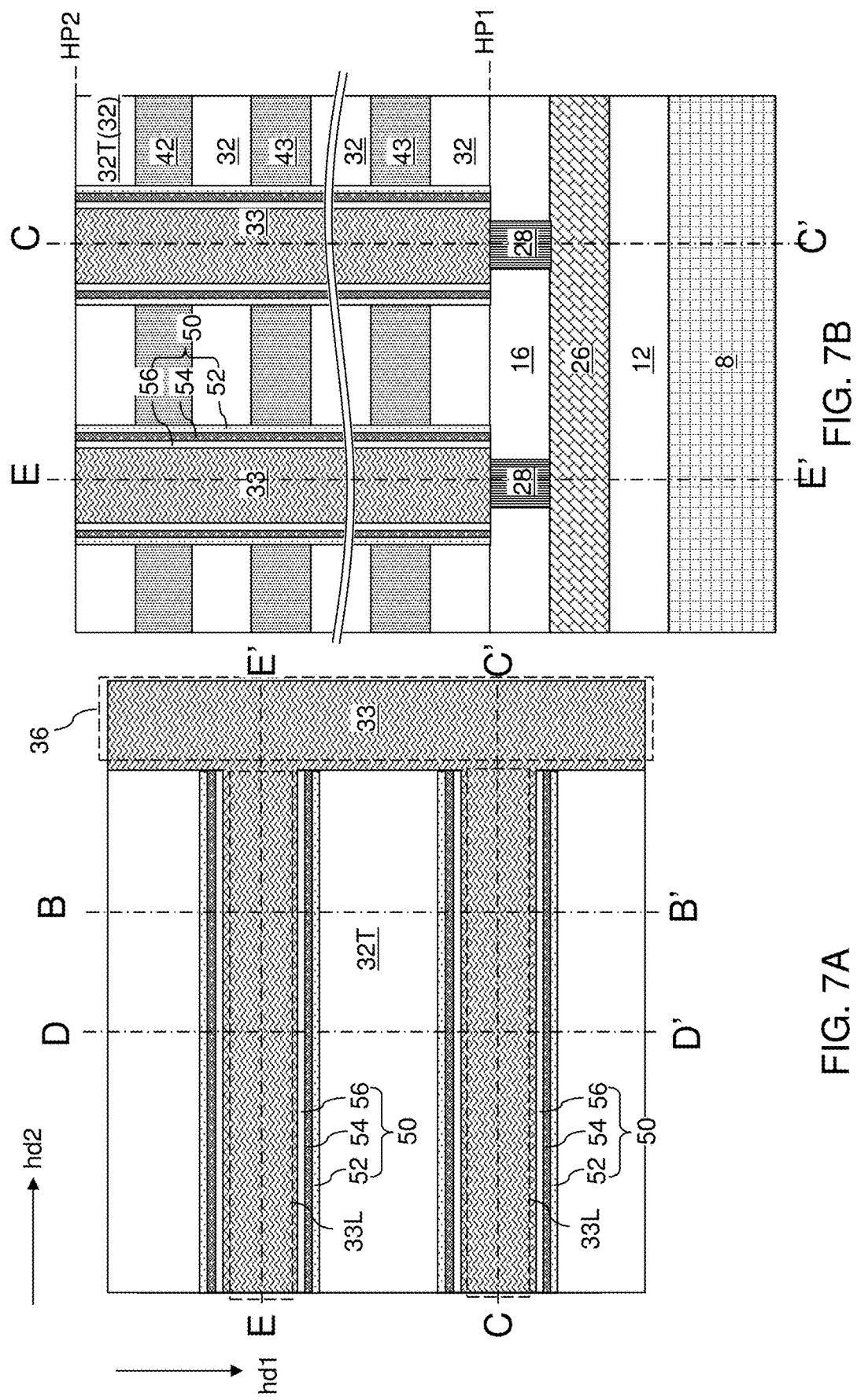

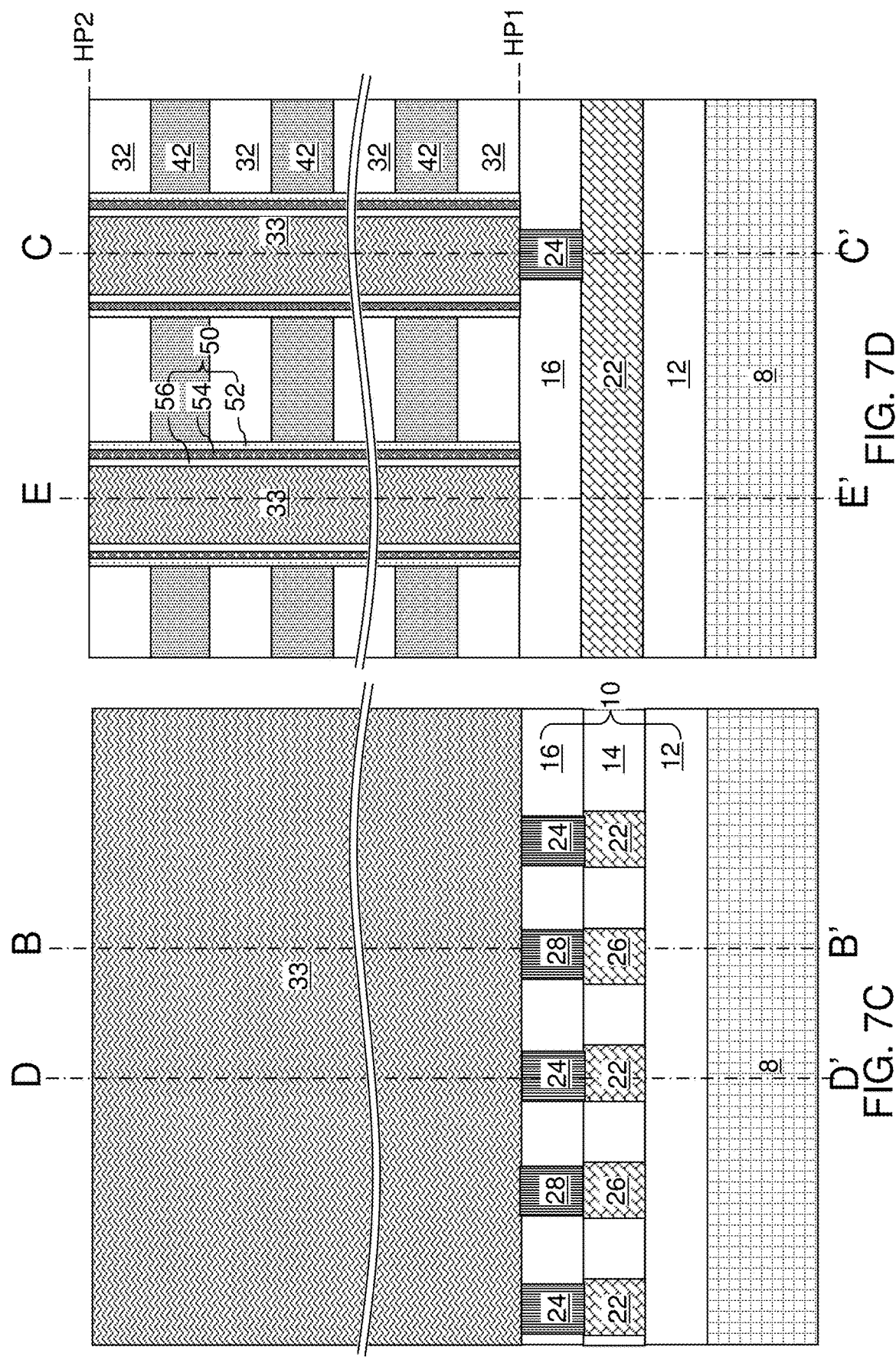

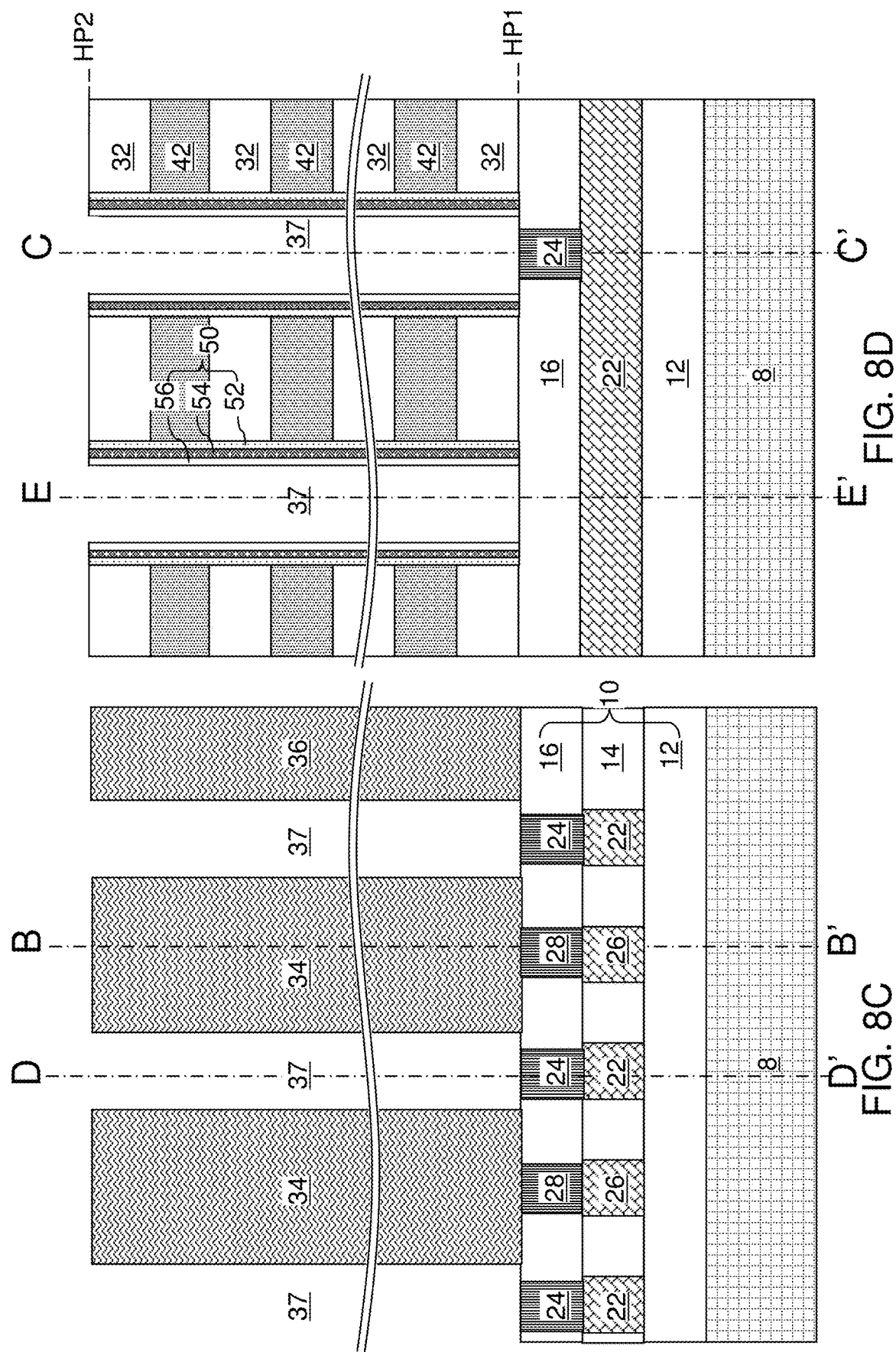

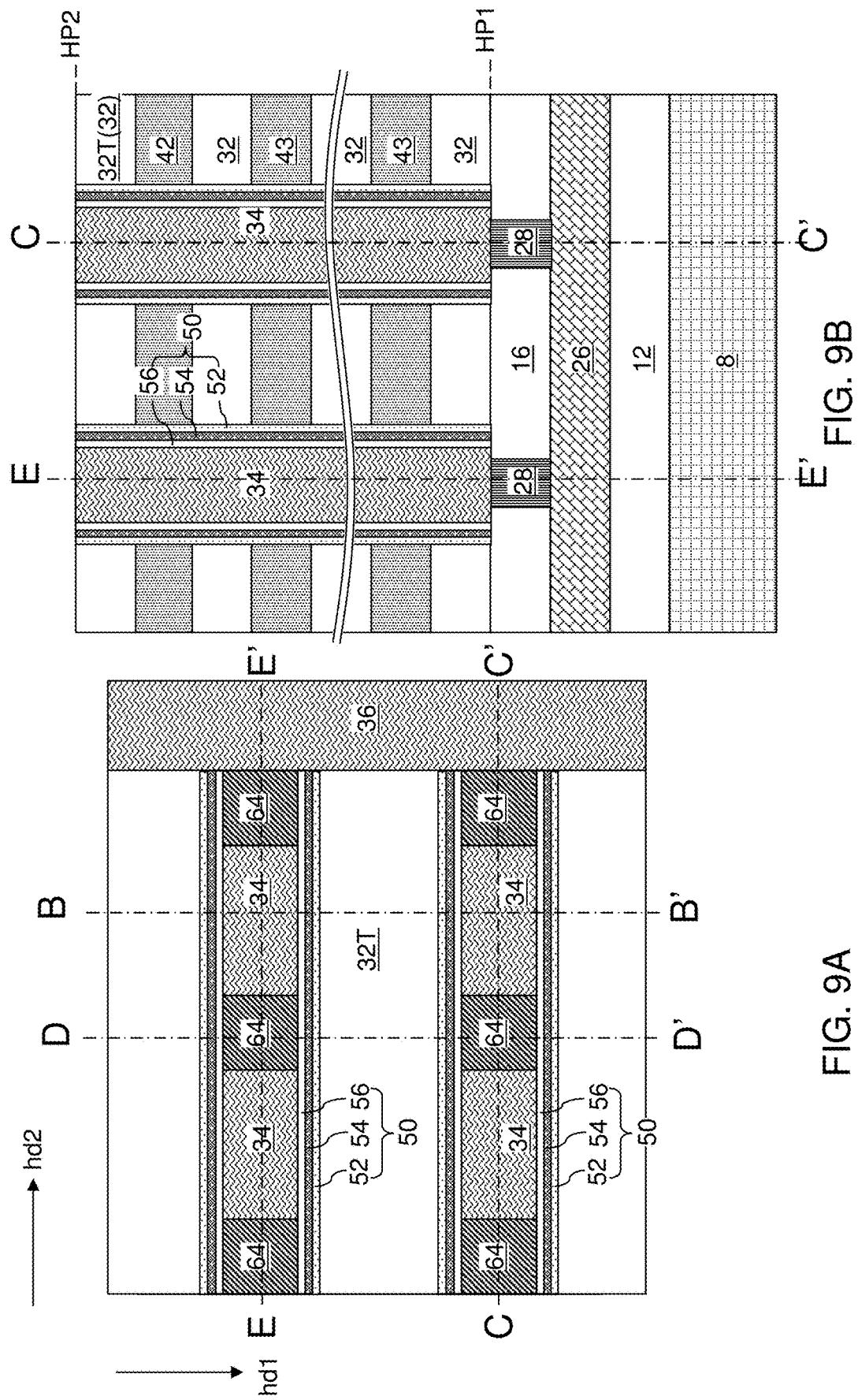

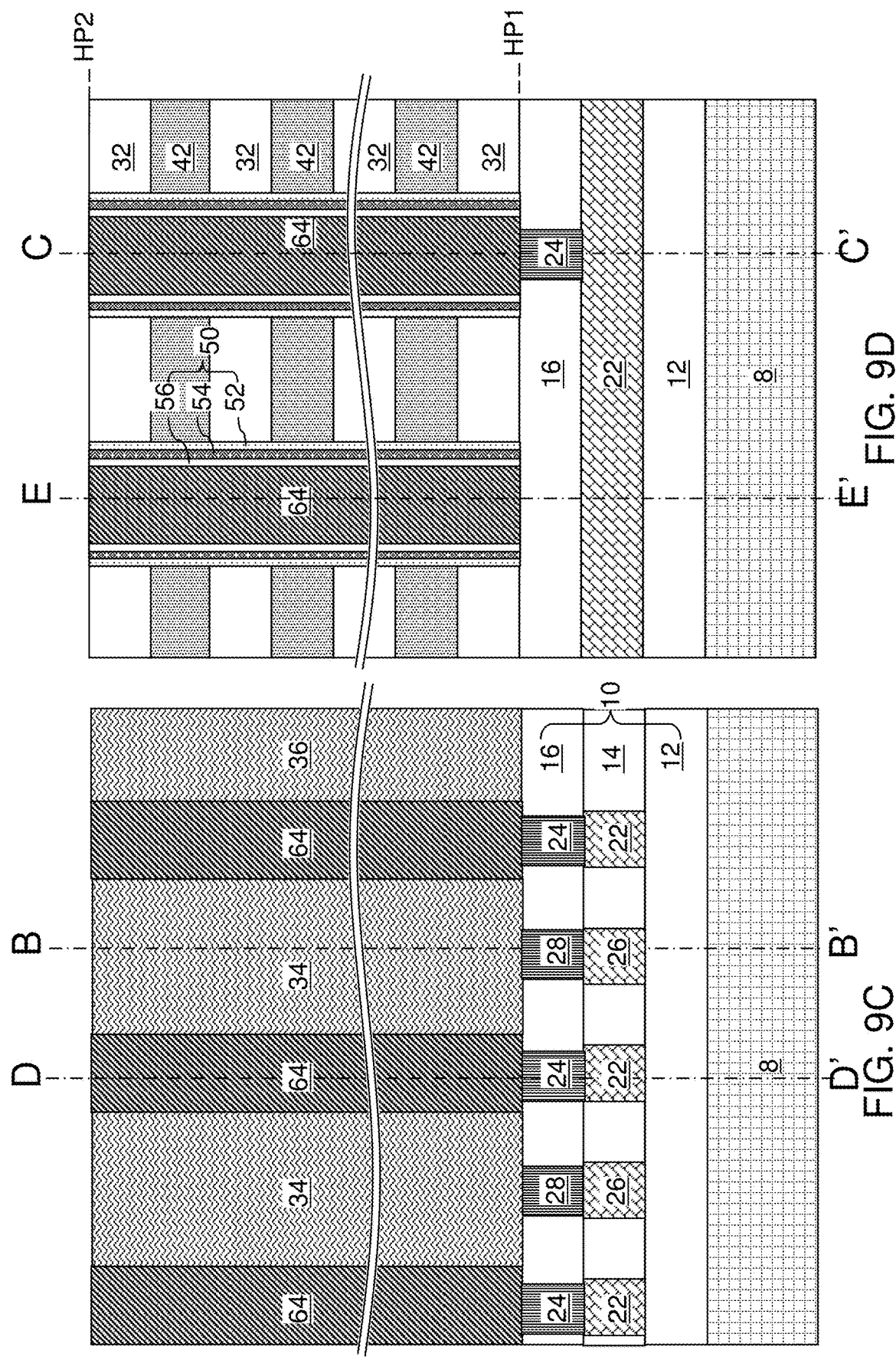

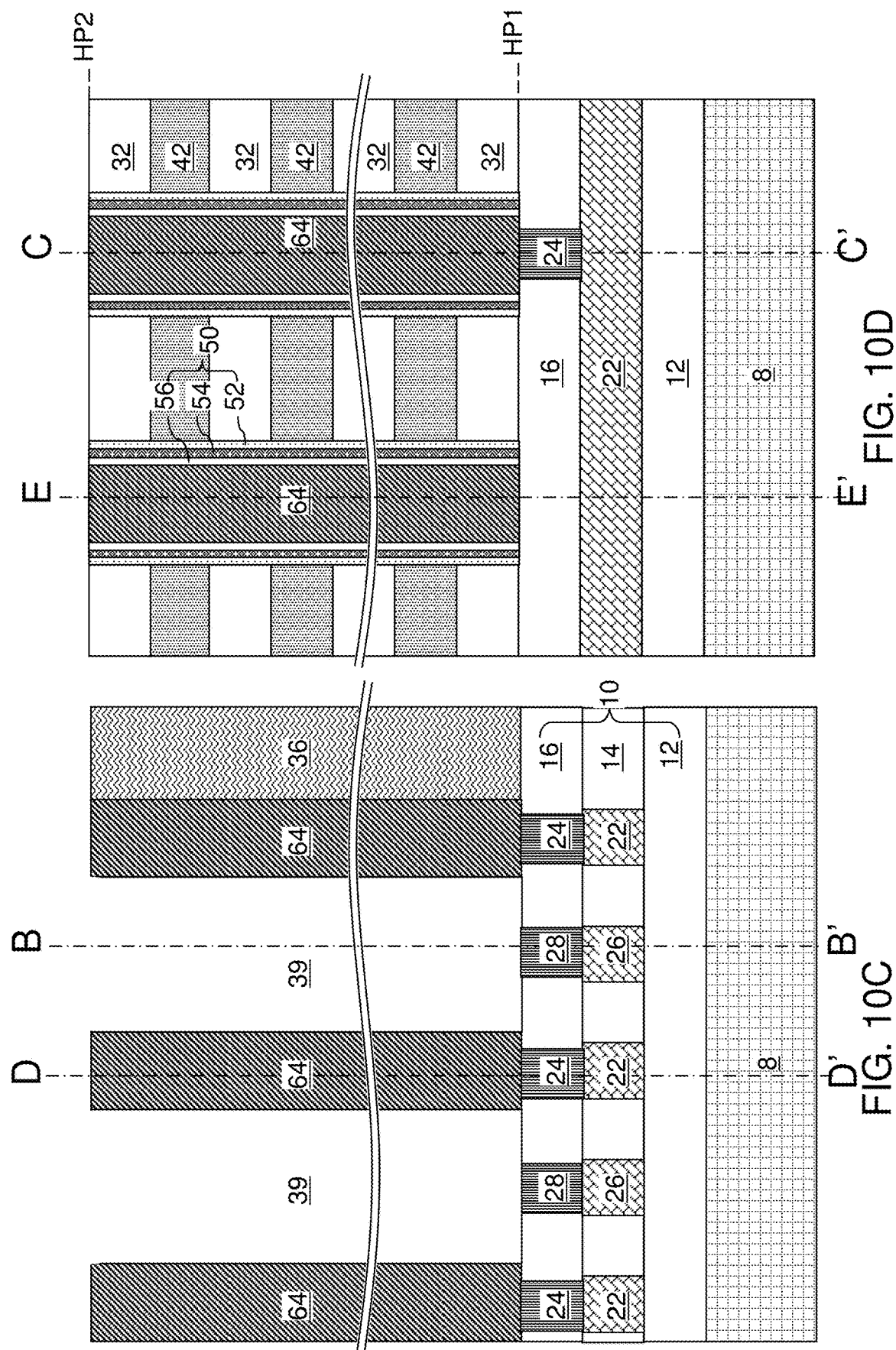

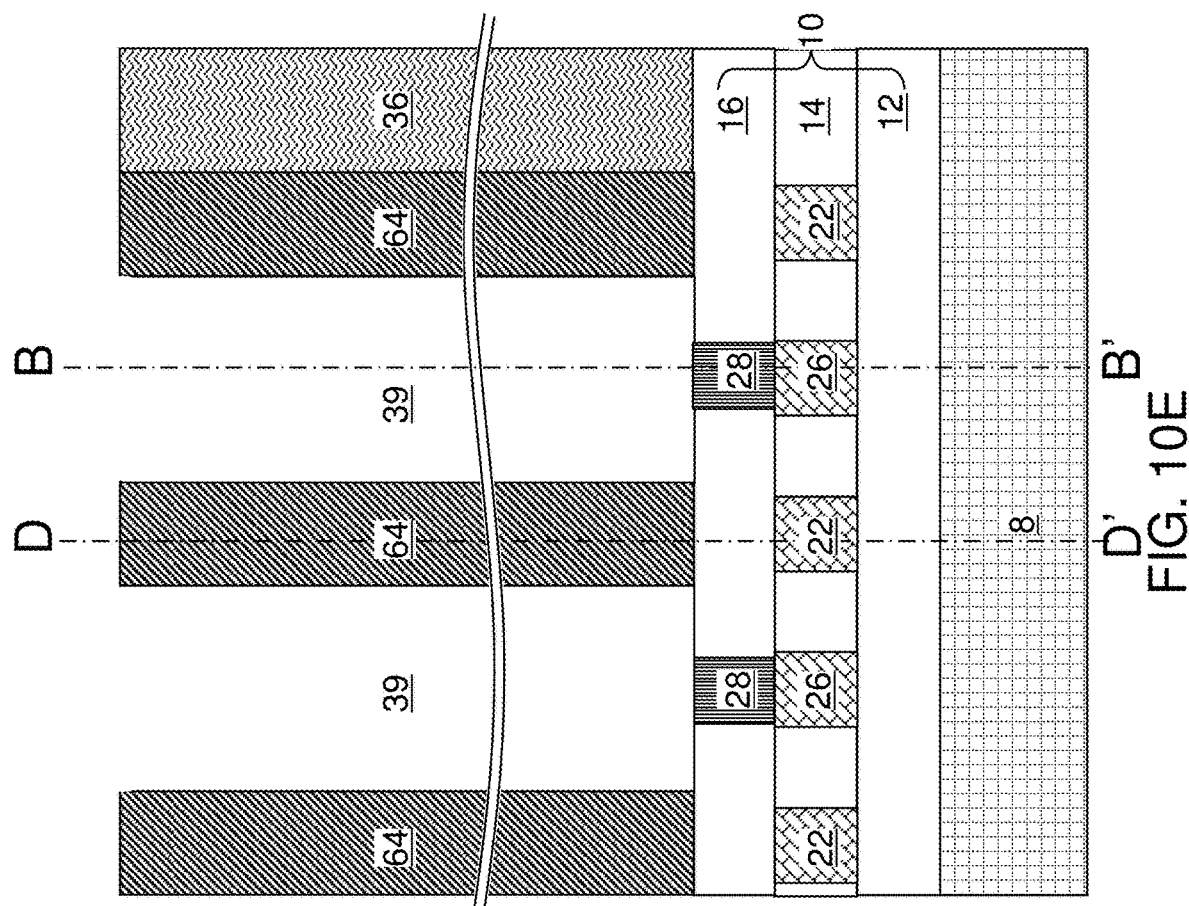

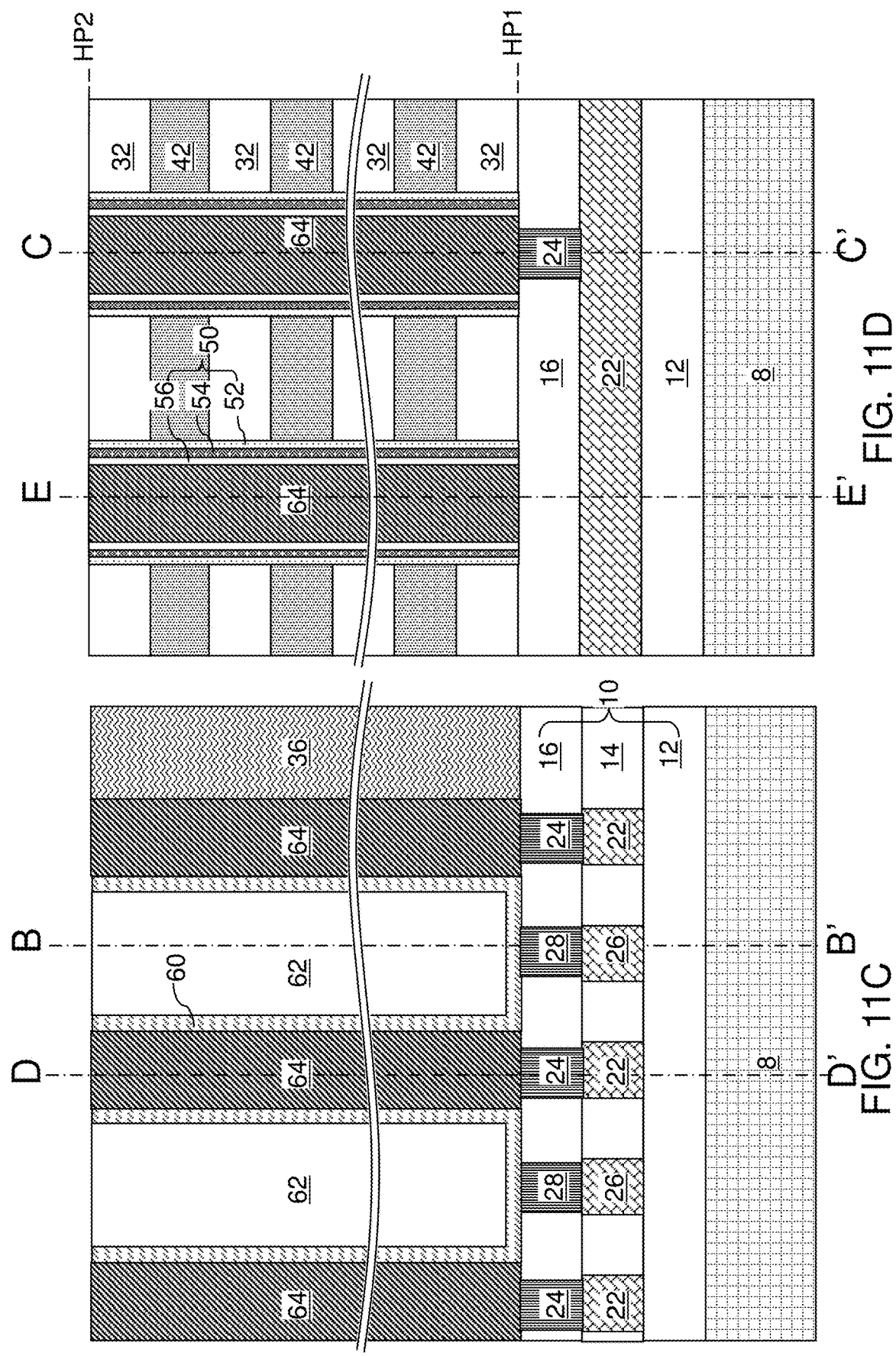

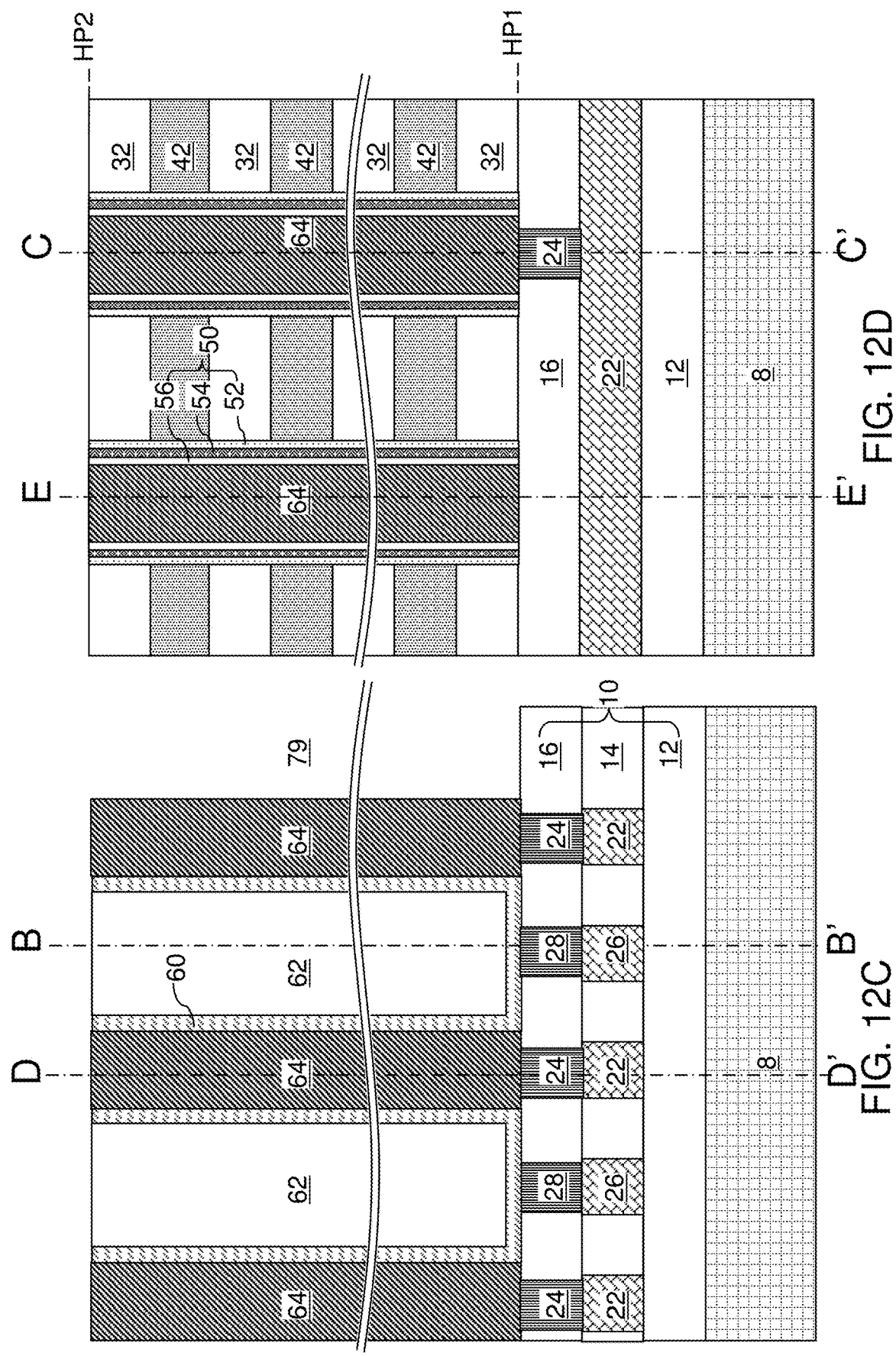

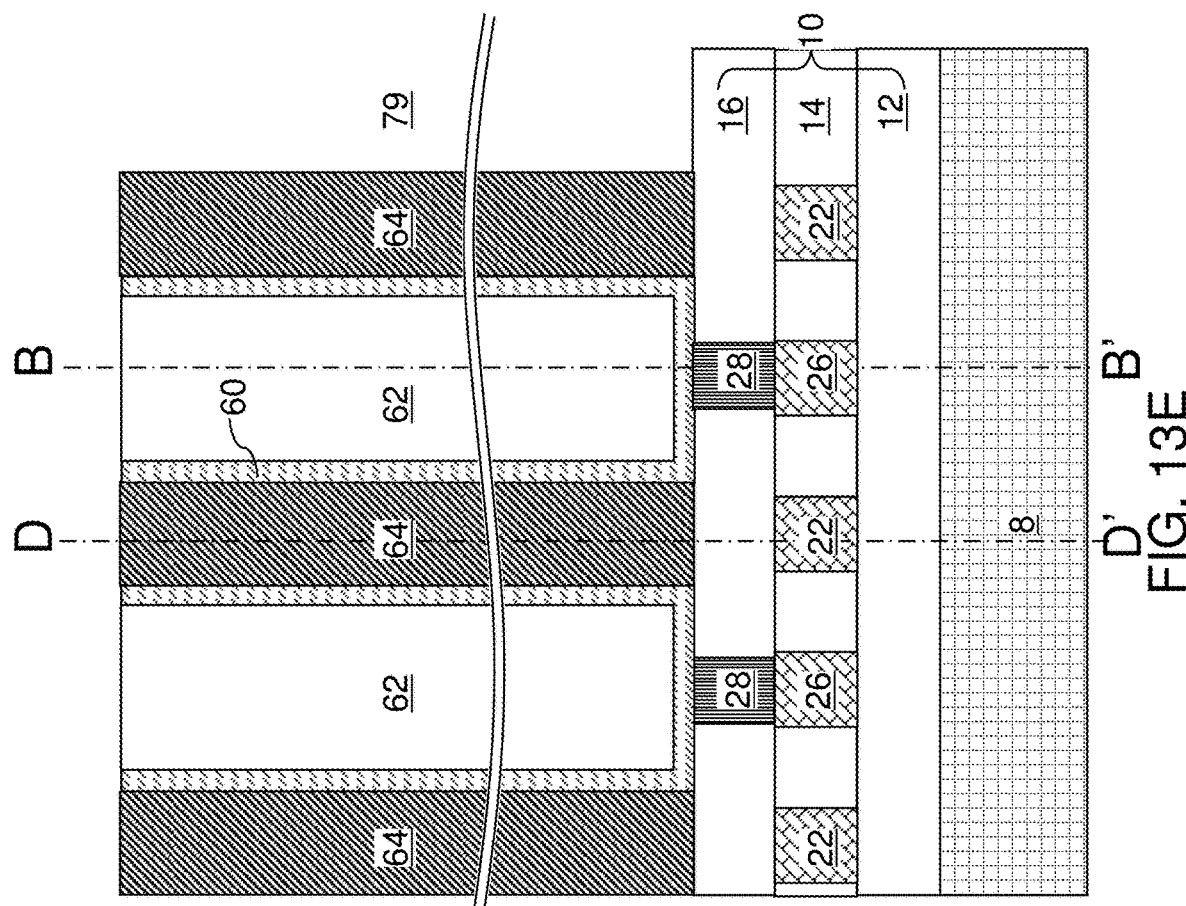

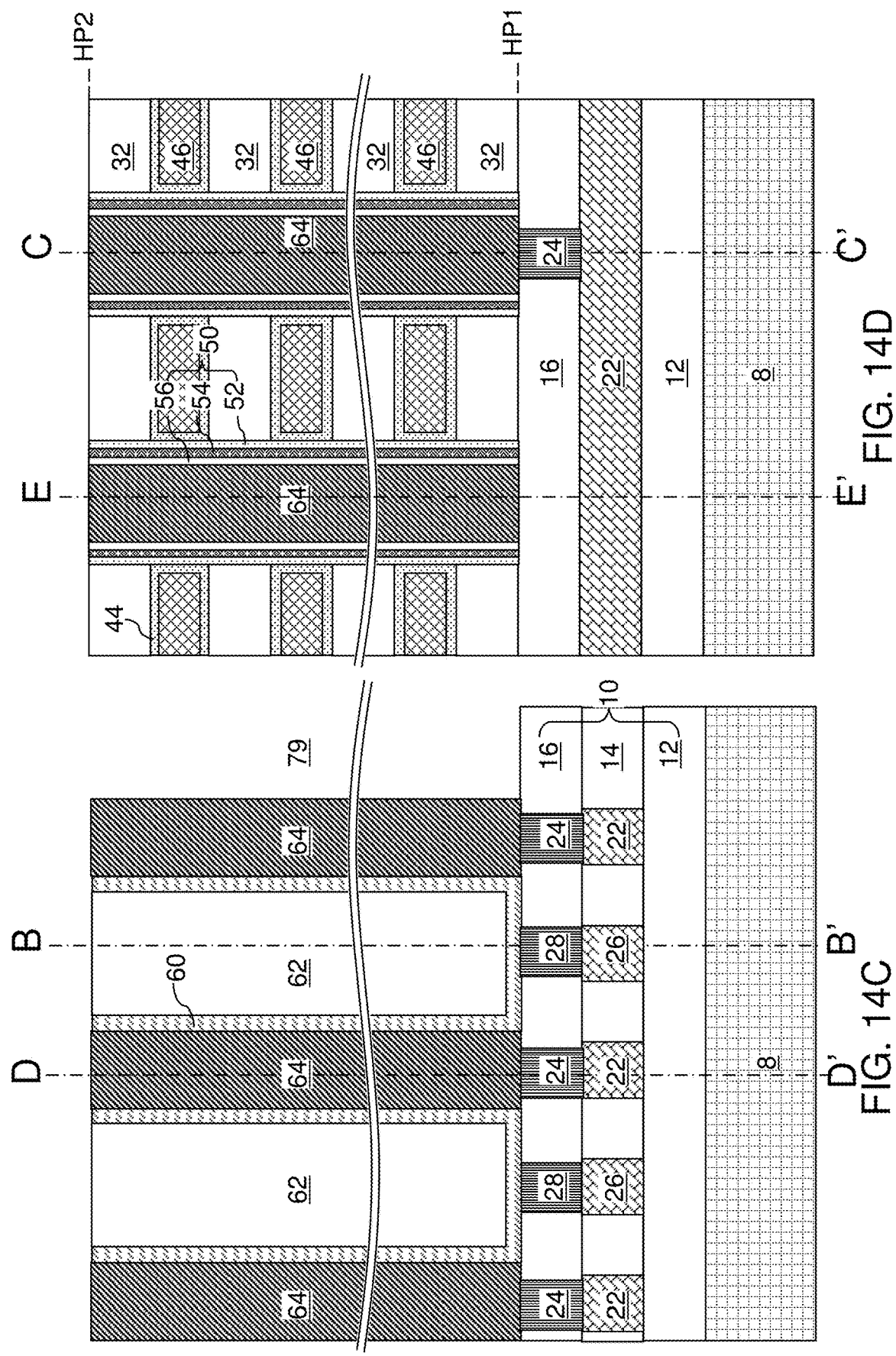

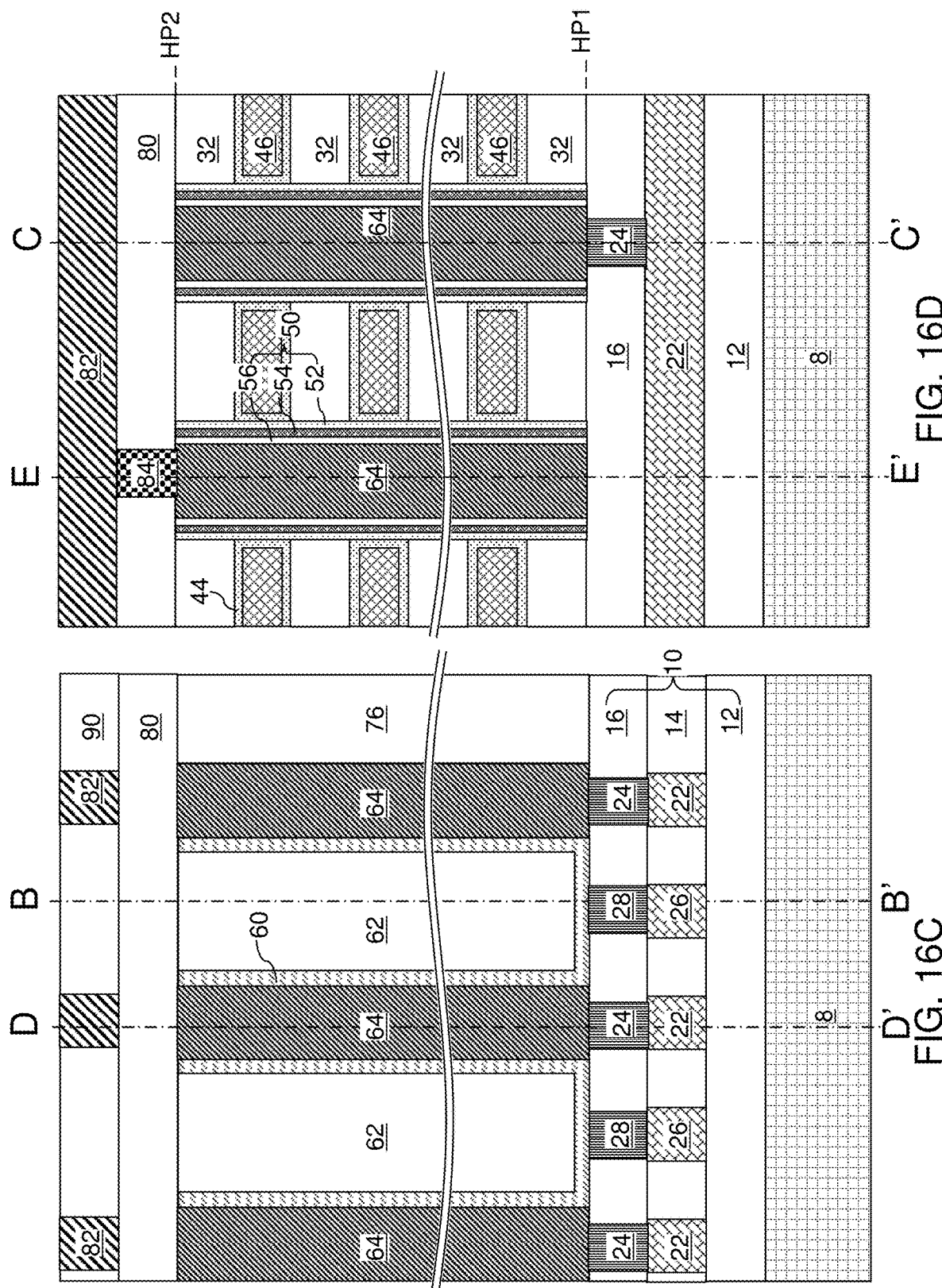

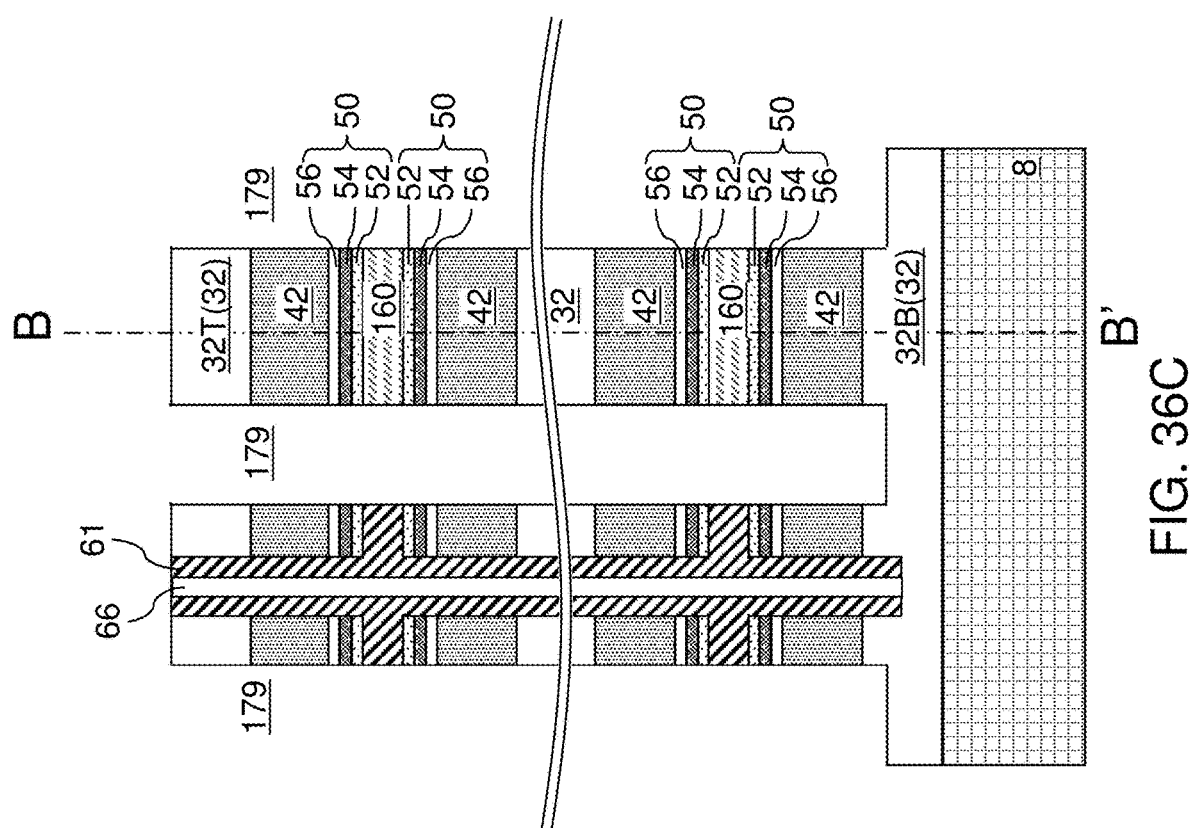

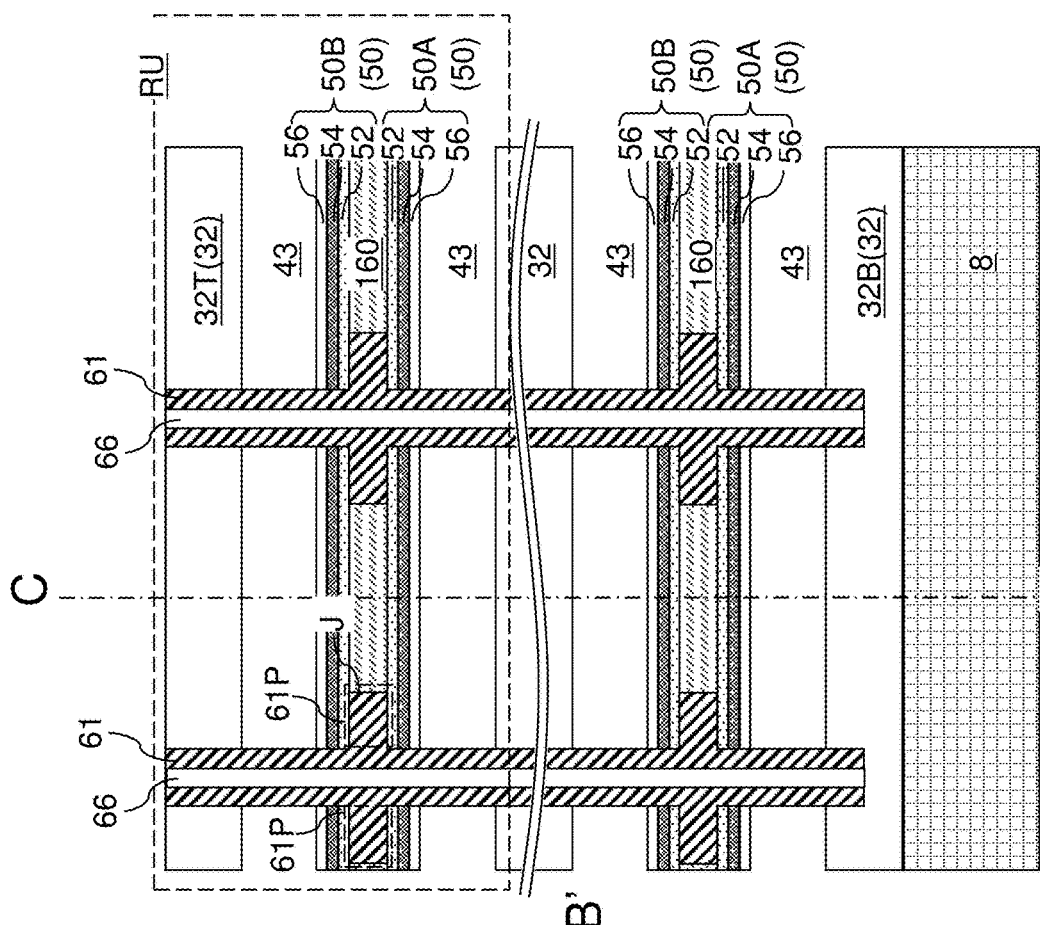
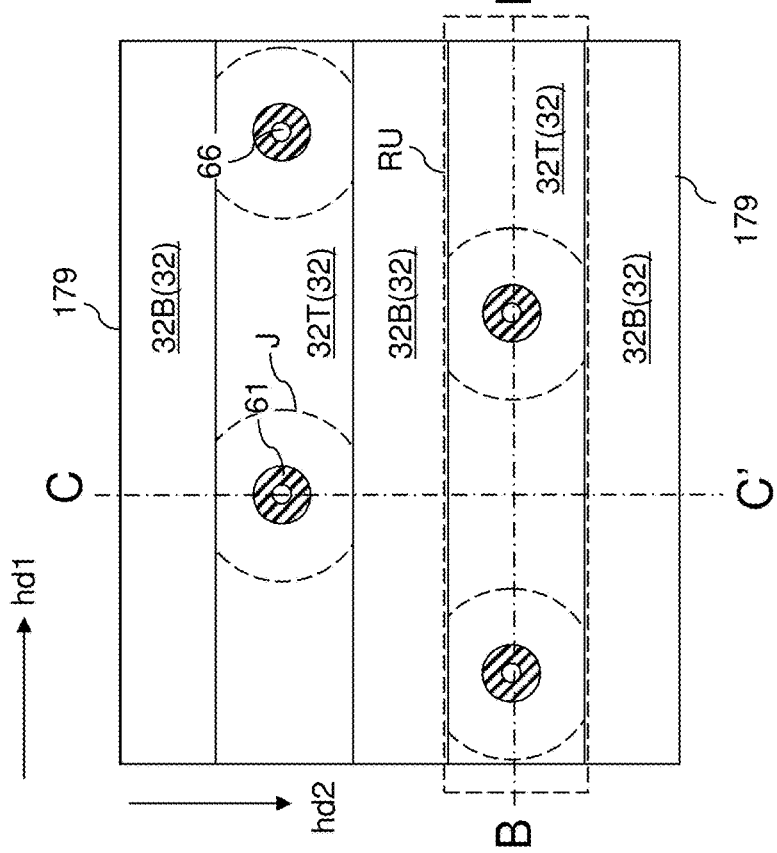
FIG. 37B
FIG. 37A

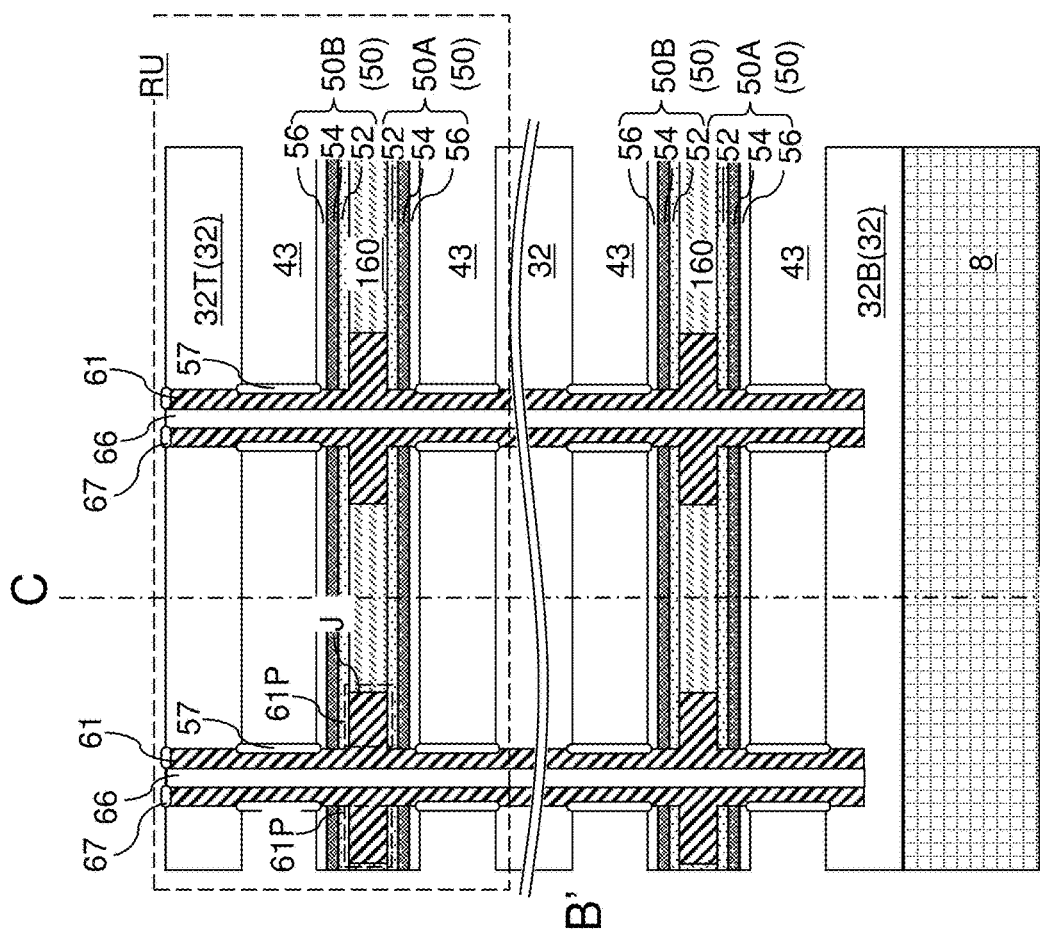
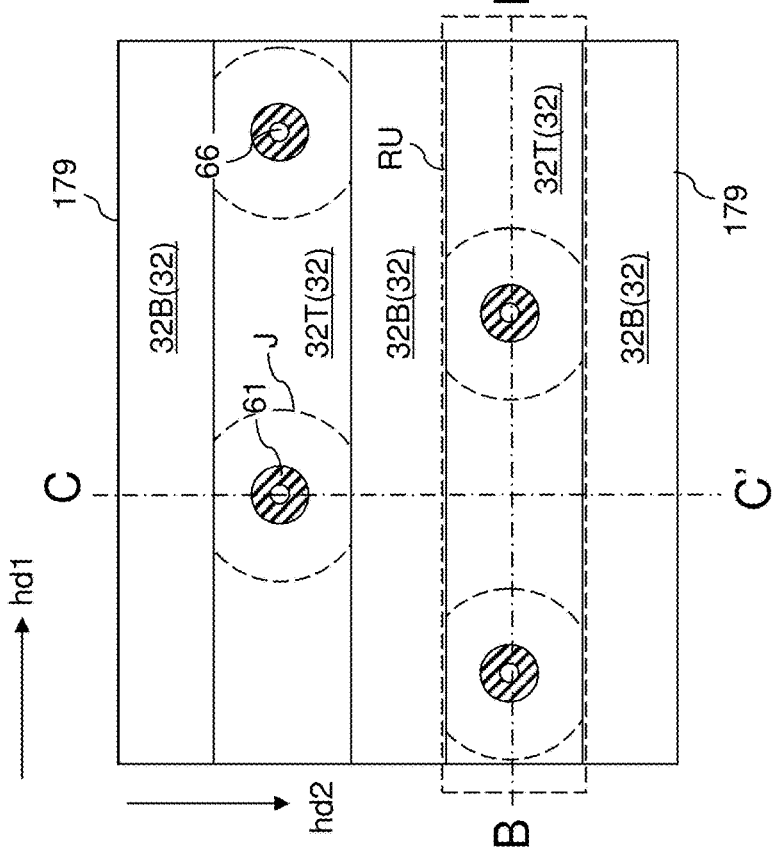
FIG. 38B
FIG. 38A

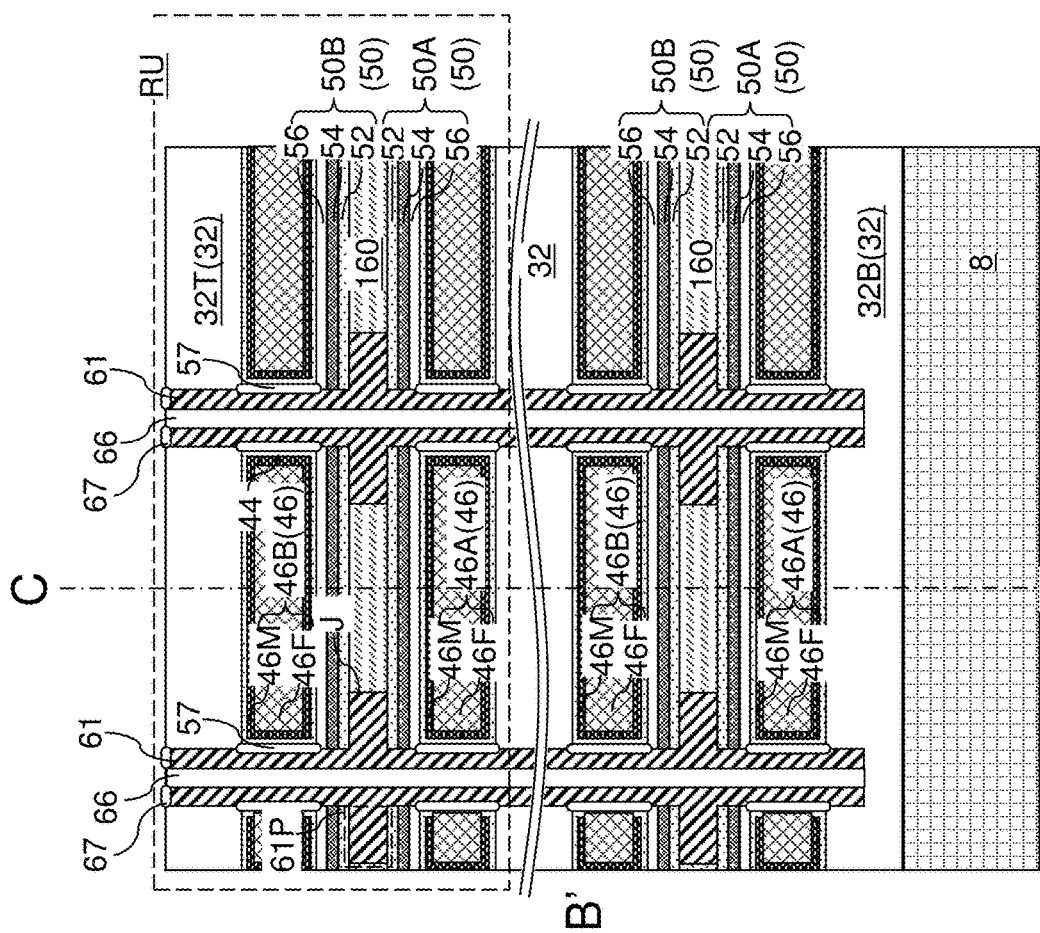
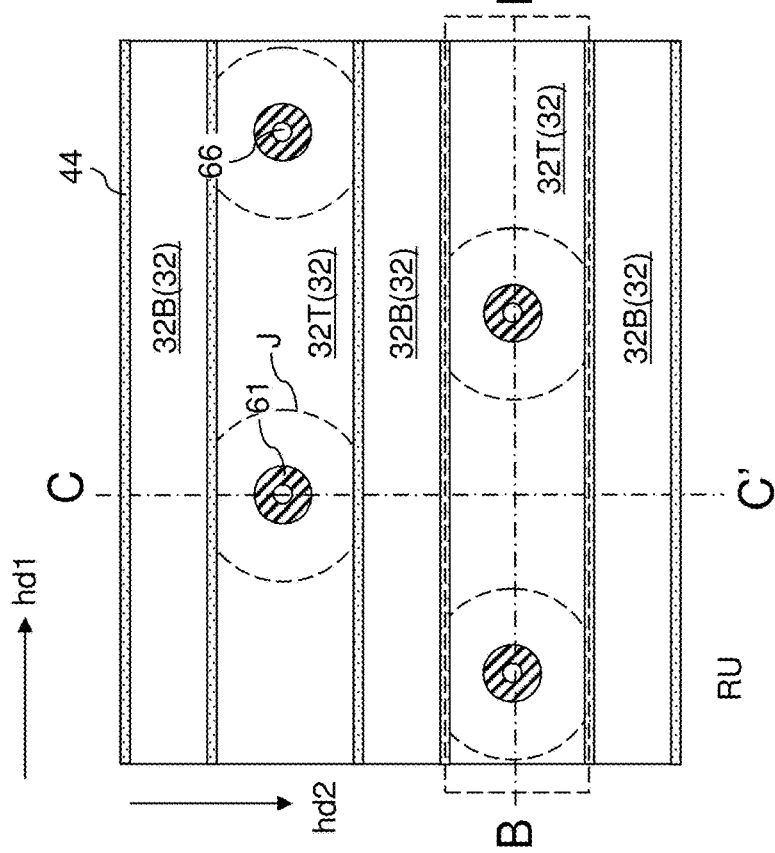
FIG. 40A
FIG. 40B

THREE-DIMENSIONAL NOR ARRAY AND METHOD OF MAKING THE SAME

FIELD

The present disclosure relates generally to the field of semiconductor devices, and particularly to three-dimensional NOR arrays and methods of manufacturing the same.

BACKGROUND

A NOR memory device includes memory cells that are connected in parallel. The memory cells are connected directly to a source and drain without going through adjacent memory cells for a source and/or drain connection. Thus, the NOR memory cells may be accessed directly without going through adjacent memory cells. Thus, a NOR memory device may provide a faster access speed compared to a NAND memory device, and may be used in a storage class memory (SCM) device.

SUMMARY

According to an aspect of the present disclosure, a semiconductor structure comprises vertically-alternating stacks of insulating strips and electrically conductive strips and laterally spaced apart from each other by line trenches; laterally-alternating sequences of semiconductor channels and source/drain pillar structures located within a respective one of the line trenches; and memory films located between each neighboring pair of the vertically-alternating stacks and the laterally-alternating sequences, wherein each of a plurality of the source/drain pillar structures is in direct contact with a respective pair of vertical semiconductor channels.

According to another aspect of the present disclosure, a method of forming a semiconductor structure comprises forming a vertically alternating sequence of insulating layers and sacrificial material layers; forming line trenches through the vertically alternating sequence, wherein the vertically alternating sequence is divided into vertically-alternating stacks of insulating strips and sacrificial material strips, and the vertically-alternating stacks are laterally spaced apart from each other by the line trenches; forming a memory film within each of the line trenches; forming a laterally-alternating sequence of semiconductor channels and source/drain pillar structures within each of the line trenches on a respective one of the memory films, wherein each of a plurality of the source/drain pillar structures is in direct contact with a respective pair of vertical semiconductor channels; and replacing the sacrificial material strips with electrically conductive strips.

According to yet another aspect of the present disclosure, a semiconductor structure includes a vertical stack of repetition units, where each instance of the repetition unit extends along a first horizontal direction and includes a first electrically conductive strip, a first memory film located over the first electrically conductive strip, discrete semiconductor channels that are laterally spaced apart from each other along the first horizontal direction and located above the first memory film, a second memory film located above the discrete semiconductor channels, a second electrically conductive strip located above the second memory film, and an insulating strip located above the first electrically conductive strip. Source/drain openings are arranged along the first horizontal direction, interlaced with the discrete semiconductor channels, and vertically extend through the vertical stack of repetition units, and source/drain pillar structures are located in respective source/drain openings, and vertically extend through the vertical stack of repetition units.

According to still another aspect of the present disclosure, a method of forming a semiconductor structure comprises forming a vertical stack of multiple instances of a unit layer stack over a substrate, wherein the unit layer stack comprises a first sacrificial material layer, a first memory film, a semiconductor material layer, a second memory film, a second sacrificial material layer, and an insulating layer; forming source/drain openings through the vertically stack; forming source/drain pillar structures in the source/drain openings; forming line trenches laterally extending along a first horizontal direction through the vertical stack, wherein the vertical stack is divided into vertical stacks of repetition units, wherein the vertical stacks of repetition units are interlaced with the line trenches along a second horizontal direction that is perpendicular to the first horizontal direction, and wherein each instance of the repetition unit comprises a first sacrificial material strip, a first memory film, a row of discrete semiconductor channels that are laterally spaced apart from each other along a first horizontal direction, a second memory film, a second sacrificial material strip, and an insulating strip; and replacing the first sacrificial material strips and the second sacrificial material strips with first electrically conductive strips and second electrically conductive strips through the line trenches.

According to an aspect of the present disclosure, a three-dimensional memory device comprises first vertical stacks of first field effect transistor strings, and second vertical stacks of second field effect transistor strings. The first vertical stacks alternate with the second vertical stacks along a first horizontal direction. Each of the first field effect transistor strings comprises a series connection of a respective set of first field effect transistors that are electrically connected to each other such that each neighboring pair of first field effect transistors share a respective one of a plurality of first source/drain regions. Each of the second field effect transistor strings comprises a series connection of a respective set of second field effect transistors that are electrically connected to each other such that each neighboring pair of second field effect transistors share a respective one of second source/drain region. The series connection of the respective set of first field effect transistors shares a respective one of a plurality of word lines. The first source/drain regions are located in different vertical levels in respective first source/drain pillar structures, and the second source/drain regions are located in different vertical levels in respective second source/drain pillar structures.

BRIEF DESCRIPTION OF THE DRAWINGS

In case multiple figures with a same figure numeral and different alphabetical suffices are present, all figures with the same figure numeral refer to a same structure. Each figure with an alphabetical figure suffix A is a top-down view, i.e., a plan view. For example, FIGS. 1A, 2A, 3A, etc. are top-down views. Each figure with an alphabetical suffix B is a vertical cross-sectional view along the vertical plane B-B' in the figure within the same figure numeral and with the alphabetical suffix A. If present, each figure with an alphabetical suffix C is a vertical cross-sectional view along the vertical plane C-C' in the figure within the same figure numeral and with the alphabetical suffix A. If present, each figure with an alphabetical suffix D is a vertical cross-sectional view along the vertical plane D-D' in the figure within the same figure numeral and with the alphabetical suffix A. If present, each figure with an alphabetical suffix E is a vertical cross-sectional view along the vertical plane E-E' in the figure within the same figure numeral and with the alphabetical suffix A. For example, FIG. 1B is a vertical cross-sectional view along the plane B-B' of FIG. 1A, FIG. 1C is a vertical cross-sectional view along the plane C-C' of FIGS. 1A, FIG. 1D is a vertical cross-sectional view along the plane D-D' of FIG. 1A.

FIGS. 1A, 1B, 1C, 1D, and 1E are various views of a first exemplary structure after formation of access lines according to a first embodiment of the present disclosure.

FIGS. 2A, 2B. 2C. 2D, and 2E are various views of the first exemplary structure after formation of connection via structures according to the first embodiment of the present disclosure.

FIGS. 3A. 3B, 3C, 3D, and 3E are various views of the first exemplary structure after formation of a vertically alternating sequence of insulating layers and sacrificial material layers according to the first embodiment of the present disclosure.

FIGS. 4A, 4B, 4C, 4D, and 4E are various views of the first exemplary structure after formation of line trenches and vertically-alternating stacks of insulating strips and sacrificial material strips according to the first embodiment of the present disclosure.

FIGS. 5A, 5B, 5C, 5D, and 5E are various views of the first exemplary structure after formation of a continuous memory film according to the first embodiment of the present disclosure.

FIGS. 6A, 6B, 6C, 6D, and 6E are various views of the first exemplary structure after patterning a continuous memory film into a plurality of memory films according to the first embodiment of the present disclosure.

FIGS. 8A, 8B, 8C, 8D, and 8E are various views of the first exemplary structure after formation of pillar cavities according to the first embodiment of the present disclosure.

FIGS. 9A, 9B, 9C, 9D, and 9E are various views of the first exemplary structure after formation of active region pillar structures and second active region pillar structures according to the first embodiment of the present disclosure.

FIGS. 12A, 12B, 12C, 12D, and 12E are various views of the first exemplary structure after formation of a void in a backside trench according to the first embodiment of the present disclosure.

FIGS. 13A, 13B, 13C, 13D, and 13E are various views of the first exemplary structure after formation of backside recesses according to the first embodiment of the present disclosure.

FIGS. 14A, 14B, 14C, 14D, and 14E are various views of the first exemplary structure after formation of electrically conductive strips according to the first embodiment of the present disclosure.

FIGS. 16A, 16B, 16C, 16D, and 16E are various views of the first exemplary structure after formation of second bit lines according to the first embodiment of the present disclosure.

FIGS. 36A, 36B, and 36C are various views of the second exemplary structure after formation of line trenches according to the second embodiment of the present disclosure.

FIGS. 37A, 37B, and 37C are various views of the second exemplary structure after formation of backside recesses according to the second embodiment of the present disclosure.

FIGS. 38A, 38B, and 38C are various views of the second exemplary structure after formation of various semiconductor oxide liners according to the second embodiment of the present disclosure.

FIGS. 40A, 40B, and 40C are various views of the second exemplary structure after formation of electrically conductive strips according to the second embodiment of the present disclosure.

DETAILED DESCRIPTION

Figure 1E:
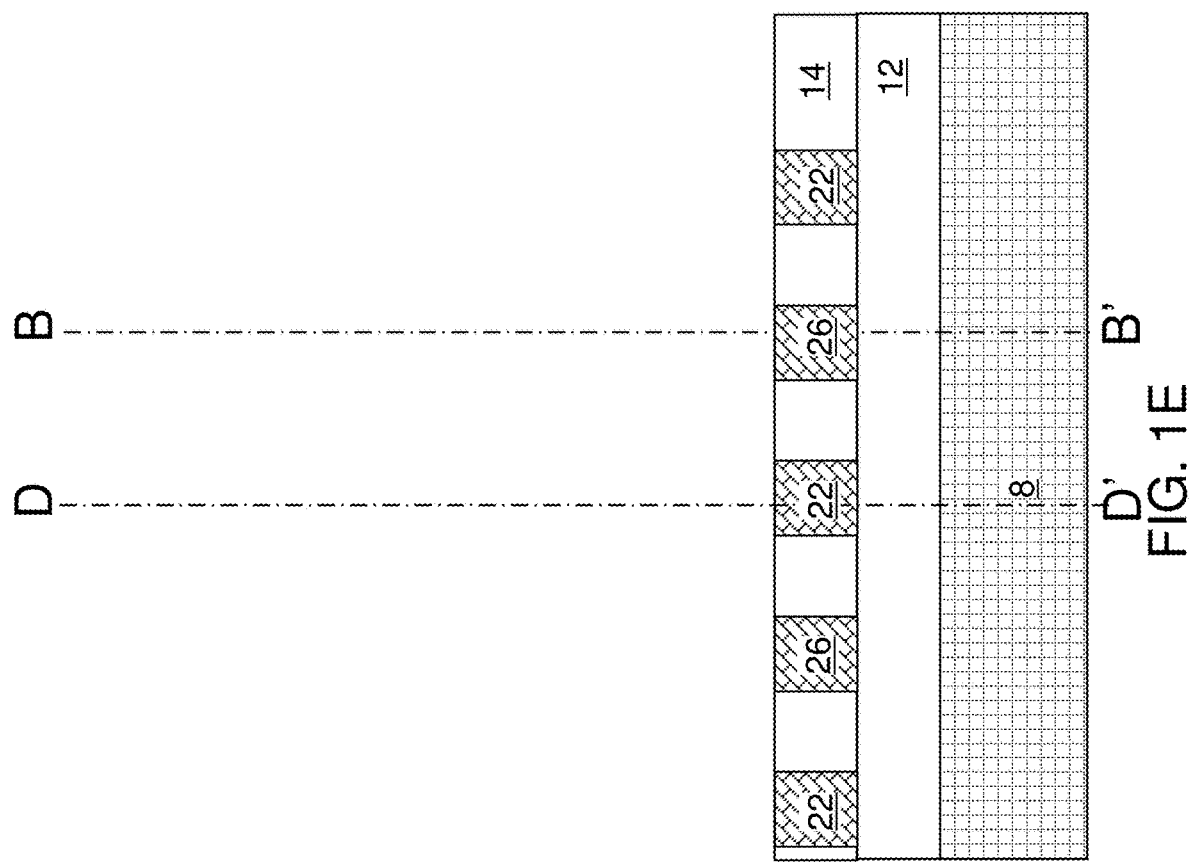
FIG. 1E is a vertical cross-sectional view along the plane E-E' of FIG. 1A. Some structures are illustrated with a top-down view and three vertical cross-sectional views, and some other structures are illustrated with a top-down view and two vertical cross-sectional views.
Figures 4A, 4B:
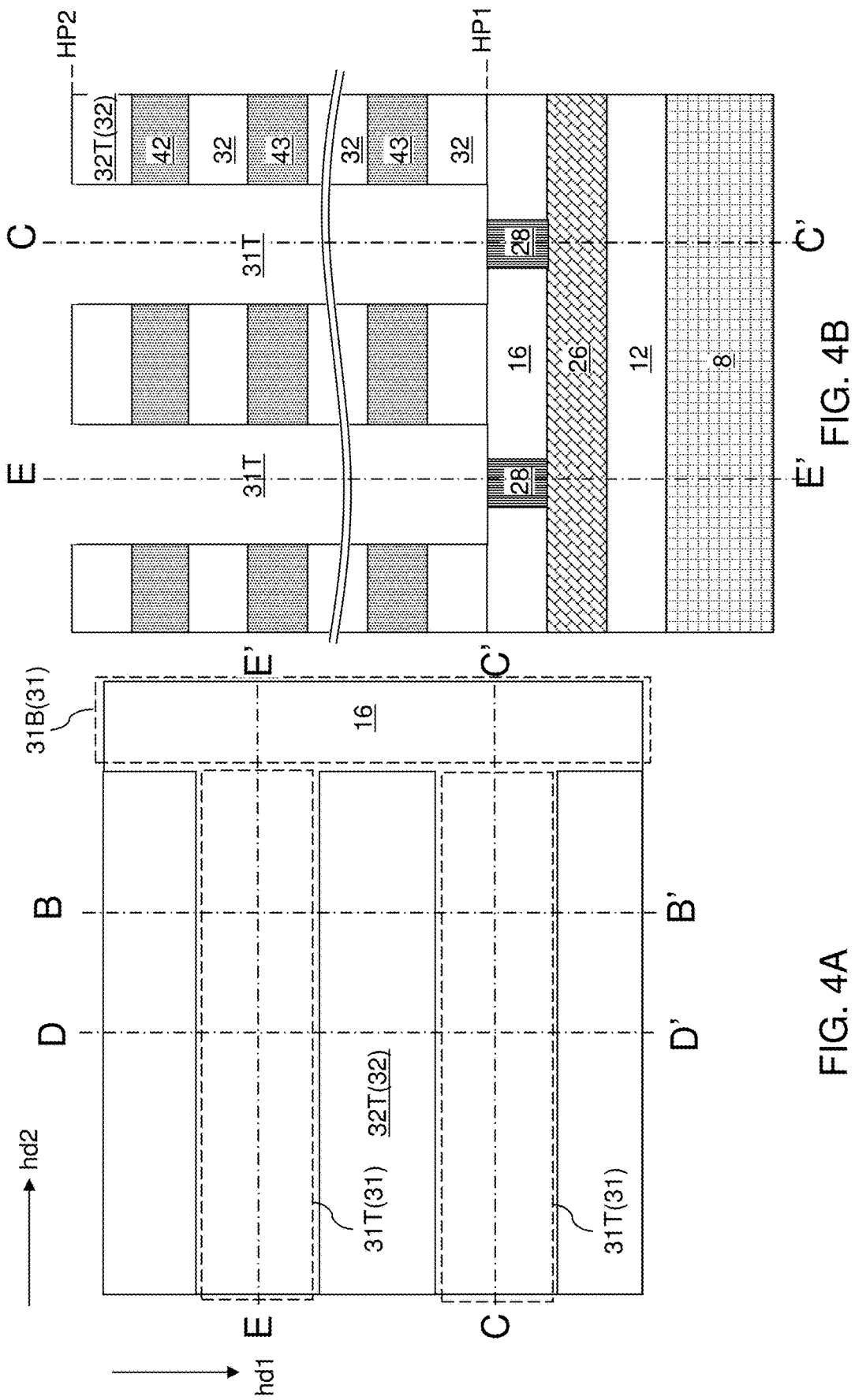
Figure 7E:
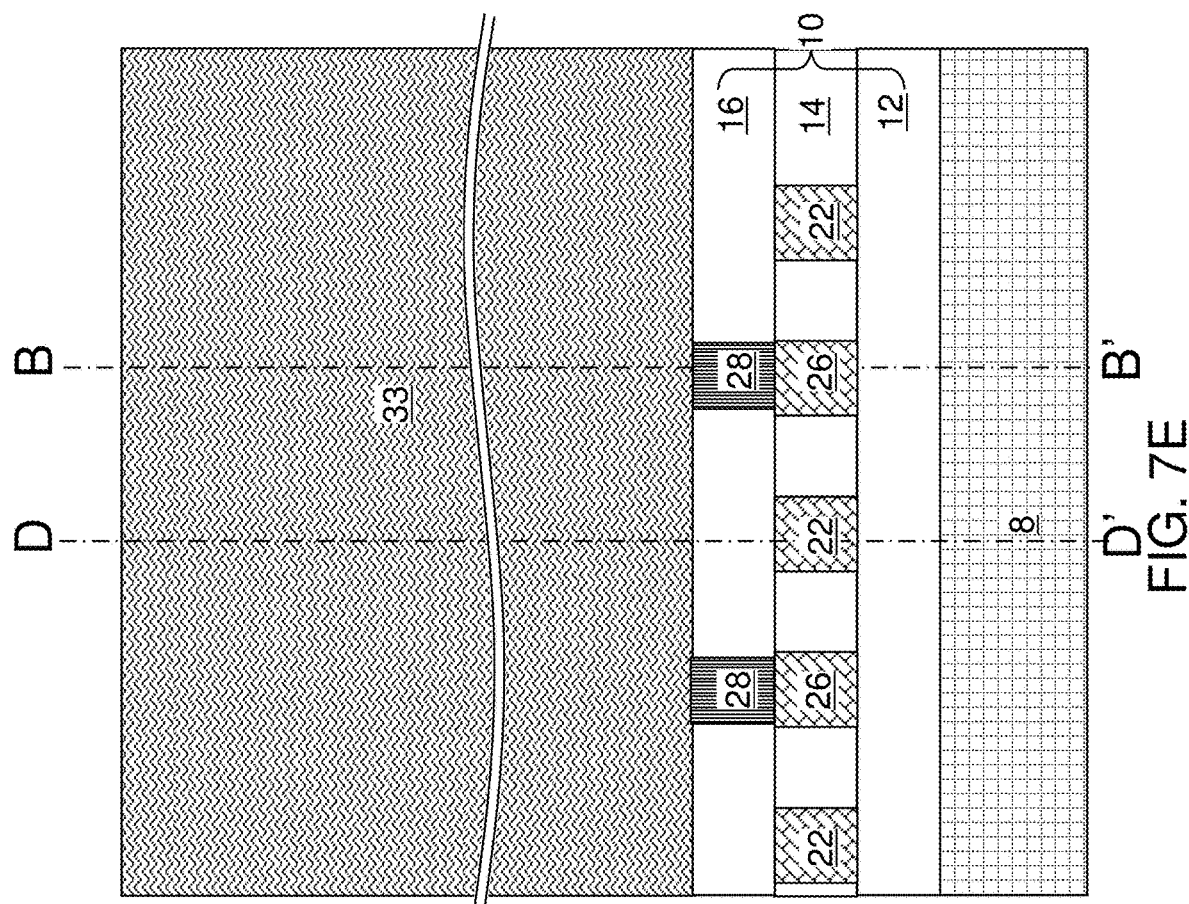
FIGS. 7A, 7B. 7C, 7D, and 7E are various views of the first exemplary structure after formation of an integrated sacrificial trench fill structure according to the first embodiment of the present disclosure.
Figure 8B:
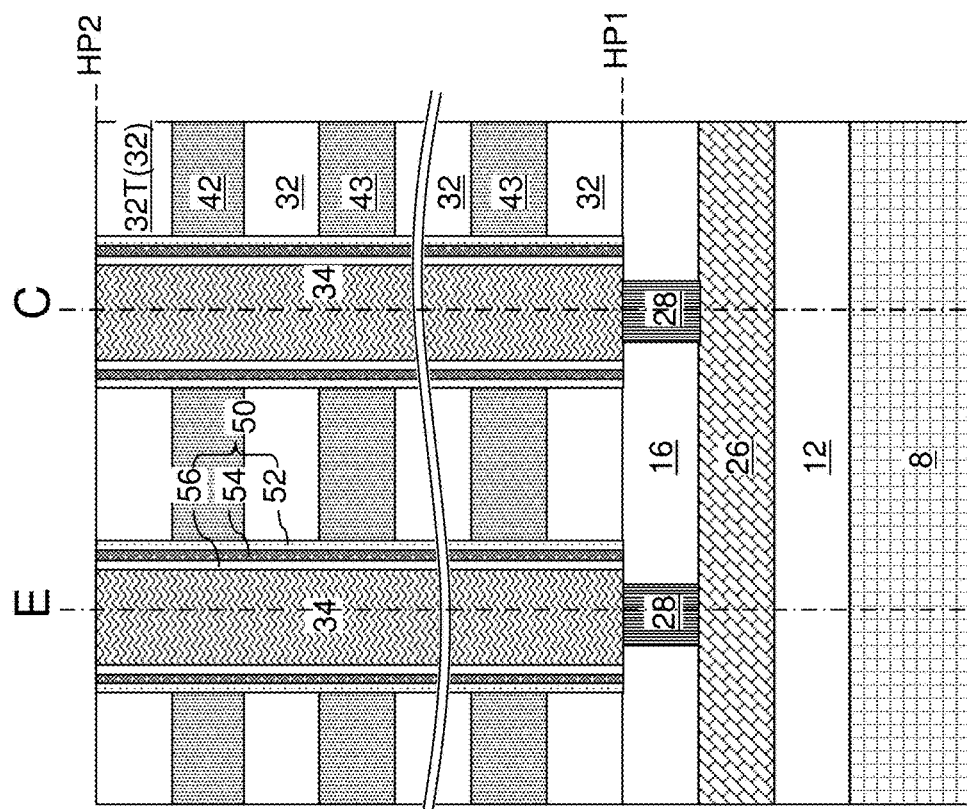
Figure 8A:
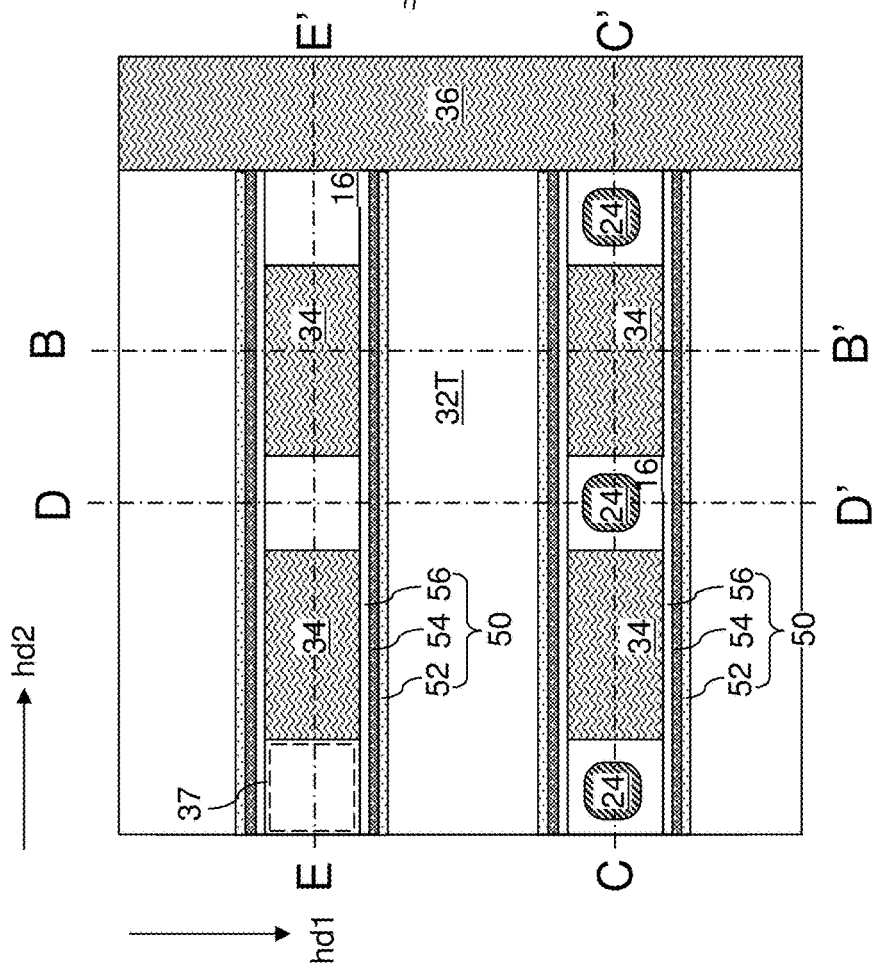
Figure 8E:
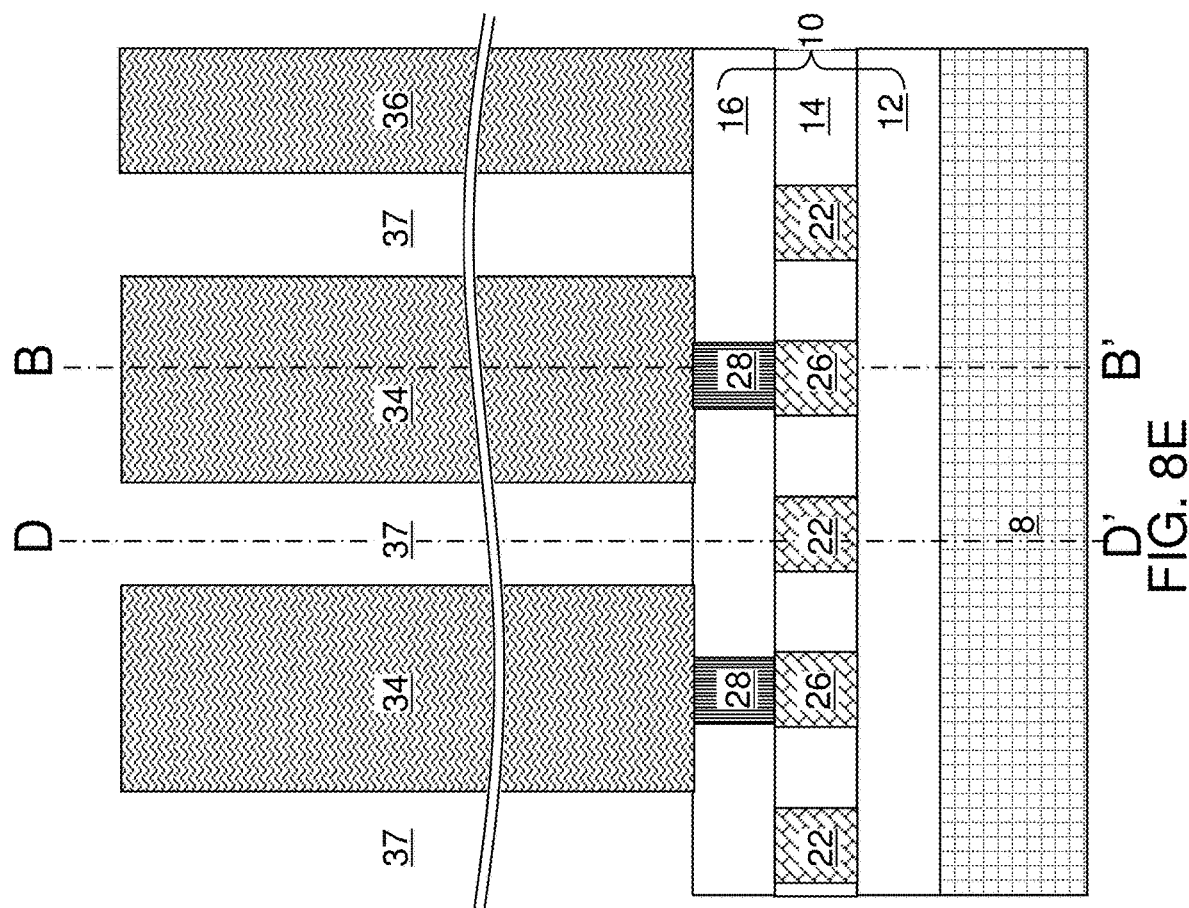
Figure 9E:
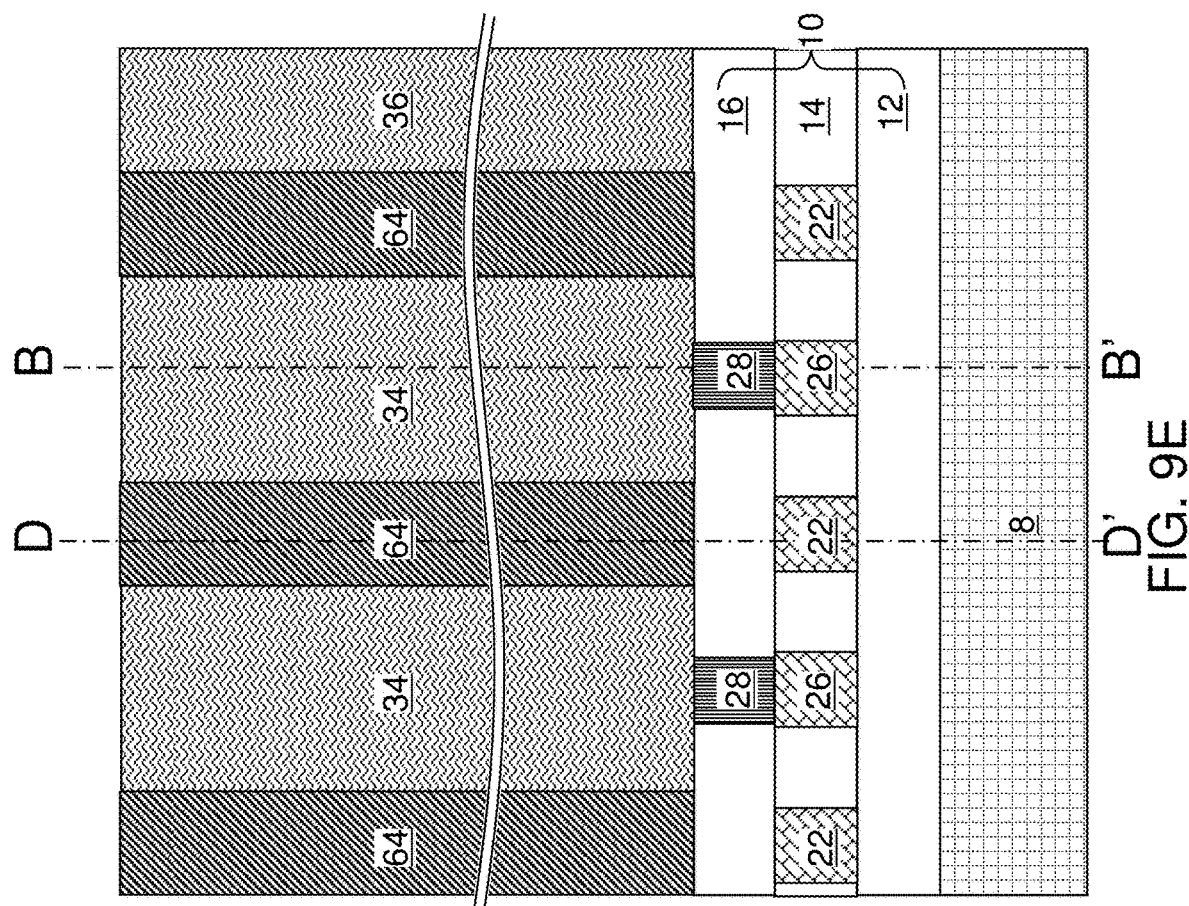
Figures 10A, 10B:
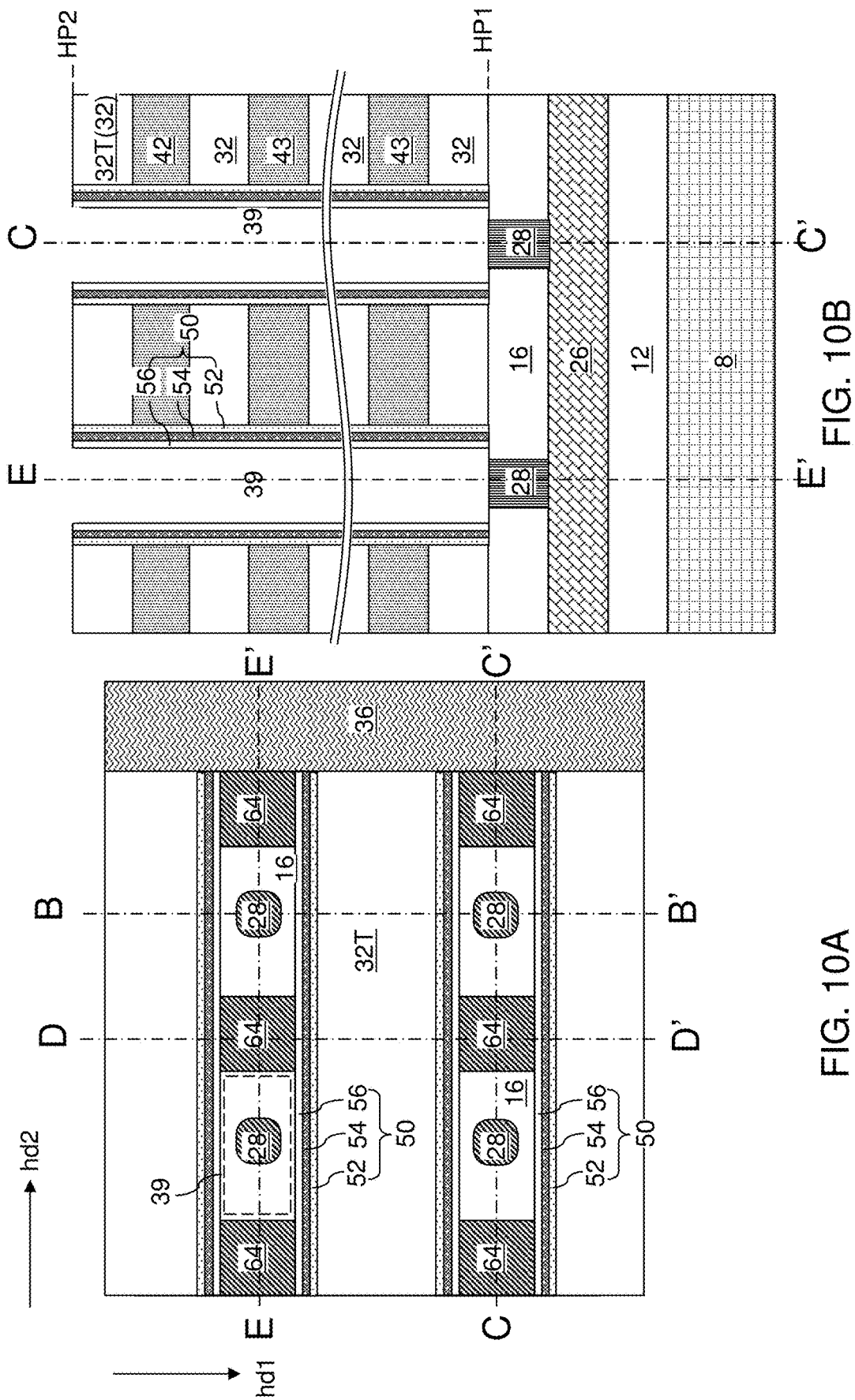
FIGS. 10A, 10B. 10C. 10D, and 10E various views of the first exemplary structure after formation of semiconductor channel cavities according to the first embodiment of the present disclosure.
Figures 11A, 11B:
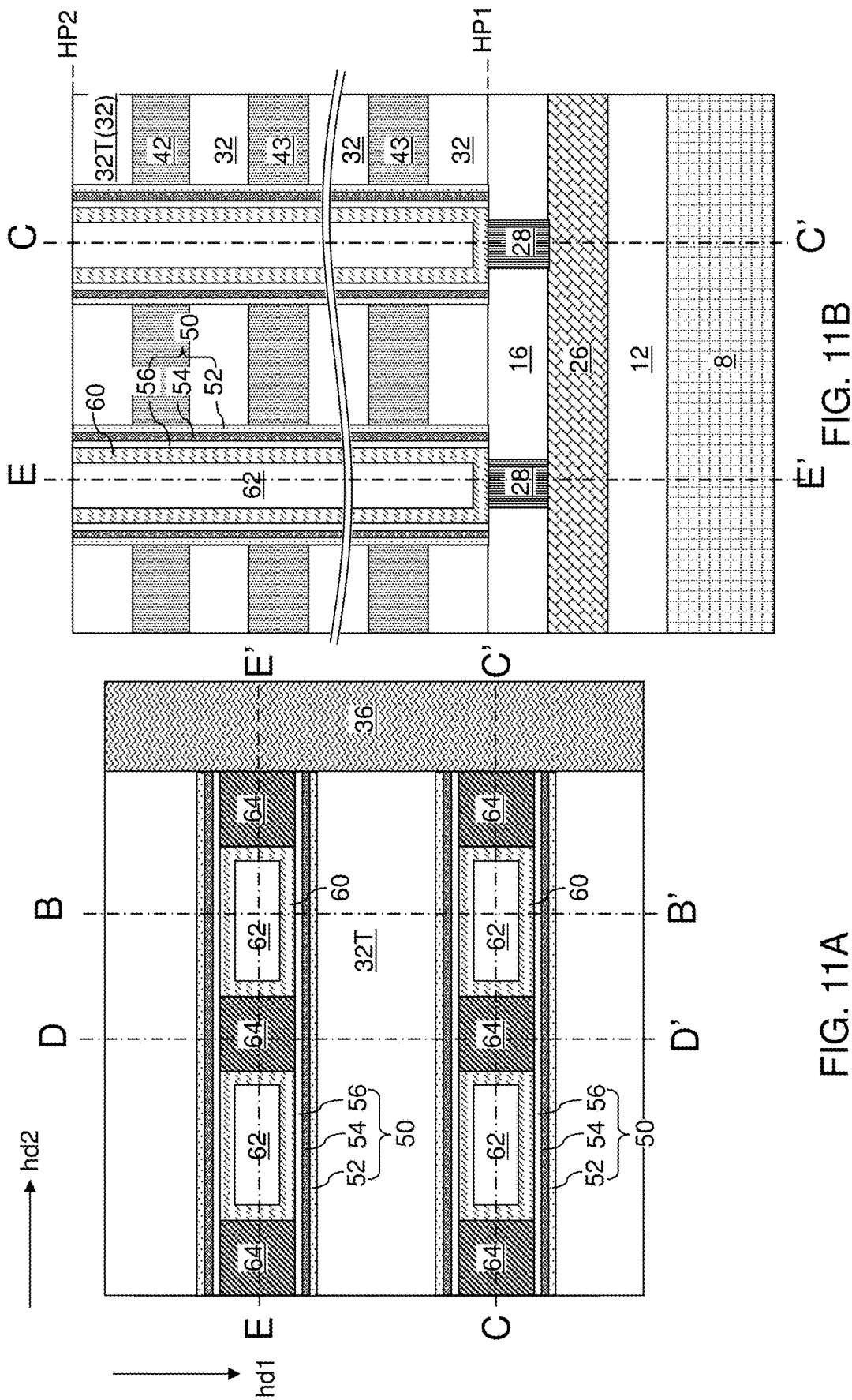
FIGS. 11A. 11B, 11C. 11D, and 11E are various views of the first exemplary structure after formation of semiconductor channels and dielectric cores according to the first embodiment of the present disclosure.
Figure 11E:
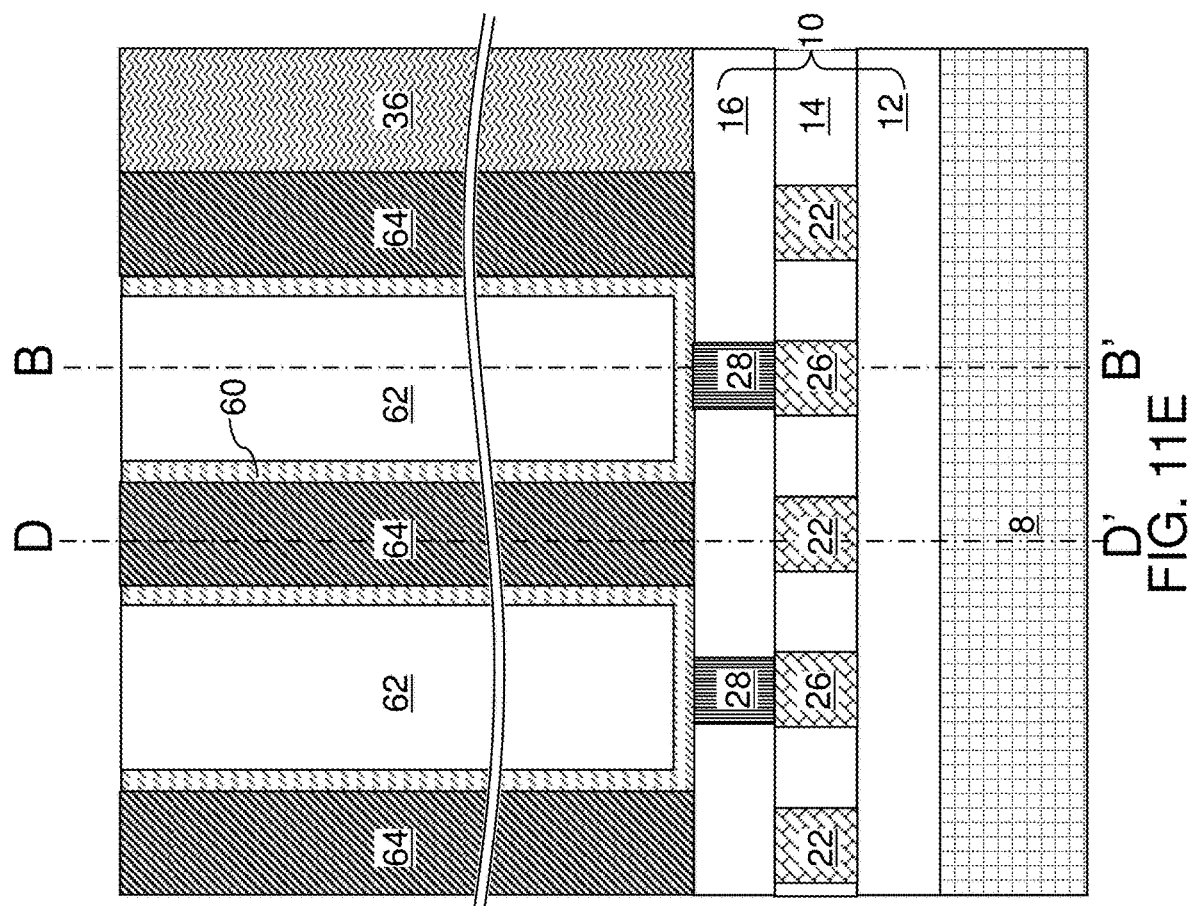
Figures 12A, 12B:
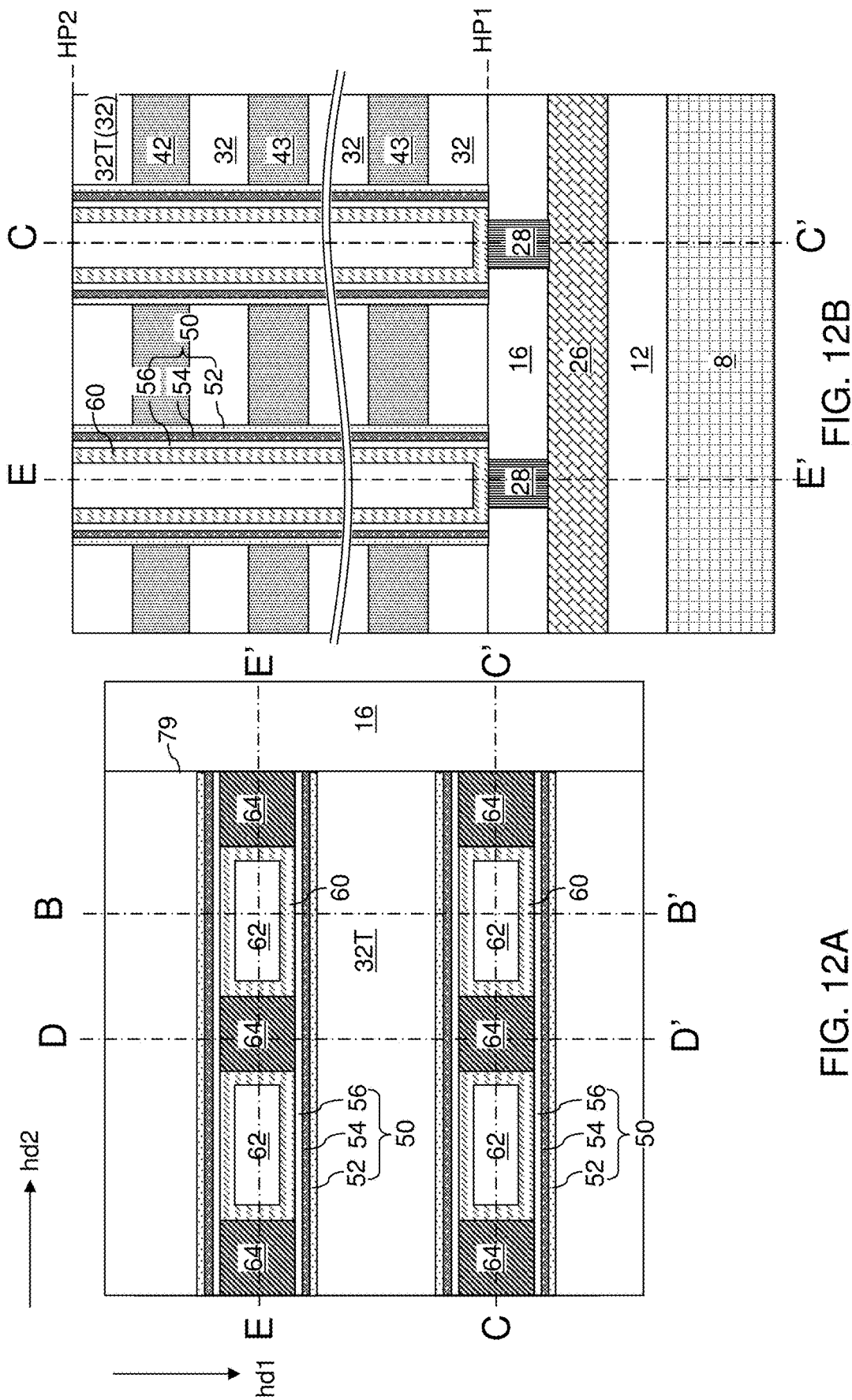
Figure 12E:
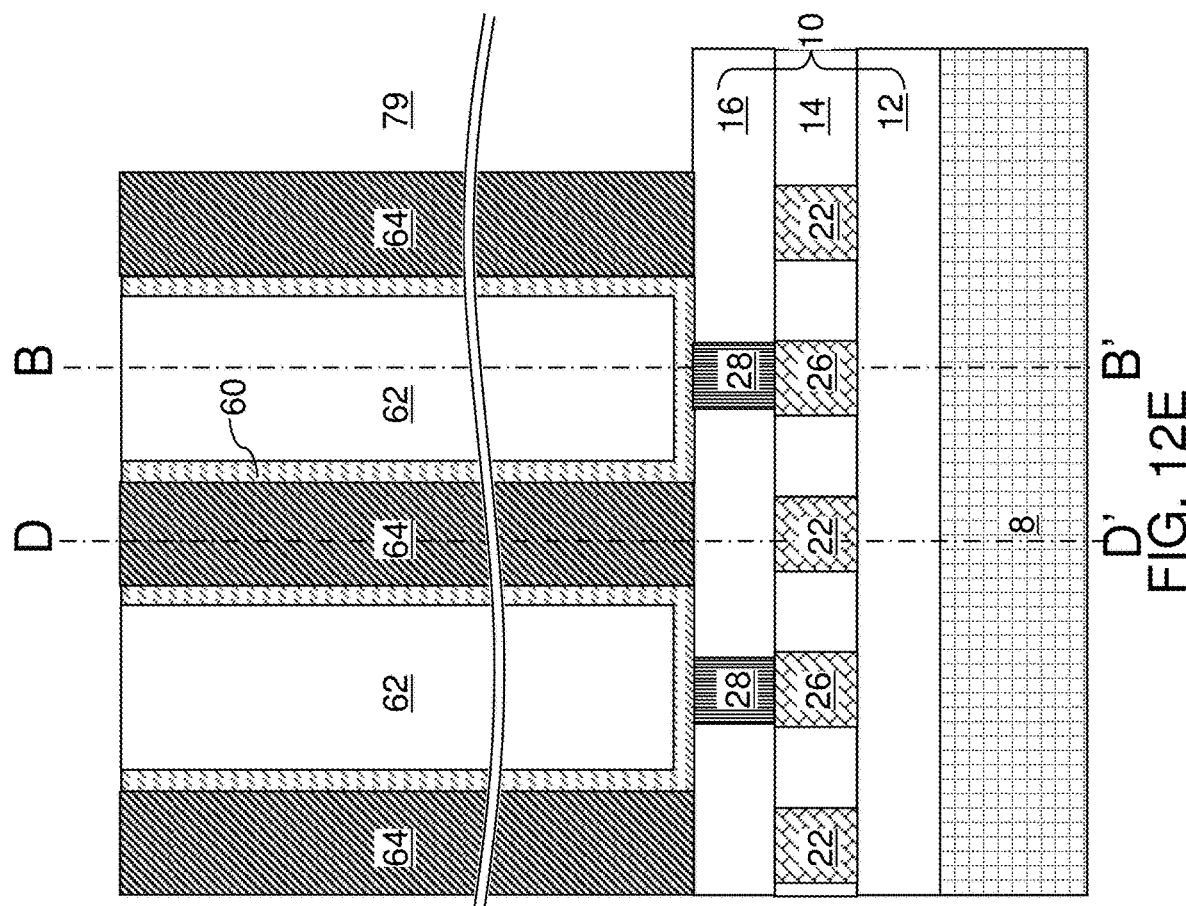
Figures 13A, 13B:
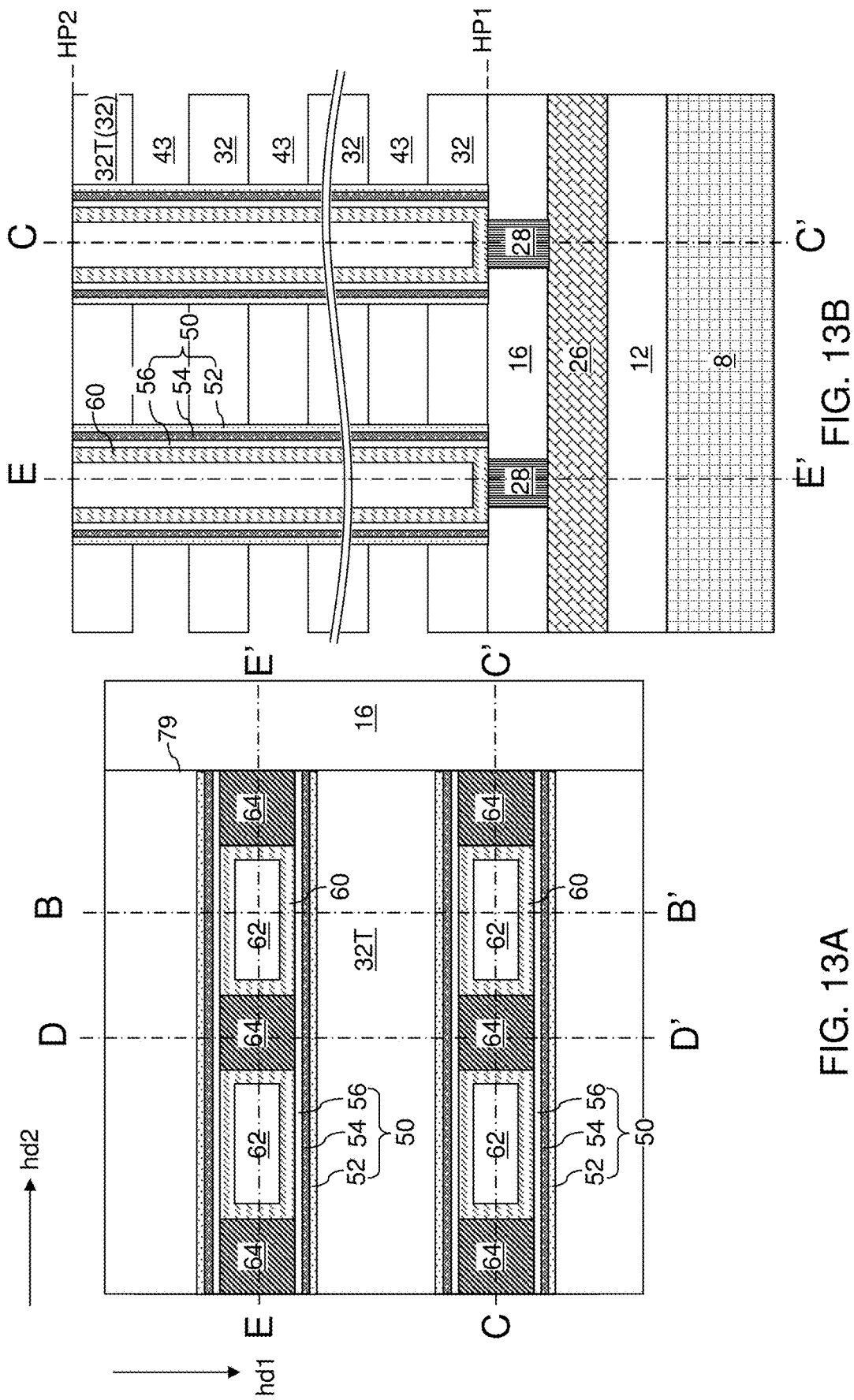
Figures 13C, 13D:
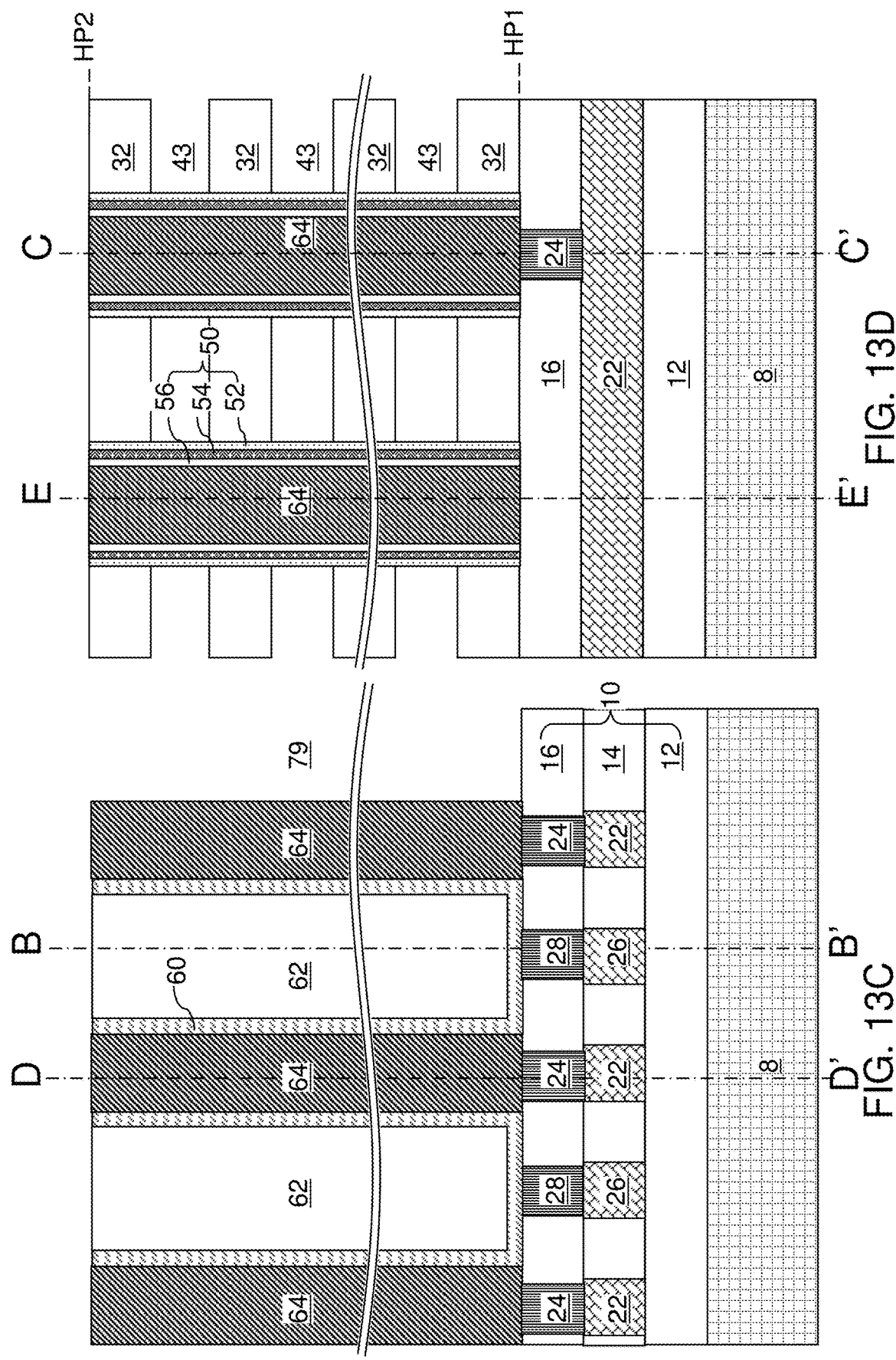
Figures 14A, 14B:
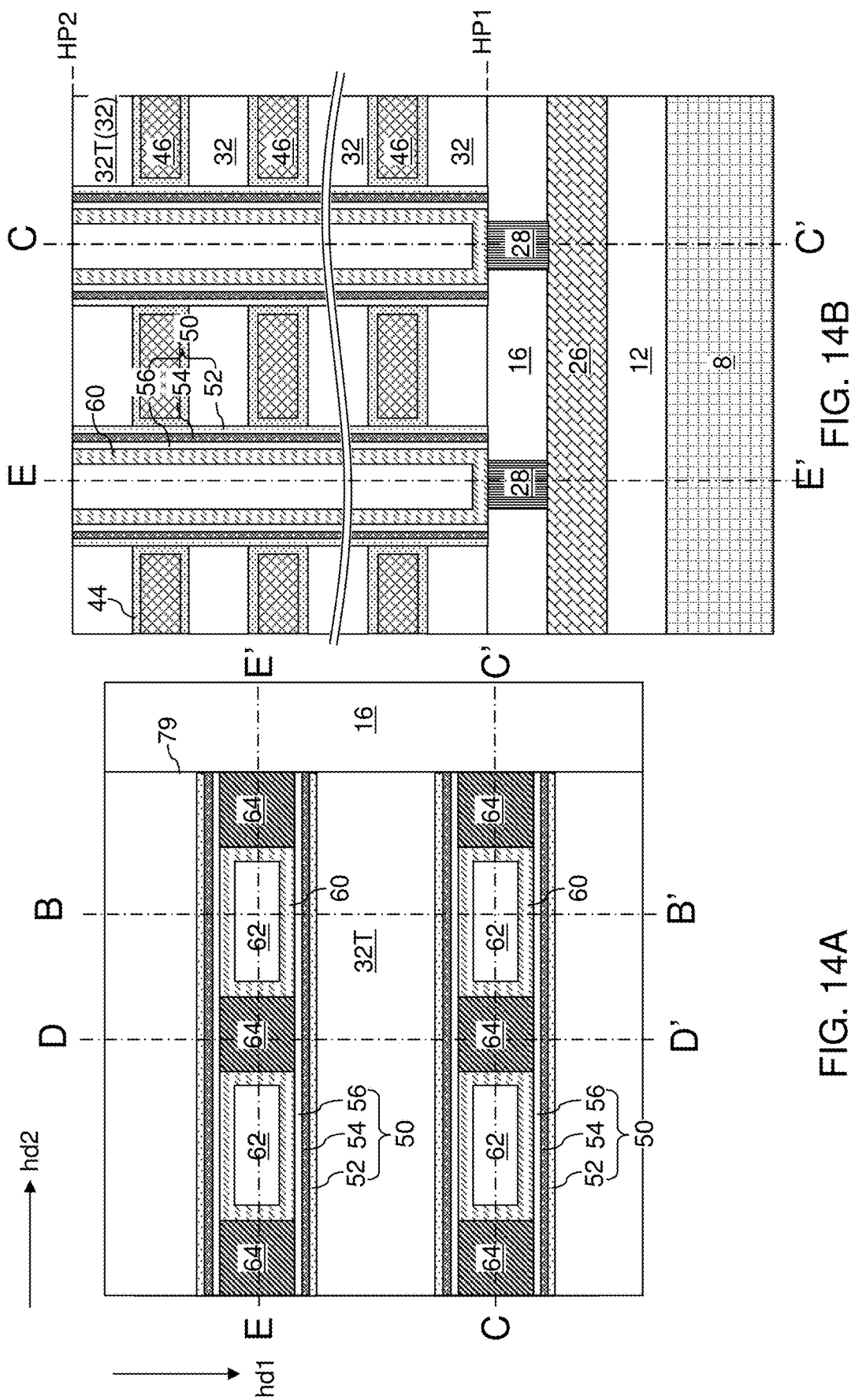
Figure 14E:
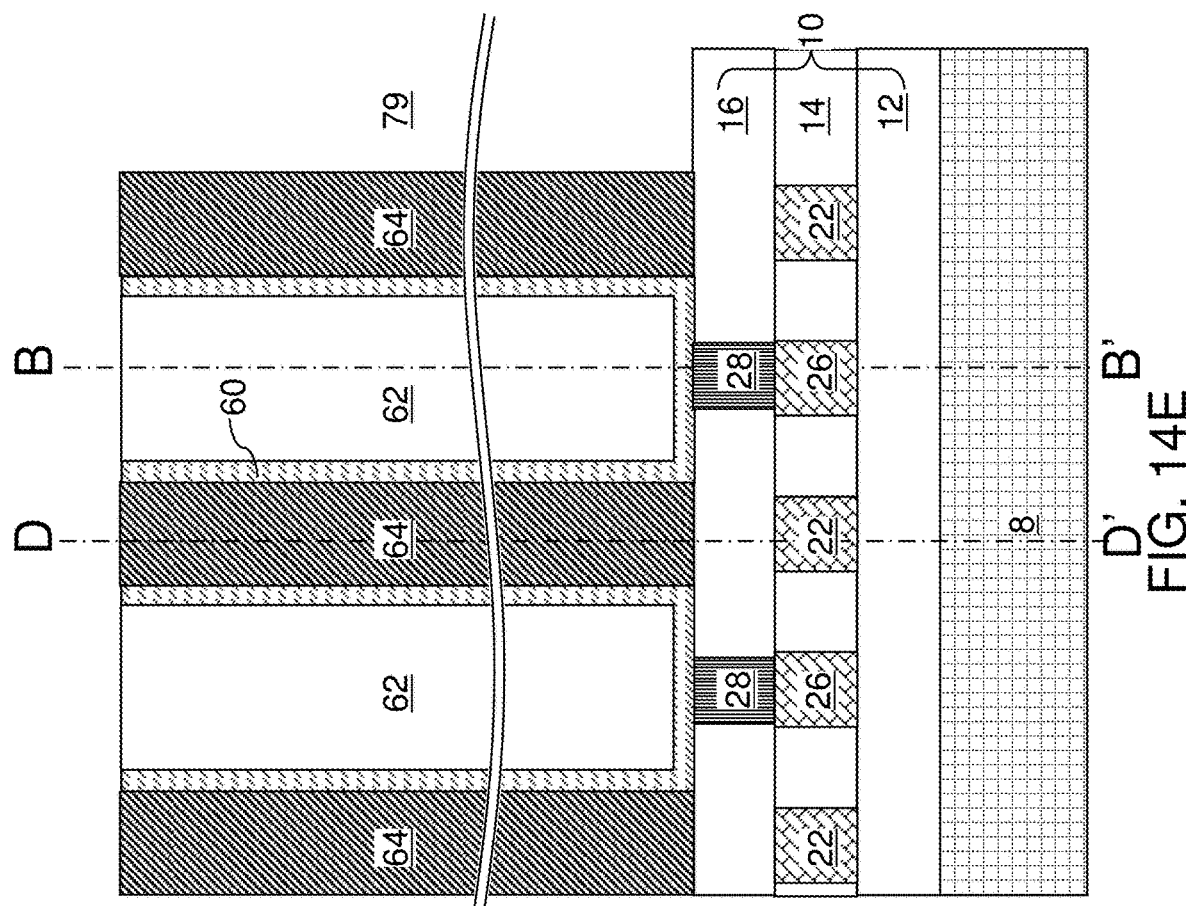
Figures 15A, 15B:
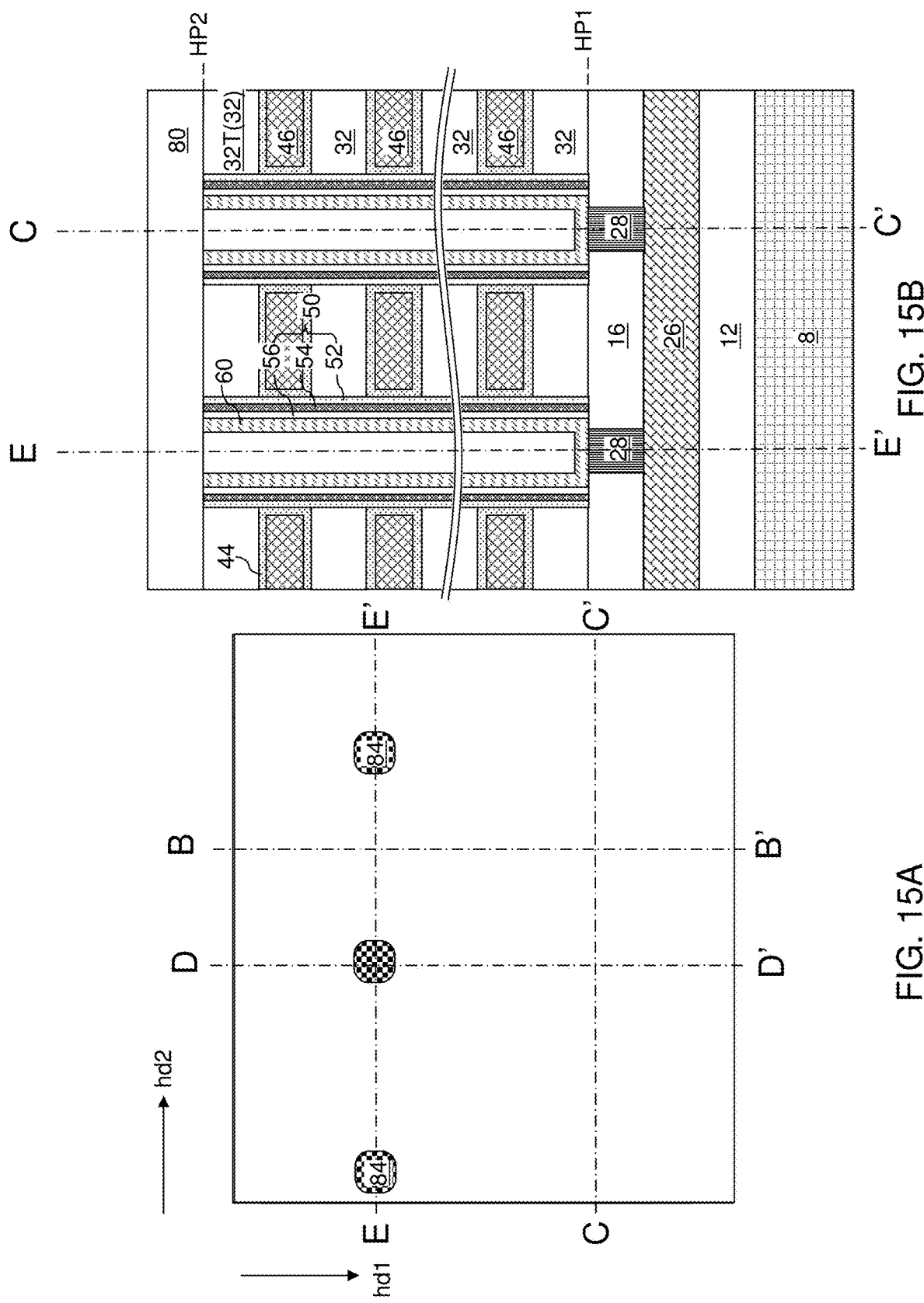
FIGS. 15A, 15B, 15C, 15D, and 15E are various views of the first exemplary structure after formation of a dielectric backside trench fill structure in the backside trench and after formation of top source/drain connection via structures according to the first embodiment of the present disclosure.
Figures 15C, 15D:
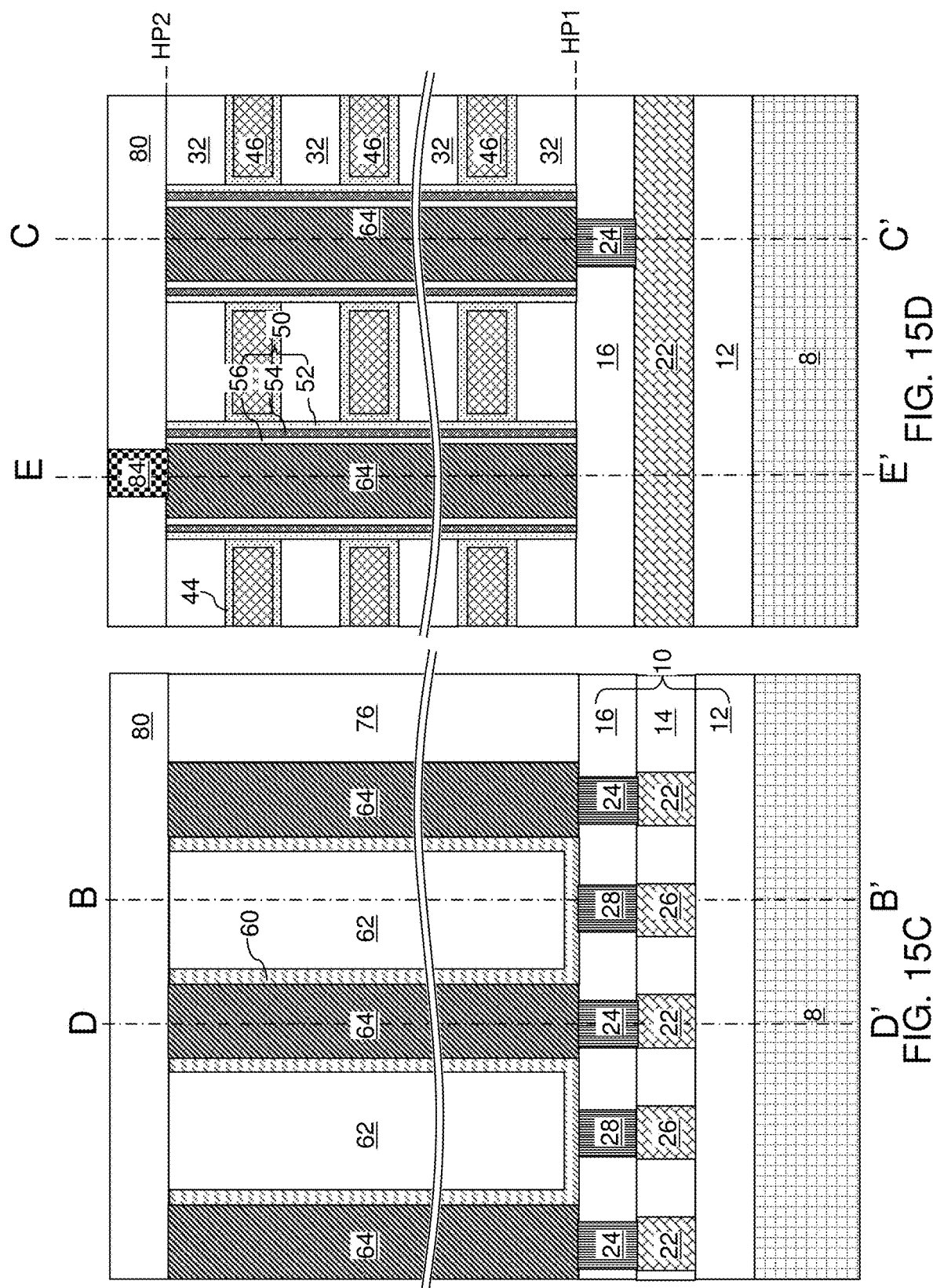
Figure 15E:
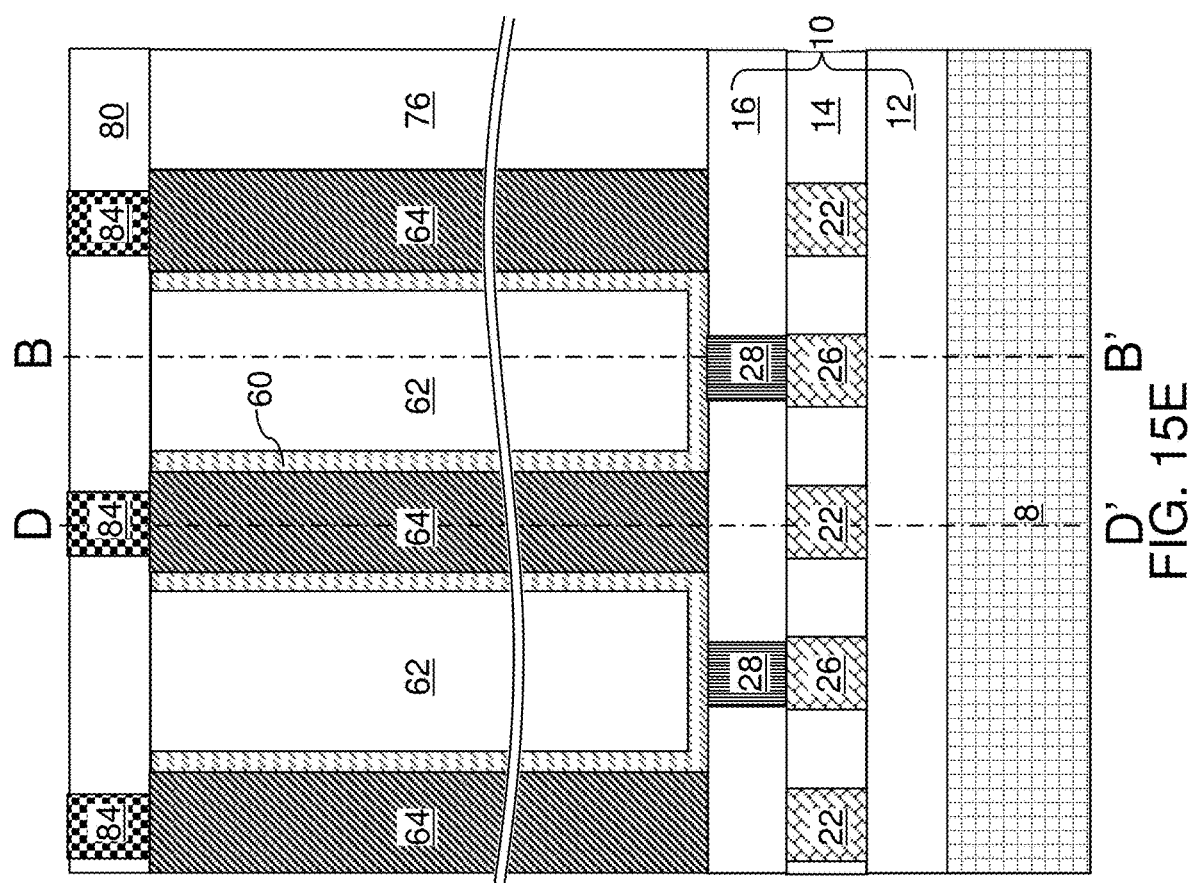
Figures 16A, 16B:
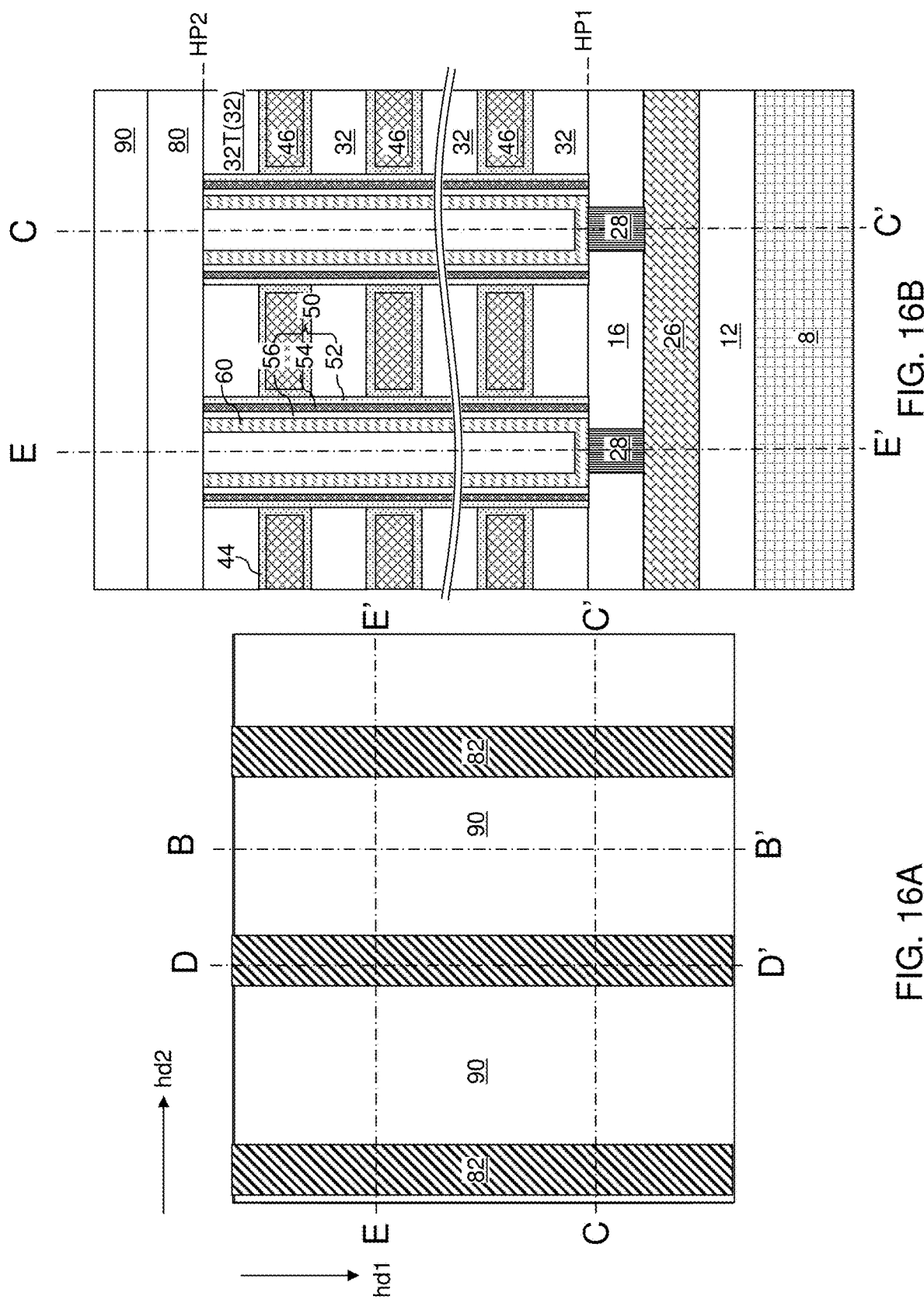
Figure 16E:
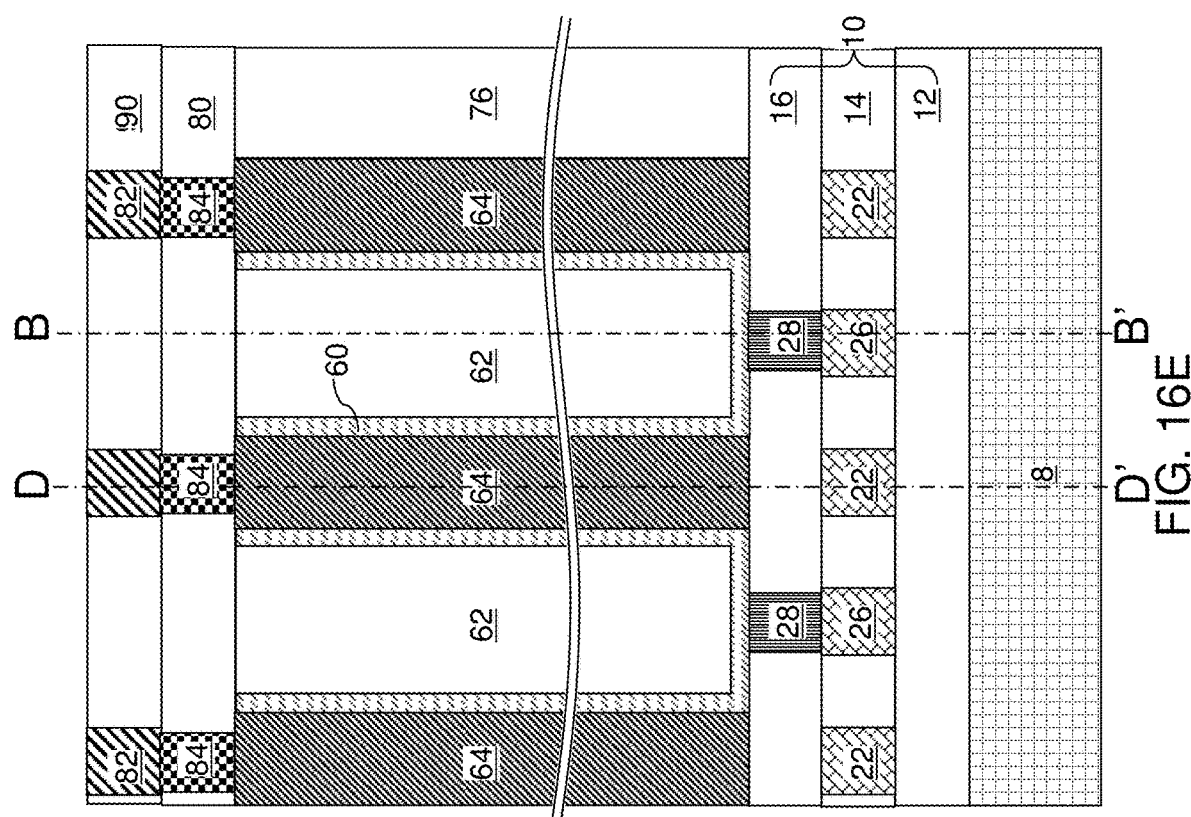

As discussed above, embodiments of the present disclosure are directed to three-dimensional NOR arrays and methods of manufacturing the same, the various aspects of which are described below.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or from each other, the two elements are "disjoined from" each other or "disjoined among" one another.

As used herein, a first element located "on" a second element can be located on the exterior side of a surface of the second element or on the interior side of the second element.

As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Referring to FIGS. 1A-1E, a first exemplary structure according to a first embodiment of the present disclosure is illustrated. The first exemplary structure comprises a substrate 8, which can be a semiconductor substrate, such as a commercially available silicon wafer. Optionally, semiconductor devices (not shown) such as complementary metal-oxide-semiconductor (CMOS) transistors can be formed on the top surface of the substrate 8. The CMOS transistors can include a control (i.e., driver) circuit for controlling a NOR memory array to be subsequently formed thereabove.

An insulating spacer layer 12 can be formed above the substrate 8. In case semiconductor devices are formed on the top surface of the substrate 8, the insulating spacer layer 12 can be formed above such semiconductor devices (such as field effect transistors). A first line-level dielectric layer 14 can be formed above the insulating spacer layer 12. The first line-level dielectric layer 14 includes a dielectric material such as silicon oxide, and can have a thickness in a range from 50 nm to 500 nm. Line cavities laterally extending along a first horizontal direction hd1 can be formed through the first line-level dielectric layer 14. At least one conductive material can be deposited in the line cavities, and excess portions of the at least one conductive material can be removed from above the horizontal plane including the top surface of the first line-level dielectric layer 14. Remaining portions of the at least one conductive material comprise access lines (22, 26). The access lines (22, 26) may comprise first bit lines 22 that are subsequently electrically connected to source/drain connection via structures and source/drain pillar structures, and optional semiconductor channel bias lines 26 that may be subsequently electrically connected to semiconductor channel contact via structures and semiconductor channels. According to an aspect of the present disclosure, the first bit lines 22 may be employed as source lines (that are connected to source regions of field effect transistors) or as drain lines (that are connected to drain regions of the field effect transistors) depending on the operational mode of the field effect transistors.

The access lines (22, 26) are parallel to each other, and laterally extend along a first lengthwise direction, which can be the first horizontal direction hd1. The access lines (22, 26) can have a same line width along a second horizontal direction hd2, which is perpendicular to the first horizontal direction hd1. In one embodiment, the first bit lines 22 and the semiconductor channel bias lines 26 may be interlaced along the second horizontal direction hd2. The access lines (22, 26) can be formed as a one-dimensional periodic array having a periodicity along the second horizontal direction hd2. The periodicity along the second horizontal direction hd2 may be the center-to-center distance along the first horizontal direction hd1 between neighboring pairs of first bit lines 22. Memory cells can be subsequently formed over the access lines (22, 26).

Referring to FIGS. 2A-2E, a first via-level dielectric layer 16 can be formed above the first line-level dielectric layer 14. The first via-level dielectric layer 16 includes a dielectric material such as silicon oxide, and can have a thickness in a range from 50 nm to 500 nm. Via cavities can be formed through the first via-level dielectric layer 16. At least one conductive material can be deposited in the via cavities, and excess portions of the at least one conductive material can be removed from above the horizontal plane including the top surface of the first via-level dielectric layer 16. Remaining portions of the at least one conductive material comprise connection via structures (24, 28) each of which comprises an electrically conductive material. The connection via structures (24, 28) may comprise first source/drain connection via structures 24 and semiconductor channel contact via structures 28. Each first source/drain connection via structure 24 can be formed on a top surface of a respective one of the first bit lines 22. Each semiconductor channel contact via structure 28 can be formed on a top surface of a respective one of the semiconductor channel bias lines 26. The layer stack of the insulating spacer layer 12, the first line-level dielectric layer 14, and the first via-level dielectric layer 16 is herein referred to as underlying insulating layers 10.

In one embodiment, the first source/drain connection via structures 24 may be formed as a two-dimensional periodic array of first source/drain connection via structures 24, and each of the first bit lines 22 contacts a respective subset of the first source/drain connection via structures 24 and laterally extends along the first horizontal direction hd1. In one embodiment, the semiconductor channel contact via structures 28 may be formed as a two-dimensional array of semiconductor channel contact via structures 28, and each semiconductor channel bias line 26 contacts a respective subset of the semiconductor channel contact via structures 28 and laterally extends along the first horizontal direction hd1.

According to an embodiment of the present disclosure, the semiconductor channel contact via structures 28 can be formed for each semiconductor channel to be subsequently formed, and the first source/drain connection via structures 24 may be formed for a first subset of source/drain pillar structures to be subsequently formed. The first subset of source/drain pillar structures may include about one half of all the source/drain pillar structures to be subsequently formed. In one embodiment, the semiconductor channel contact via structures 28 may be formed in rows that laterally extend along the second horizontal direction hd2 and repeated along the first horizontal direction hd1. In one embodiment, the first source/drain connection via structures 24 may be formed in rows that laterally extend along the second horizontal direction hd2 and repeated along the first horizontal direction hd1. In one embodiment, the pitch (i.e., the periodicity) of the rows of the first source/drain connection via structures 24 along the first horizontal direction hd1 may be twice the pitch of the rows of the semiconductor channel contact via structures 28. In this case, every other row of semiconductor channel contact via structures 28 may be interlaced with a respective row of first source/drain connection via structures 24 along the second horizontal direction hd2.

Referring to FIGS. 3A-3E, a vertically alternating sequence of first material layers (such as insulating layers 32L) and second material layers (such as spacer material layers) is formed over the underlying insulating layers 10. As used herein, a "vertically alternating sequence" refers to an alternating sequence of multiple instances of a first element and multiple instances of a second element that alternate vertically such that an instance of the second element overlies and/or underlies each instance of the first element, and an instance of the first element overlies and/or underlies each instance of the second element. The vertically alternating sequence can include a stack of an alternating plurality of first material layers (which can be insulating layers 32L) and second material layers (which can be sacrificial material layer 42L). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. Thus, a vertically alternating sequence of first elements and second elements is an alternating plurality of the first elements and the second elements in which the alternating of the first elements and second elements occurs along the vertical direction. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32L, and each second material layer can be a sacrificial material layer 42L. In this case, the stack can include an alternating plurality of insulating layers 32L and sacrificial material layers 42L, and constitutes a prototype stack of alternating layers comprising insulating layers 32L and sacrificial material layers 42L. As used herein, a "prototype" structure or an "in-process" structure refers to a transient structure that is subsequently modified in the shape or composition of at least one component therein.

In one embodiment, the vertically alternating sequence (32L, 42L) can include insulating layers 32L composed of the first material, and sacrificial material layers 42L composed of a second material different from that of insulating layers 32L. Insulating materials that can be employed for the insulating layers 32L include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32L can be silicon oxide.

The second material of the sacrificial material layers 42L is a sacrificial material that can be removed selective to the first material of the insulating layers 32L. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42L may comprise an insulating material, a semiconductor material, or a conductive material. The second material of the sacrificial material layers 42L can be subsequently replaced with electrically conductive electrodes which can function as word lines. Non-limiting examples of the second material include silicon nitride, an amorphous semiconductor material (such as amorphous silicon), or a polycrystalline semiconductor material (such as polysilicon).

In one embodiment, the insulating layers 32L can include silicon oxide, and sacrificial material layers 42L can include silicon nitride. The first material of the insulating layers 32L can be deposited, for example, by chemical vapor deposition (CVD). For example, if silicon oxide is employed for the insulating layers 32L, tetraethyl orthosilicate (TEOS) can be employed as the precursor material for the CVD process. The second material of the sacrificial material layers 42L can be formed, for example, CVD or atomic layer deposition (ALD).

The thicknesses of the insulating layers 32L and the sacrificial material layers 42L can be in a range from 20 nm to 50 nm, although lesser and greater thicknesses can be employed for each insulating layer 32L and for each sacrificial material layer 42L. The number of repetitions of the pairs of an insulating layer 32L and a sacrificial material layer 42L (e.g., a control gate electrode or a sacrificial material layer) can be in a range from 2 to 1,024, and typically from 8 to 256, although a greater number of repetitions can also be employed. In one embodiment, each sacrificial material layer 42L in the vertically alternating sequence (32L, 42L) can have a uniform thickness that is substantially invariant within each respective sacrificial material layer 42L. In one embodiment, the vertically alternating sequence (32L, 42L) may begin with a bottommost one of the insulating layers 32L and terminate with a topmost one of the insulating layers 32L.

The topmost layer of the vertically alternating sequence (32L, 42L) may be a topmost insulating layer 32LT. The vertically alternating sequence (32L, 42L) can be patterned in a peripheral region (not shown) that is laterally offset from a memory array region illustrated in FIGS. 3A-3E along the first horizontal direction hd1 to form stepped surfaces. The stepped surfaces can be subsequently employed to form connection via structures that contact a respective electrically conductive strip. A retro-stepped dielectric material portion can be formed over the stepped surfaces of the vertically alternating sequence (32L, 42L).

While an embodiment is described in which the spacer material layers are sacrificial material layers 42L that are subsequently replaced with electrically conductive strips, embodiments are expressly contemplated herein in which the sacrificial material layers are formed as electrically conductive strips, such as heavily doped polysilicon strips. In this case, steps for replacing the spacer material layers with electrically conductive strips can be omitted.

Referring to FIGS. 4A-4E, a lithographic material stack (not shown) including at least a photoresist layer can be formed over the vertically alternating sequence (32L, 42L), and can be lithographically patterned to form line-shaped openings therein. The line-shaped openings laterally extend along the second horizontal direction hd2, and have a uniform width along a first horizontal direction hd1 that is perpendicular to the second horizontal direction hd2. Optionally, an additional line-shaped opening (which is herein referred to as a backside opening) laterally extending along the first horizontal direction hd1 may be formed such that each of the line-shaped openings is adjoined to the backside opening.

The pattern in the lithographic material stack can be transferred through the vertically alternating sequence (32L, 42L) by at least one anisotropic etch that employs the patterned lithographic material stack as an etch mask. Portions of the vertically alternating sequence (32L, 42L) underlying the line-shaped openings in the patterned lithographic material stack are etched to form line trenches 31T and an optional backside trench 31B. As used herein, a "line trench" refers to a trench that has laterally extends straight along a horizontal direction. In one embodiment, each of the line trenches 31T may be adjoined to the backside trench 31B. In an alternative embodiment, formation of the backside trenches 31B may be postponed until after formation of source/drain pillar structures and semiconductor channels.

The line trenches 31T laterally extend along the second horizontal direction hd2 through the vertically alternating sequence (32L, 42L). In one embodiment, the line trenches 31T can have the same width throughout, and the spacing between neighboring pairs of the line trenches 31T can be the same. In this case, the line trenches 31T can constitute a one-dimensional periodic array of line trenches 31T. The width of the line trenches 31T can be in a range from 30 nm to 300 nm, such as from 40 nm to 100 nm, although lesser and greater widths can also be employed.

In one embodiment, each of the line trenches 31T may be connected to the backside trench 31B. In this case, the combination of the line trenches 31T and the backside trench 31B may be formed as a single continuous cavity, and is herein referred to as a trench assembly 31.

The line trenches 31T extend through each layer of the vertically alternating sequence (32L, 42L). The chemistry of the anisotropic etch process employed to etch through the materials of the vertically alternating sequence (32L, 42L) can alternate to optimize etching of the first and second materials in the vertically alternating sequence (32L, 42L). The anisotropic etch can be, for example, a series of reactive ion etches. The sidewalls of the line trenches 31T can be substantially vertical, or can be tapered. The patterned lithographic material stack can be subsequently removed, for example, by ashing.

Each of the line trenches 31T may include a sidewall (or a plurality of sidewalls) that extends substantially perpendicular to the topmost surface of the substrate 8. Each of the line trenches 31T vertically extend through each layer of the vertically alternating sequence (32L, 42L). A row of connection via structures (24, 28) can be physically exposed at the bottom of each line trench 49. Patterned portions of the insulating layers 32L comprise insulating strips 32 having a uniform width and laterally extending along the second horizontal direction hd2. Patterned portion of the sacrificial material layers 42L comprise sacrificial material strips 42 having the uniform width and laterally extending along the second horizontal direction hd2. Each vertically stacked set of insulating strips 32 and sacrificial material strips 42 comprises a vertically-alternating stack of insulating strips 32 and sacrificial material strips 42. A plurality of vertically-alternating stacks (32, 42) is formed over the underlying insulating layers 10. In one embodiment, the topmost strip of each vertically-alternating stack (32, 42) may comprise a topmost insulating strip 32T.

The line trenches 31T laterally extend along the second horizontal direction hd2, and each vertically-alternating stack (32, 42) of insulating strips 32 and sacrificial material strips 42 can be located between a respective neighboring pair of line trenches 31T that are laterally spaced apart along the first horizontal direction hd1. The vertically-alternating stacks (32, 42) of insulating strips 32 and spacer material strips (such as sacrificial material strips 42) are laterally spaced apart from each other by the line trenches 31T. Generally, vertically-alternating stacks of insulating strips 32 and spacer material strips can be formed over a substrate 8. While an embodiment is described in which the spacer material strips are formed as sacrificial material strips 42, embodiments are expressly contemplated herein in which the spacer material strips are formed as electrically conductive strips. In case the spacer material strips are formed as sacrificial material strips 42, each of the sacrificial material strips can be subsequently replaced with a respective electrically conductive strip.

Generally, the line trenches 31T divide the vertically alternating sequence into vertically-alternating stacks (32, 42) of insulating strips 32 and sacrificial material strips 42. The vertically-alternating stacks (32, 42) are laterally spaced apart from each other by the line trenches 31T. Each line trench 31T vertically extends from a first horizontal plane HP1 including bottommost surfaces of the vertically-alternating stacks (32, 42) to a second horizontal plane HP2 including topmost surfaces of the vertically-alternating stacks (32, 42).

Referring to FIGS. 5A-5E, a continuous memory film 50C can be formed on the physically exposed surface of the line trenches 31T and over the vertically-alternating stacks (32, 42). The continuous memory film 50C extends into each of the line trenches 31T and over the vertically-alternating stacks (32, 42). In one embodiment, the continuous memory film 50C is formed by sequentially depositing a blocking dielectric layer 52, a charge storage layer 54, and a tunneling dielectric layer 56 into the line trenches 31T. The blocking dielectric layer 52 includes at least one dielectric material, such as silicon oxide and/or aluminum oxide, and can have a thickness in a range from 3 nm to 10 nm. The charge storage layer 54 includes a charge storage material such as silicon nitride, and can have a thickness in a range from 3 nm to 10 nm. The tunneling dielectric layer 56 comprises a tunneling dielectric layer 56 such as a silicon oxide layer, a silicon oxynitride layer, or an ONO stack, i.e., a layer stack of a silicon oxide layer, a silicon nitride layer, and a silicon oxide layer, and can have a thickness in a range from 3 nm to 10 nm.

The continuous memory film 50C can be patterned by removing horizontal portions of the continuous memory film 50C. For example, an anisotropic etch process can be performed to sequentially etch through the horizontal portions of the tunneling dielectric layer 56, horizontal portions of the charge storage layer 54, and horizontal portions of the blocking dielectric layer 52. The remaining portion of the continuous memory film 50C can be located on sidewalls of the trench assembly 31. In case the backside trench 31B is not present, a vertically-extending remaining portion of the continuous memory film 50C (which is herein referred to as a memory film) may be present within each line trench 31T. A line cavity 31T' can be present within the volume of each line trench 31T, and a backside cavity 31B' can be present within the volume of the backside trench 31B.

Referring to FIGS. 6A-6E, in case a trench assembly 31 includes a backside trench 31B in addition to the plurality of line trenches 31T, portions of the continuous memory film 50C that are located on sidewalls of the backside trench 31B can be optionally removed without removing portions of the continuous memory film 50C located in the line trenches 31T. For example, a photoresist layer can be applied and lithographically patterned to fill the line trenches 31T without filling the backside trench 31B. A set of isotropic etch processes can be performed to sequentially etch unmasked portions of the tunneling dielectric layer 56, the charge storage layer 54, and the blocking dielectric layer 52. The continuous memory film 50C can be divided into a plurality of memory films 50 that are located in a respective one of the line trenches 31T. In case the backside trench 31B is not employed, the processing steps of FIGS. 6A-6D may be omitted. Generally, a memory film 50 can be formed within each line trench 31T on sidewalls of a respective pair of vertically-alternating stacks (32, 42) of insulating strips 32 and sacrificial material strips 42. Each memory film 50 can include a layer stack that includes, from one side to another, a blocking dielectric layer 52, a charge storage layer 54, and a tunneling dielectric layer 56.

Referring to FIGS. 7A-7E, a sacrificial trench fill material can be deposited in the line cavities 31L' and in the backside cavity 31B'. The sacrificial trench fill material includes a material that can be removed selective to the material of the outermost layer of the tunneling dielectric layers 56, which can be thermal silicon oxide. For example, the sacrificial trench fill material can include silicon nitride, porous or non-porous organosilicate glass, borosilicate glass, a silicon-germanium alloy including germanium at an atomic concentration in a range from 15% to 50%, amorphous carbon, diamond-like carbon (DLC), or an organic polymer material. Excess portions of the sacrificial trench fill material can be removed from above the horizontal plane including the top surface of the topmost insulating strips 32T by a planarization process such as a chemical mechanical planarization process and/or a recess etch process. Each remaining portion of the sacrificial trench fill material located within a respective one of the line trenches 31L comprises a sacrificial line trench fill structure 33L. Each sacrificial line trench fill structure 33L is formed within a respective line trench 31L on a respective memory film 50. Each sacrificial line trench fill structure 33L can have the shape of a rail. A remaining portion of the sacrificial trench fill material located within the backside trench 31B comprises a sacrificial backside trench fill structure 36. In one embodiment, the line trenches 31L and the backside trench 31B may be formed as a trench assembly 31, and the sacrificial line trench fill structure 33L and the backside trench fill structure 36 may be formed as a single continuous sacrificial fill material portion, which is herein referred to as an integrated sacrificial trench fill structure 33. In this case, the integrated sacrificial trench fill structure 33 may comprise a plurality of sacrificial line trench fill structures 33L and a backside trench fill structure 36.

Referring to FIGS. 8A-8E, a photoresist layer (not shown) can be applied over the first exemplary structure, and can be lithographically patterned to form an array of openings. A first subset of the openings in the photoresist layer can be formed over the area of a respective underlying first source/drain connection via structure 24. A second subset of the openings in the photoresist layer can be formed between areas of a respective neighboring pair of first source/drain connection via structures 24 that are laterally spaced apart along the first horizontal direction hd1. In one embodiment, a row of openings having a uniform pitch can be formed in the photoresist layer over each sacrificial line trench fill structure 33L.

An anisotropic etch process can be performed to etch first portions of the sacrificial line trench fill structures 33L that underlie the openings in the photoresist layer. In one embodiment, the chemistry of the anisotropic etch process can be selected such that the unmasked portions of the sacrificial line trench fill structures 33L are etched selective to the materials of the memory films 50, i.e., without etching the materials of the memory films 50. Vertically-extending cavities are formed in volumes from which the first portions of the sacrificial line trench fill structures 33L is removed. The vertically-extending cavities are pillar-shaped, and may have a horizontal cross-sectional shape that is substantially invariant under translation along a vertical direction, and are herein referred to first pillar cavities 37.

A top surface of the first via-level dielectric layer 16 and a top surface of a first source/drain connection via structure 24 may be physically exposed at the bottom of a first subset of the first pillar cavities 37. A top surface of the first via-level dielectric layer 16 may be physically exposed at the bottom of a second subset of the first pillar cavities 37 without exposure of any first source/drain connection via structure 24 underneath the second subset of the first pillar cavities 37. In one embodiment, the first pillar cavities 37 may be formed as a two-dimensional periodic array of pillar cavities 37. Each sacrificial line trench fill structure 33L is divided into multiple discrete sacrificial material portions, which may comprise a row of sacrificial material pillars 34. Generally, an array of first pillar cavities 37 can be formed by removing first material portions of the sacrificial line trench fill structures 33L. Remaining second material portions of the sacrificial line trench fill structures 33L constitute an array of sacrificial material pillars 34. The sacrificial backside trench fill structure 36 is present within the backside trench 31B. The lateral dimension of each first pillar cavity 37 along the first horizontal direction hd1 may be in a range from 10 nm to 200 nm, such as from 20 nm to 100 nm, although lesser and greater lateral dimensions may also be employed. The pitch of the two-dimensional array of first pillar cavities 37 along the second horizontal direction hd2 may be in a range from 20 nm to 500 nm, such as from 40 nm to 250 nm, although lesser and greater pitches may also be employed.

Referring to FIGS. 9A-9E, a doped semiconductor material can be deposited in the first pillar cavities 37. The conductivity type of semiconductor channels to be subsequently formed is herein referred to as a first conductivity type, and the conductivity type of the doped semiconductor material deposited in the first pillar cavities 37 is herein referred to as a second conductivity type. The second conductivity type can be the opposite of the first conductivity type. For example, the first conductivity type is p-type, the second conductivity type is n-type, and vice versa. Thus, the doped semiconductor material deposited in the first pillar cavities 37 can have a doping of the second conductivity type. In one embodiment, the doped semiconductor material deposited in the first pillar cavities 37 can include heavily doped polysilicon or heavily doped amorphous silicon (which is subsequently converted into doped polysilicon). The doped semiconductor material can include dopants of the second conductivity type at an atomic concentration in a range from $5.0 \times 10^{19}/cm^3$ to $2.0 \times 10^{21}/cm^3$, although lesser and greater atomic concentrations can also be employed.

Excess portions of the doped semiconductor material can be removed from above the top surface of the topmost insulating strips 32T of the vertically-alternating stacks (32, 42). Each remaining portion of the doped semiconductor material that fills a respective first pillar cavity 37 comprises a source/drain pillar structure 64, or an active region pillar structures. Each source/drain pillar structure 64 may function as a common source region for a plurality of charge storage field effect transistors that are connected in parallel (i.e., in a NOR configuration), or may function as a common drain region for the plurality of charge storage field effect transistors. As used herein, an active region refers to any of a source region, a drain region, or a doped semiconductor material portion that may function as a source region or as a drain region depending on electrical bias conditions. As used herein, a source/drain refers to any doped semiconductor material portion that may function as a source region and/or as a drain region. A first subset of the source/drain pillar structures 64 can be formed on a top surface of a respective first source/drain connection via structure 24. A second subset of the source/drain pillar structures 64 does not contact any first source/drain connection via structure 24.

Generally, the source/drain pillar structures 64 can be formed in the array of first pillar cavities 37. Each of the first source/drain connection via structures 24 can be in contact with a horizontal surface of a respective one of the source/drain pillar structures 64. In one embodiment, the source/drain pillar structures 64 vertically extend from a first horizontal plane HP1 including bottommost surfaces of the vertically-alternating stacks (32, 46) to a second horizontal plane HP2 including topmost surfaces of the vertically-alternating stacks (32, 46).

Referring to FIGS. 10A-10E, second pillar cavities 39 can be formed by removing the sacrificial material pillars 34 (which are the second portions of the sacrificial line trench fill structures 33L) without removing the source/drain pillar structures 64 or the sacrificial backside trench fill structure 36. For example, if the sacrificial backside trench fill structure 36 is present, then a photoresist layer (not shown) can be applied over the first exemplary structure, and can be lithographically patterned to form openings in areas that overlie the sacrificial material pillars 34. Alternatively, if the sacrificial backside trench fill structure 36 is not present at this step, then the photoresist layer may be omitted. The sacrificial material pillars 34 can be removed by performing a selective etch process that etches the sacrificial fill material of the sacrificial material pillars 34 selective to materials of the memory films 50 and the first via-level dielectric layer 16. The selective etch process may comprise an isotropic etch process or an anisotropic etch process. A second pillar cavity 39 can be formed within each volume from which a sacrificial material pillar 34 is removed. A pair of inner sidewalls of the memory films 50 and sidewalls of a pair of source/drain pillar structures 64 can be physically exposed around each second pillar cavity 39. Generally, an array of second pillar cavities 39 can be formed by removing the second material portions of the sacrificial line trench fill structures 33L. In one embodiment, the array of second pillar cavities 39 may be formed by removing the second material portions of the sacrificial line trench fill structures 31L between neighboring pairs of the source/drain pillar structures 64.

Referring to FIGS. 11A-11E, a semiconductor channel material layer can be conformally deposited in the second pillar cavities 39 and over the top surfaces of the topmost insulting strips 32T. The semiconductor channel material layer includes a doped semiconductor material having a doping of the first conductivity type, which is the opposite of the second conductivity type of the dopants in the source/drain pillar structures 64. The first conductivity type can be p-type and the second conductivity type can be n-type, or vice versa. The atomic concentration of dopants of the first conductivity type in the semiconductor channel material layer can be in a range from $1.0 \times 10^{15}/cm^3$ to $1.0 \times 10^{18}/cm^3$, such as from $3.0 \times 10^{15}/cm^3$ to $3.0 \times 10^{17}/cm^3$, although lesser and greater atomic concentrations can also be employed. The semiconductor channel material layer can be polysilicon or amorphous silicon deposited by a conformal deposition process such as low pressure chemical vapor deposition (LPCVD) process. The thickness of the semiconductor channel material layer can be in a range from 3 nm to 30 nm, such as from 5 nm to 15 nm, although lesser and greater thicknesses can also be employed.

Optionally, a planarizable dielectric material such as silicon oxide can be deposited in remaining unfilled volumes (if present) of the second pillar cavities 39. Excess portions of the planarization dielectric material and the semiconductor channel material layer can be removed from above the second horizontal plane HP2 including the top surfaces of the topmost insulating strips 32T of the vertically-alternating stacks (32, 42) by a planarization process. The planarization process can employ a chemical mechanical planarization (CMP) process and/or at least one recess etch process. Each remaining portion of the semiconductor channel material layer in a second pillar cavity 39 comprises a semiconductor channel 60 consisting essentially of a doped semiconductor material. Each remaining portion of the planarizable dielectric material in a semiconductor channel cavity comprises an optional dielectric core 62. In one embodiment, the dielectric cores 62 can have top surfaces that are located within the horizontal plane including topmost surfaces of the semiconductor channels 60, which can be the second horizontal plane HP2.

A two-dimensional array of semiconductor channels 60 can be formed in peripheral volumes of the array of second pillar cavities 39. An optional two-dimensional array of dielectric cores 62 can be formed in central volumes of the array of second pillar cavities 39. Each of the dielectric cores 62 can be formed within a respective one of the semiconductor channels 60. Each of the semiconductor channels 60 laterally surrounds a respective dielectric core 62.

Generally, a laterally-alternating sequence (60, 64) of semiconductor channels 60 and source/drain pillar structures 64 can be formed within each of the line trenches 31T on a respective one of the memory films 50. Within each laterally-alternating sequence (60, 64) of semiconductor channels 60 and source/drain pillar structures 64, a plurality of source/drain pillar structures 64 can be in direct contact with a respective pair of vertical semiconductor channels 60. A memory films 50 is located between each neighboring pair of a vertically-alternating stack (32, 42) and a laterally-alternating sequences (60, 64), In one embodiment, each of the semiconductor channels 60 vertically extends from the first horizontal plane HP1 including bottommost surfaces of the vertically-alternating stacks (32, 42) to the second horizontal plane HP2 including topmost surfaces of the vertically-alternating stacks (32, 42). In one embodiment, each of the semiconductor channels 60 comprises a respective pair of first outer sidewalls that are parallel to the first horizontal direction hd1, and a respective pair of second outer sidewalls that are parallel to the second horizontal direction hd2. In one embodiment, each of the second outer sidewalls contacts a respective one of the memory films 50, and each of the first outer sidewalls contacts a respective one of the source/drain pillar structures 64. In one embodiment, interfaces between the semiconductor channels 60 and the source/drain pillar structures 64 are located within a respective planar vertical plane that is perpendicular to the first horizontal plane HP1.

Referring to FIGS. 12A-12E, a photoresist layer (not shown) can be applied over the first exemplary structure, and can be lithographically patterned to cover the vertically-alternating stacks (32, 42) and the laterally-alternating sequences (60, 64) without covering the sacrificial backside trench fill structure 36. An etch process can be performed to remove the sacrificial backside trench fill structure 36.

A backside trench 79 can be formed in the volume from which the sacrificial backside trench fill structure 36. A sidewall of each sacrificial material strip 42 can be physically exposed to the backside trench 79. Alternatively, if the sacrificial backside trench fill structure 36 is not present, then the backside trench 79 may be formed in a portion of the alternating stack (32, 42).

Referring to FIGS. 13A-13E, backside recesses 43 can be formed by performing an isotropic etch process that etches the material of the sacrificial material strips 42 selective to the materials of the insulating strips 32 and the memory films 50. An isotropic etchant can be supplied into the backside trench 79 during the isotropic etch process. In an illustrative example, if the sacrificial material strips 42 include silicon nitride, a wet etch process employing hot phosphoric acid can be performed to remove the sacrificial material strips 42. The backside recesses 43 laterally extend along the first horizontal direction hd1. A pair of memory films 50 can be physically exposed to each backside recess 43.

Referring to FIGS. 14A-14E, an optional backside blocking dielectric layer 44 can be deposited on the physically exposed surfaces around the backside recesses 43 and the backside trench 79. The backside blocking dielectric layer 44 may comprise a dielectric metal oxide material such as aluminum oxide, hafnium oxide, lanthanum oxide, yttrium oxide, tantalum oxide, any other dielectric transition metal oxide, or an alloy or a layer stack thereof. The thickness of the backside blocking dielectric layer 44 may be in a range from 2 nm to 20 nm, such as from 3 nm to 10 nm, although lesser and greater thicknesses may also be employed.

At least one conductive material can be deposited in the backside recesses 43. The at least one conductive material can be conformally deposited employing a precursor gas that is supplied into the backside recesses 43 through the backside trench 79. For example, a metallic barrier layer can be deposited in the backside recesses 43 directly on the physically exposed surfaces of the blocking dielectric layers 52. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC. TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

A metal fill material is deposited in remaining volumes of backside recesses 43, on the sidewalls of the backside trench 79, and over the topmost insulating strips 32T to form a metallic fill material portion. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material portion can consist essentially of at least one elemental metal. The at least one elemental metal of the metallic fill material portion can be selected, for example, from tungsten, cobalt, molybdenum, ruthenium, titanium, or tantalum. In one embodiment, the metallic fill material portion can consist essentially of a single elemental metal. In one embodiment, the metallic fill material portion comprises tungsten deposited using a fluorine-containing precursor gas such as $WF_6$. In one embodiment, the metallic fill material portion can be a tungsten layer including a residual level of fluorine atoms as impurities.

A plurality of electrically conductive strips 46 can be formed in the plurality of backside recesses 43, and a continuous metallic material layer (not shown) can be formed on the sidewalls of the backside trench 79 and over the topmost insulating strips 32T. The continuous metallic material layer is etched back from the sidewalls of the backside trench 79 and from above the topmost insulating strips 32T, for example, by an isotropic wet etch, an anisotropic dry etch, or a combination thereof. Portions of the backside blocking dielectric layer 44 formed within the backside trench 79 or above the second horizontal plane HP2 can be removed by performing an etch process.

Each remaining portion of the deposited metallic material in the backside recesses 43 constitutes an electrically conductive strip 46. Each electrically conductive strip 46 can be a word line (e.g., control gate electrodes of charge storage transistors). Thus, the sacrificial material strips 42 are replaced with the electrically conductive strips 46 after formation of the semiconductor channels 60. Vertically-alternating stacks of insulating strips 32 and electrically conductive strips 46 are formed over the substrate 8. The vertically-alternating stacks (32, 46) can be laterally spaced apart from each other by the line trenches 31L. Each electrically conductive strip 46 includes a portion of the metallic barrier layer and a metallic fill material portion that are located between a vertically neighboring pair of dielectric material strips, such as a pair of insulating strips 32, and between a laterally neighboring pair of memory films 50 located within a respective line trench 31L.

Each electrically conductive strip 46 can function as a combination of a plurality of transistor gate electrodes (e.g., control gate electrodes) located at a same level and a word line electrically interconnecting, i.e., electrically shorting, the plurality of gate electrodes located at the same level. The plurality of gate electrodes within each electrically conductive strip 46 are the gate electrodes for the charge storage field effect transistors in a NOR configuration. In other words, each electrically conductive strip 46 can be a word line that functions as a common gate electrode for a plurality of transistors.

Generally, the sacrificial material strips 42 can be replaced with the electrically conductive strips 46. Vertically-alternating stacks (32, 46) of insulating strips 32 and electrically conductive strips 46 can be formed over the substrate 8. The vertically-alternating stacks (32, 46) can be laterally spaced apart from each other by the line trenches 31T, which are filled with a respective laterally-alternating sequences (60, 64) of semiconductor channels 60 and source/drain pillar structures 64. In one embodiment, each of the electrically conductive strips 46 is laterally spaced from a respective most proximal one of the memory films 50 by a respective backside blocking dielectric layer 44, and is laterally spaced from a respective overlying insulating strip 32 and a respective underlying insulating strip 32 by the respective backside blocking dielectric layer 44.

While an embodiment is described in which the spacer material layers are formed as sacrificial material layers 42L, embodiments are expressly contemplated herein in which the spacer material layers are formed as electrically conducive layers, and are divided into electrically conductive strips 46. In one embodiment, division of a vertically alternating sequence into multiple alternating stacks of insulating strips 32 and electrically conductive strips 46 can occur upon formation of the line trenches 31L.

A semiconductor channel 60, portions of a pair of source/drain pillar structures 64 contacting the semiconductor channel 60, portions of memory films 50 that are adjacent to the semiconductor channel 60, and portions of the electrically conductive strips 46 that are laterally spaced from the semiconductor channel 60 by the portions of the memory films 50 constitute a NOR memory cell.

Referring to FIGS. 15A-15E, a dielectric fill material such as silicon oxide can be deposited in the backside trench 79 to form a dielectric backside trench fill structure 76. In one embodiment, the dielectric backside trench fill structure 76 can fill the entire volume of the backside trench 79. The horizontal portion of the dielectric fill material that is deposited above the horizontal plane including the top surfaces of the topmost insulating strips 32T form a dielectric material layer, which is herein referred to as a second via-level dielectric layer 80.

Electrically conductive second source/drain connection via structures 84 can be formed through the second via-level dielectric layer 80 on a top surface of a respective one of the source/drain pillar structures 64. Each source/drain pillar structure 64 that is not contacted by a respective first source/drain connection via structure 24 can be contacted by a respective second source/drain connection via structure 84. Generally, rows of first (e.g., bottom) source/drain connection via structures 24 and rows of second (e.g., top) source/drain connection via structures 84 can alternate along the first horizontal direction hd1. The source/drain pillar structures 64 may be arranged as multiple rows of source/drain pillar structures 64 such that each row of source/drain pillar structures 64 is arranged along the second horizontal direction hd2 and the multiple rows are laterally spaced apart among one another along the first horizontal direction hd1. Upon numbering of the multiple rows with positive integers beginning with 1, each odd-numbered row of source/drain pillar structures 64 may be contacted by first source/drain connection via structures 24 and each even-numbered row of source/drain pillar structures 64 may be contacted by second source/drain connection via structures 84. Alternatively, each even-numbered row of source/drain pillar structures 64 may be contacted by first source/drain connection via structures 24 and each odd-numbered rows of source/drain pillar structures 64 may be contacted by second source/drain connection via structures 84. Each source/drain pillar structure 64 may be contacted by one of the first source/drain connection via structures 24 or one of the second source/drain connection via structures 84.

Referring to FIGS. 16A-16E, a second line-level dielectric layer 90 may be deposited over the second via-level dielectric layer 80. Second bit lines 82 can be formed in the second line-level dielectric layer 90 on a respective subset of the second source/drain connection via structures 84. In one embodiment, the second bit lines 82 can laterally extend along the first horizontal direction hd1. In one embodiment, each second bit line 82 can contact a second source/drain connection vis structure 82 within each row of source/drain connection via structures 82 arranged along the second horizontal direction hd2.

Referring collectively to FIGS. 1A-16E a semiconductor structure comprises: vertically-alternating stacks (32, 46) of insulating strips 32 and electrically conductive strips 46 laterally spaced apart from each other by line trenches 31T; laterally-alternating sequences (60, 64) of semiconductor channels 60 and source/drain pillar structures 64 located within a respective one of the line trenches 31T; and memory films 50 located between each neighboring pair of the vertically-alternating stacks (32, 46) and the laterally-alternating sequences (60, 64), wherein each of a plurality of the source/drain pillar structures 64 is in direct contact with a respective pair of vertical semiconductor channels 60. In one embodiment each of the non-edge source/drain pillar structures 64 is in direct contact with a respective pair of vertical semiconductor channels 60. The edge source/drain pillar structures 64 located at the ends of the line trenches 31T may contact only one vertical semiconductor channel 60.

In one embodiment, each of the semiconductor channels 60 vertically extends from a first horizontal plane HP1 including bottommost surfaces of the vertically-alternating stacks (32, 46) to a second horizontal plane HP2 including topmost surfaces of the vertically-alternating stacks (32, 46). In one embodiment, the line trenches 31T laterally extend along a second horizontal direction hd2 and have a respective uniform width along the first horizontal direction hd1 that is perpendicular to the second horizontal direction hd2. In one embodiment, each of the semiconductor channels 60 comprises: a respective pair of first outer sidewalls that are parallel to the first horizontal direction hd1; and a respective pair of second outer sidewalls that are parallel to the second horizontal direction hd2. In one embodiment, each of the first outer sidewalls contacts a respective one of the source/drain pillar structures 64, and each of the second outer sidewalls contacts a respective one of the memory films 50.

In one embodiment, the source/drain pillar structures 64 vertically extend from a first horizontal plane HP1 including bottommost surfaces of the vertically-alternating stacks (32, 46) to a second horizontal plane HP2 including topmost surfaces of the vertically-alternating stacks (32, 46). In one embodiment, interfaces between the semiconductor channels 60 and the source/drain pillar structures 64 are located within a respective planar vertical plane that is perpendicular to the first horizontal plane HP1. In one embodiment, each of the semiconductor channels 60 laterally surrounds a respective dielectric core having a top surface located within a horizontal plane including topmost surfaces of the semiconductor channels 60.

In one embodiment, the semiconductor structure further comprises first source/drain connection via structures 24 located below a first subset of the source/drain pillar structures 64. Each of the first source/drain connection 24 via structures is in contact with a bottom horizontal surface of a respective one of the first subset of the source/drain pillar structures 64. The semiconductor structure further comprises second source/drain connection via structures 84 located above a second subset of the source/drain pillar structures 64. Each of the second source/drain connection via structures 84 is in contact with a top horizontal surface of a respective one of the second subset of the source/drain pillar structures 64. The semiconductor structure further comprises an array of semiconductor channel contact via structures 28. Each of the semiconductor channel contact via structures 28 is in contact with a respective one of the semiconductor channels 60. The semiconductor structure further comprises first bit lines 22 contacting a bottom surface of the first source/drain connection via structures 24 and laterally extending along a first horizontal direction hd1 that is perpendicular to a lengthwise second direction horizontal direction hd2 of the line trenches 31T, and second bit lines 82 contacting a top surface of the second source/drain connection via structures 82 and laterally extending along the first horizontal direction hd1 that is perpendicular to the lengthwise second direction hd2 horizontal direction of the line trenches 31T.

In one embodiment, each of the memory films 50 comprises a layer stack including, from one side to another, a tunneling dielectric layer 56, a charge storage layer 54, and a blocking dielectric layer 52. In one embodiment, the of the electrically conductive strips 46 is laterally spaced from a respective most proximal one of the memory films 50 by a respective backside blocking dielectric layer 44, and is laterally spaced from a respective overlying insulating strip 32 and a respective underlying insulating strip 32 by the respective backside blocking dielectric layer 44.

Vertically-alternating stacks (32, 46) of insulating strips 32 and electrically conductive strips 46 can be laterally spaced from each other by line trenches 31T. Laterally-alternating sequences (60, 64) of semiconductor channels 60 and source/drain pillar structures 64 can be located within a respective one of the line trenches 31T. Charge storage field effect transistors in which the source/drain pillar structures (i.e., source and drain regions) 64 are accessed (e.g., connected from below) by the first bit lines 22 are herein referred to as first field effect transistors, and charge storage field effect transistors in which the source/drain pillar structures (i.e., source and drain regions) 64 are accessed (e.g., connected from above) by the second bit lines 82 are herein referred to a second field effect transistors. The set of all first transistors including a respective row of source/drain pillar structures 64 located within a respective line trench 31T constitutes a first field effect transistor string. The set of all second field effect transistors including a respective row of source/drain pillar structures 64 located within a respective line trench 31T constitutes a second field effect transistor string.

Figure 17:
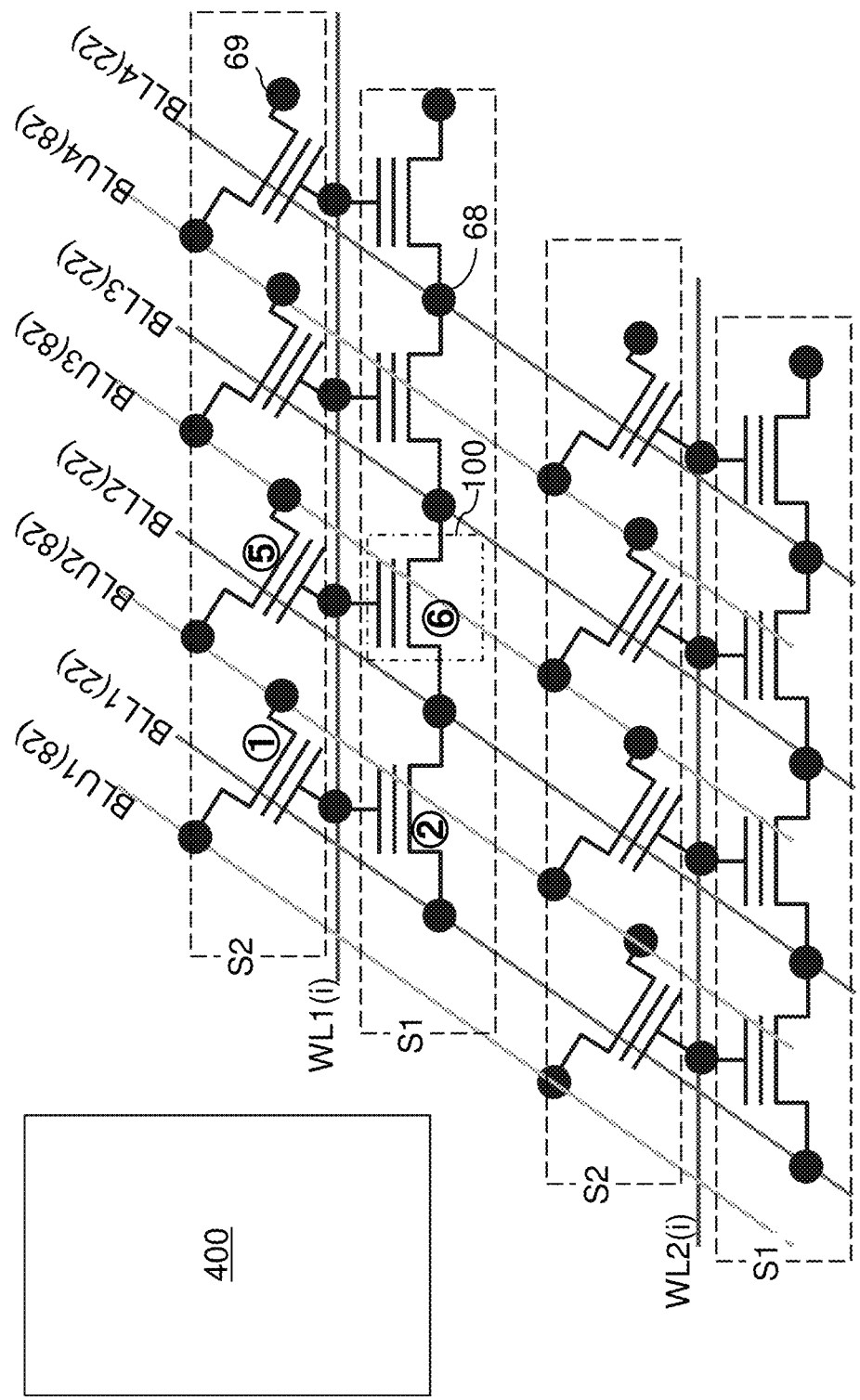
FIG. 17 is a circuit diagram of a NOR memory device including instances of the first exemplary structure in a single-bit-per-cell operational mode according to the first embodiment of the present disclosure.

FIG. 17 illustrates a circuit diagram of a NOR memory device including instances of the first exemplary structure in a single-bit-per-cell operational mode according to the first embodiment of the present disclosure. Generally, the NOR memory device illustrated in FIG. 17 may comprise vertically-alternating stacks (32, 46) of insulating strips 32 and electrically conductive strips 46 that are laterally spaced apart from each other by line trenches 31T; laterally-alternating sequences (60, 64) of semiconductor channels 60 and source/drain pillar structures 64 located within a respective one of the line trenches 31T; and a three-dimensional array of memory elements. Each of the memory elements is located between a respective one of the semiconductor channels 60 and a respective one of the electrically conductive strips 46 and comprises a portion of a memory film 50 (e.g., portion of the charge storage layer 54). Generally, the vertically-alternating stacks (32, 46) can be numbered with positive integers beginning with 1 along the first horizontal direction hd1. An i-th vertically alternating stack (32, 46) comprises a vertically alternating sequence of insulating strips 32 and electrically conductive strips 46. The electrically conductive strips 46 within the i-th vertically alternating stack (32, 46) comprise a plurality of word lines WLk(i), which may be numbered with non-negative integers k, for example, from bottom to top. In the illustrated example, two word lines WL1(i) and WL2(i) are illustrated. A peripheral circuitry 400 may be provided below, in and/or on the first exemplary structure to provide control signals for programming, reading, and erasing each memory cell within the first exemplary structure.

In one embodiment, each memory cell 100 comprises a charge storage transistor (e.g., one of transistors 1, 2, 5 or 6 in FIG. 17) which includes a control gate electrode (comprising a portion of one electrically conductive strip 46) which is a portion of the word line (e.g. WL1), a semiconductor channel 60 contacting a pair of source/drain pillar structures 64, a memory film 50 located between the semiconductor channel 60 and the control gate electrode (comprising a portion of the adjacent electrically conductive strip 46). Two adjacent memory cells 100 (e.g., transistors 1 and 5, or transistors 2 and 6) share a common source/drain pillar structure 64, which is electrically connected to a common bit line (22 or 82). Plural adjacent memory cells 100 (e.g., transistors 1, 2, 5 and 6) also share the same word line (e.g., WL1). Therefore, the NOR memory device of the first embodiment is more compact that prior art NOR memory devices in which adjacent memory cells do not share a common source/drain pillar structure 64 because the prior art NOR memory devices require space for separate bit lines (22, 82) and source/drain pillar structures 64 for each memory cell.

Referring to the above described FIG. 17 as well as to FIG. 42 which will be described below, a three-dimensional memory device comprises first vertical stacks of first field effect transistor strings S1, and second vertical stacks of second field effect transistor strings S2. The first vertical stacks alternate with the second vertical stacks along a first horizontal direction.

Each of the first field effect transistor strings S1 comprises a series connection of a respective set of first field effect transistors (100 or 200) that are electrically connected to each other such that each neighboring pair of first field effect transistors share a respective one of a plurality of first source/drain regions 68. Each of the second field effect transistor strings S2 comprises a series connection of a respective set of second field effect transistors (100 or 200) that are electrically connected to each other such that each neighboring pair of second field effect transistors share a respective one of the second source/drain regions 69. The series connection of the respective set of first field effect transistors (100 or 200) shares a respective one (e.g., WL1(i)) of a plurality of word lines 46. The first source/drain regions 68 are located in different vertical levels in respective first source/drain pillar structures (64 or 61). The second source/drain regions 69 are located in different vertical levels in respective second source/drain pillar structures (64 or 61).

In FIG. 17, the first field effect transistors 100 are labeled with even numbers in circles, and the second field effect transistors 100 are labeled with odd numbers in circles.

In the first embodiment, a neighboring pair of one of the first field effect transistor strings S1 and one of the second field effect transistor strings S2 shares the respective one (e.g., WL1(i)) of the plurality of word lines 46. The source/drain regions 68 of each first field effect transistor 100 in the first field effect transistor strings S1 can be accessed by a respective first (e.g., lower) bit line 22, which is shown as BLLp in FIG. 17. The index p is a positive integer such as 1, 2, 3, 4, etc. Source/drain regions 69 of each second field effect transistor 100 in the second field effect transistor strings S2 can be accessed by a respective second (e.g., upper) bit line 82, which is shown as BLUq in FIG. 17. The index q is a positive integer such as 1, 2, 3, 4, etc. Thus, each second source/drain pillar structure 64 within a second field effect transistor string comprises a vertical stack of second source/drain regions 69 that are electrically connected to each other.

In the first embodiment, the three-dimensional memory device comprises first bit lines 22 located below the first source/drain source drain pillar structures 64; and second bit lines 82 located above the second source/drain pillar structures 64. The word lines (e.g., the electrically conductive strips 46) are laterally spaced apart along the first horizontal direction hd1.

In various embodiments, each of the first field effect transistor strings S1 comprises a respective first memory film 50 that continuously extends through and is shared by a respective series connection of first field effect transistors (100 or 200); and each of the second field effect transistor strings S2 comprises a respective second memory film 50 that continuously extends through and is shared by a respective series connection of second field effect transistors (100 or 200).

Figure 18:
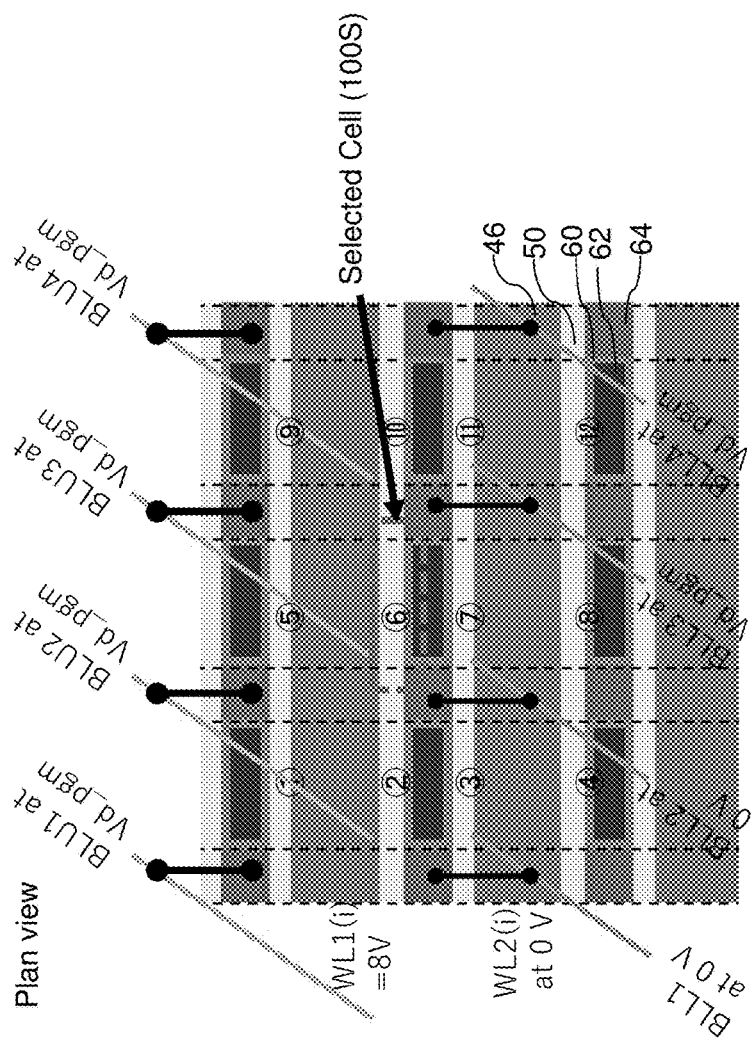
FIG. 18 is a schematic diagram of the NOR memory device with bias voltages during a programming operation.
Figure 19:
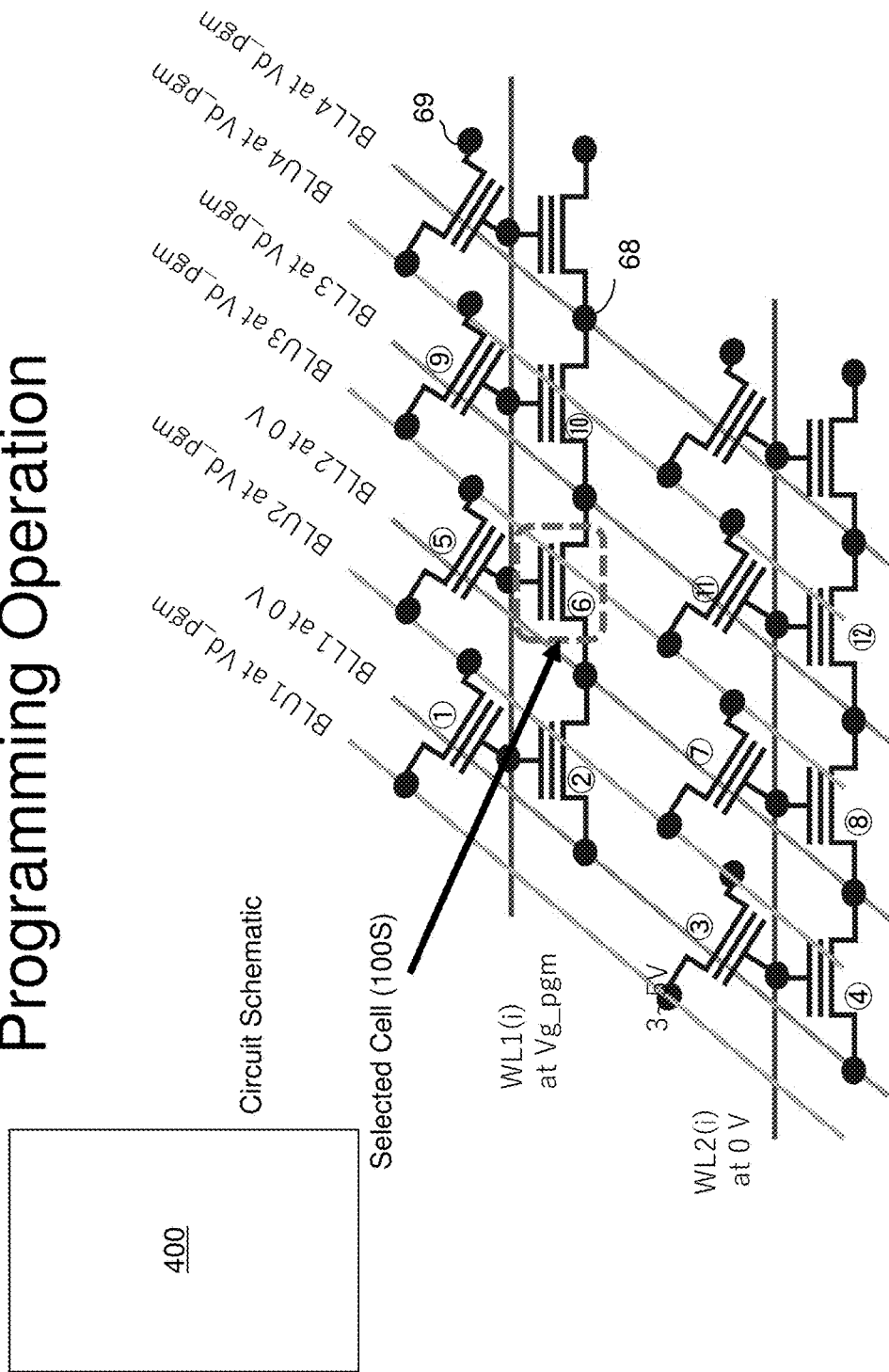
FIG. 19 is a circuit diagram of the NOR memory device of FIG. 18.

Referring to FIGS. 18 and 19, a method of programming a selected memory cell 100S within a selected first field effect transistor 6 is illustrated. The selected memory cell 100S can be programmed by applying a gate programming bias voltage (Vg_pgm) of between 6 and 10V, such as 8V, to a word line WL1(i) of the selected memory cell 100S, by applying a programming voltage differential (e.g., 3 to 5V) between the two first bit lines 22 connected to the source/drain pillar structures 64 of the selected memory cell 100S, and by applying 0 V to unselected word lines The programming voltage differential may be provided by applying 0 V to one of the first bit lines 22 electrically connected to a source/drain pillar structure 64 (herein referred to as a source-side source/drain pillar structure 64) of the selected memory cell 100S, and applying a drain-side programming bias voltage (Vd_pgm) to another source/drain pillar structure 64 (herein referred to as a drain-side source/drain pillar structure 64) of the selected memory cell 100S. All first bit lines 22 located on the side of the source-side source/drain pillar structure 64 can be biased at 0 V. All first bit lines 22 located on the side of the drain-side source/drain pillar structure 64 can be biased at the drain-side programming bias voltage (Vd_pgm). All second bit lines 82 can be biased at the drain-side programming bias voltage (Vd_pgm) to prevent programing of any unselected memory cell located within the second field effect transistors. The drain-side programming bias voltage Vd_pgm may be lower than the gate programming bias voltage Vg_pgm, and may have a magnitude of 3 to 5V. If a memory cell within a second field effect transistor is selected, a similar programming method can be employed to program the selected memory cell.

Generally, a method of operating the three-dimensional memory device of various embodiments includes applying 0V to a first source/drain region 68 located on a first side of a semiconductor channel 60 of a selected first field effect transistor 6; applying a drain-side programming bias voltage Vd_pgm to another first source/drain region 68 located on a second side of the semiconductor channel 60 of the selected first field effect transistor 6; and applying a gate programming bias voltage Vg_pgm to a first word line WL1(*i*) of the selected first field effect transistor 6 to program the selected first field effect transistor 6.

To program the three-dimensional memory device of the first embodiment shown in FIGS. 18 and 19 by channel hot electron injection, the programming method includes applying 0V to each first source/drain region 68 within the first field effect transistor string S1 that is located on the first side (e.g., source-side) of the semiconductor channel 60 of the selected first field effect transistor 6; and applying the drain-side programming bias voltage Vd_pgm to each first source/drain region 68 within the first field effect transistor string S1 that is located on the second side (e.g., the drain-side) of the semiconductor channel 60 of the selected first field effect transistor 6. The method also includes applying the drain-side programming bias voltage Vd_pgm to each of the second source/drain regions 69 during programming of the selected first field effect transistor 6; and applying 0V to all of the plurality of word lines (e.g., WL2(*i*)) other than the first word line (WL1(*i*)) during the programming of the selected first field effect transistor 6.

Figure 20:
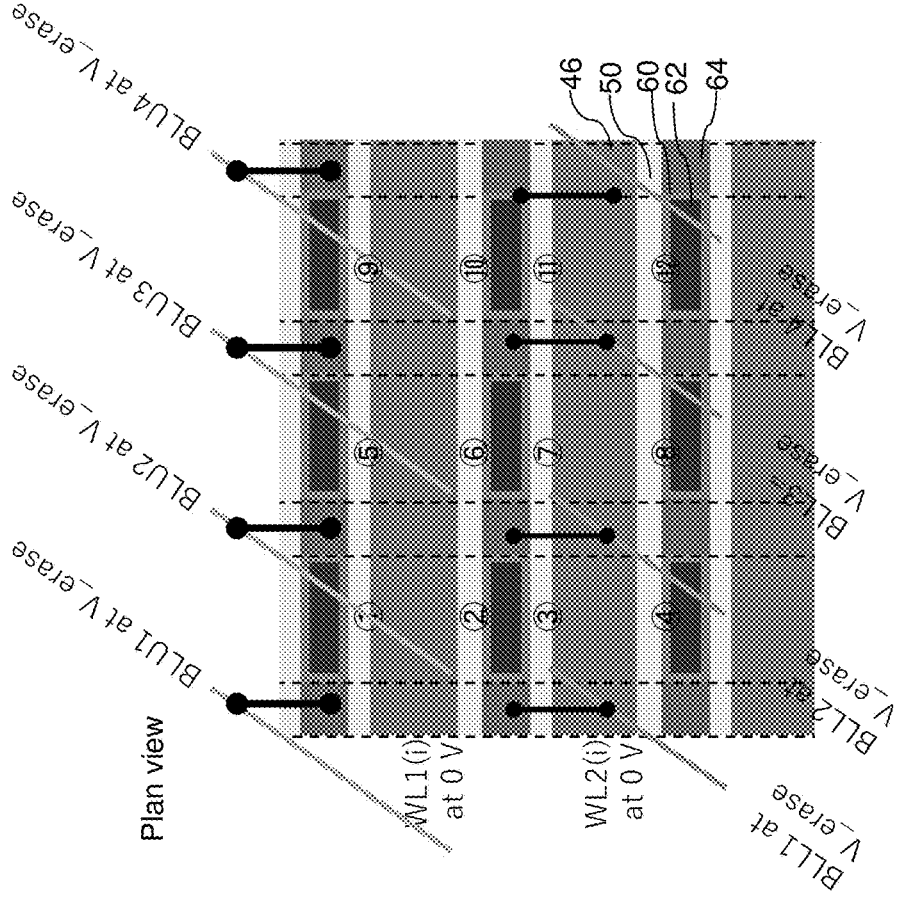
FIG. 20 is a schematic diagram of the NOR memory device with bias voltages during an erase operation.
Figure 21:
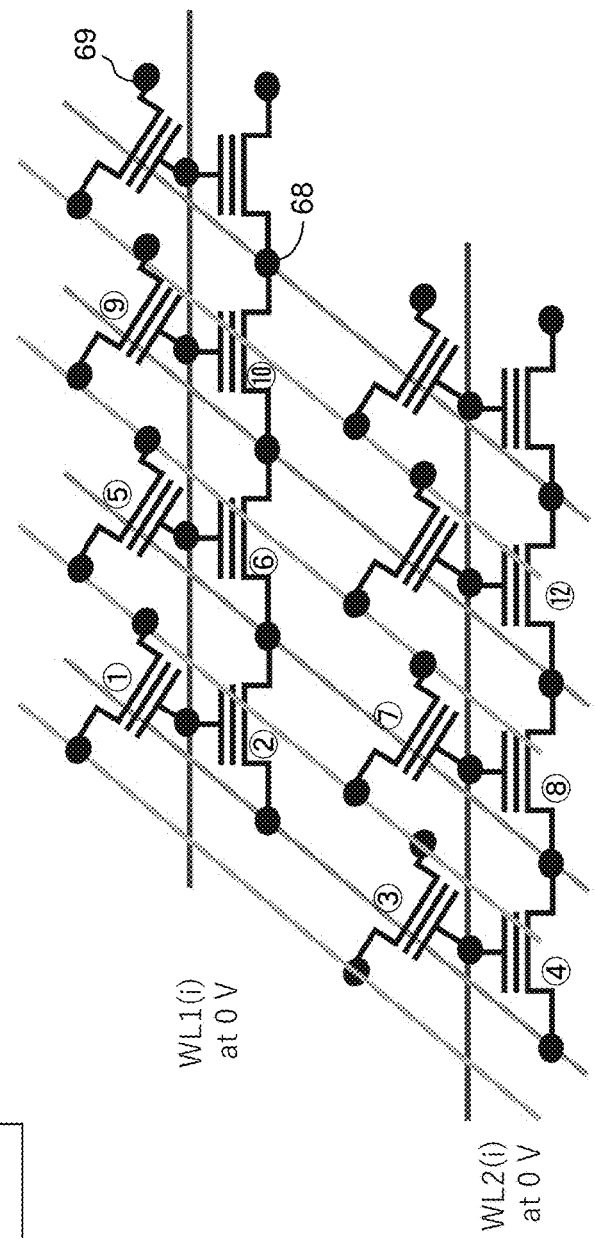
FIG. 21 is a circuit diagram of the NOR memory device of FIG. 20.

Referring to FIGS. 20 and 21, the entire memory block in the three-dimensional memory device of the first embodiment may be erased by applying an erase bias voltage V_erase (which may be in a range from −15 V to −25 V, such as −20 V) to each of the first bit lines 22 and the second bit lines 82, and by applying 0 V to all word lines WLk(i).

Generally, the three-dimensional memory device of the first embodiment may be erased by applying an erase bias voltage to the first and the second source/drain regions (68, 69); and applying 0V each of the plurality of word lines 46 (e.g., WLk(i)).

Figure 22:
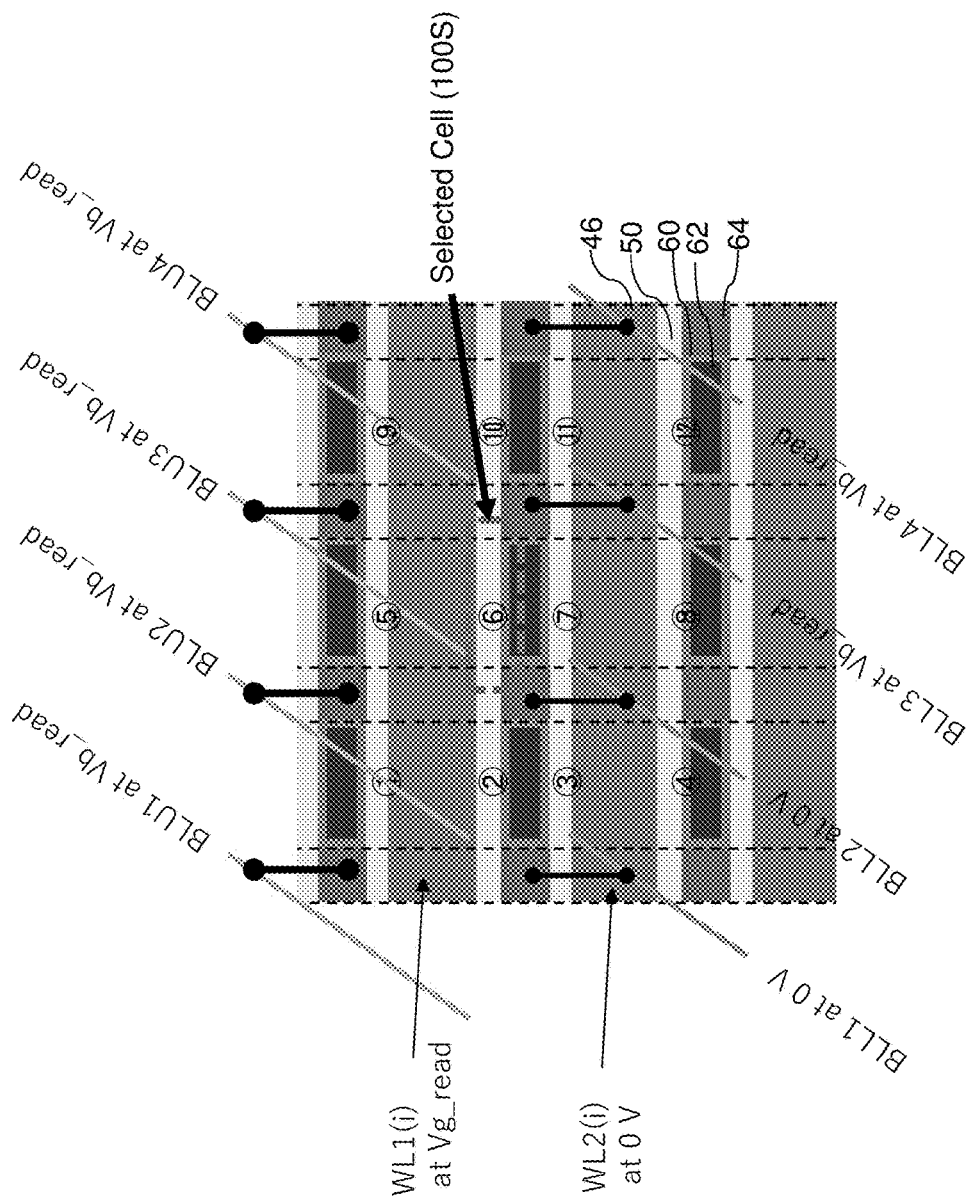
FIG. 22 is a schematic diagram of the NOR memory device with bias voltages during a read operation.
Figure 23:
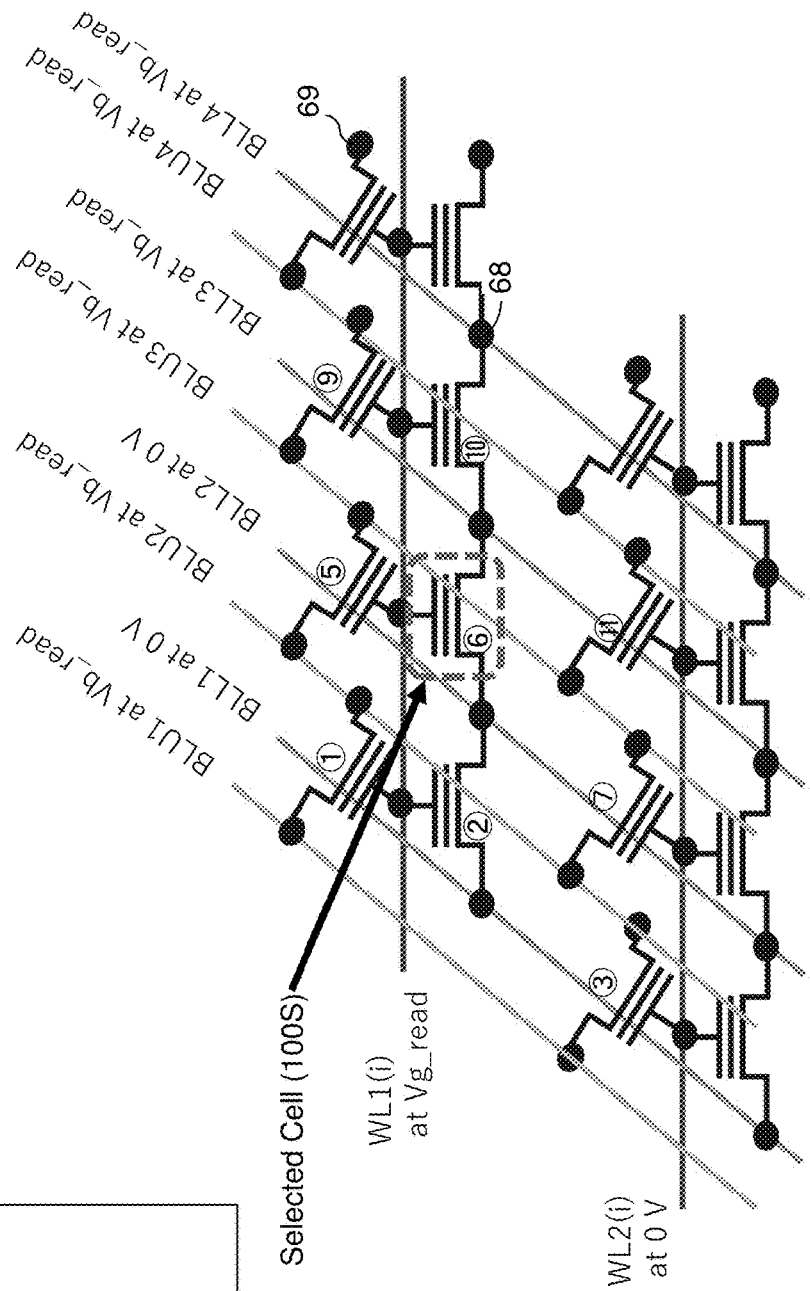
FIG. 23 is a circuit diagram of the NOR memory device of FIG. 22.

Referring to FIGS. 22 and 23, a method of reading a selected memory cell 100S within the selected first field effect transistor 6 of the first embodiment is illustrated. In one embodiment, the selected memory cell 100S may be read by applying a gate read bias voltage (Vg_read) (e.g., 6 to 10V, such as 8V) to the selected word line WL1(*i*) of the selected memory cell 100S, and by applying a read voltage differential between the two first bit lines 22 connected to the source/drain pillar structures 64 of the selected memory cell 100S. Bit lines (22, 82) that are not connected to the source/drain pillar structures 64 of the selected memory cell 100S can be electrically biased such that no voltage differential is present between neighboring pairs of first bit lines 22 and between neighboring pairs of second bit lines 82. The read voltage differential may be provided by applying 0 V to one of the first bit lines 22 electrically connected to the source-side source/drain pillar structure 64 of the selected memory cell 100S, and applying a bit line read bias voltage (Vb_read) (which may be in a range from 1 to 1.5V) to the drain-side source/drain pillar structure 64) of the selected memory cell 100S.

Generally, the selected memory cell 100S within the selected first field effect transistor 6 of the first embodiment may be read by applying 0V to each first source/drain region 68 within the first field effect transistor string S1 that is located on the first (e.g., source) side of the semiconductor channel 60 of the selected first field effect transistor 6; applying the bit line read bias voltage Vb_read to each first source/drain region 68 within the first field effect transistor string S1 that is located on the second (e.g., drain) side of the semiconductor channel 60 of the selected first field effect transistor 6; and applying a gate read bias voltage (Vg_read) to the first word line WL1(*i*) of the selected first field effect transistor 6 to read the selected first field effect transistor.

Figure 24:
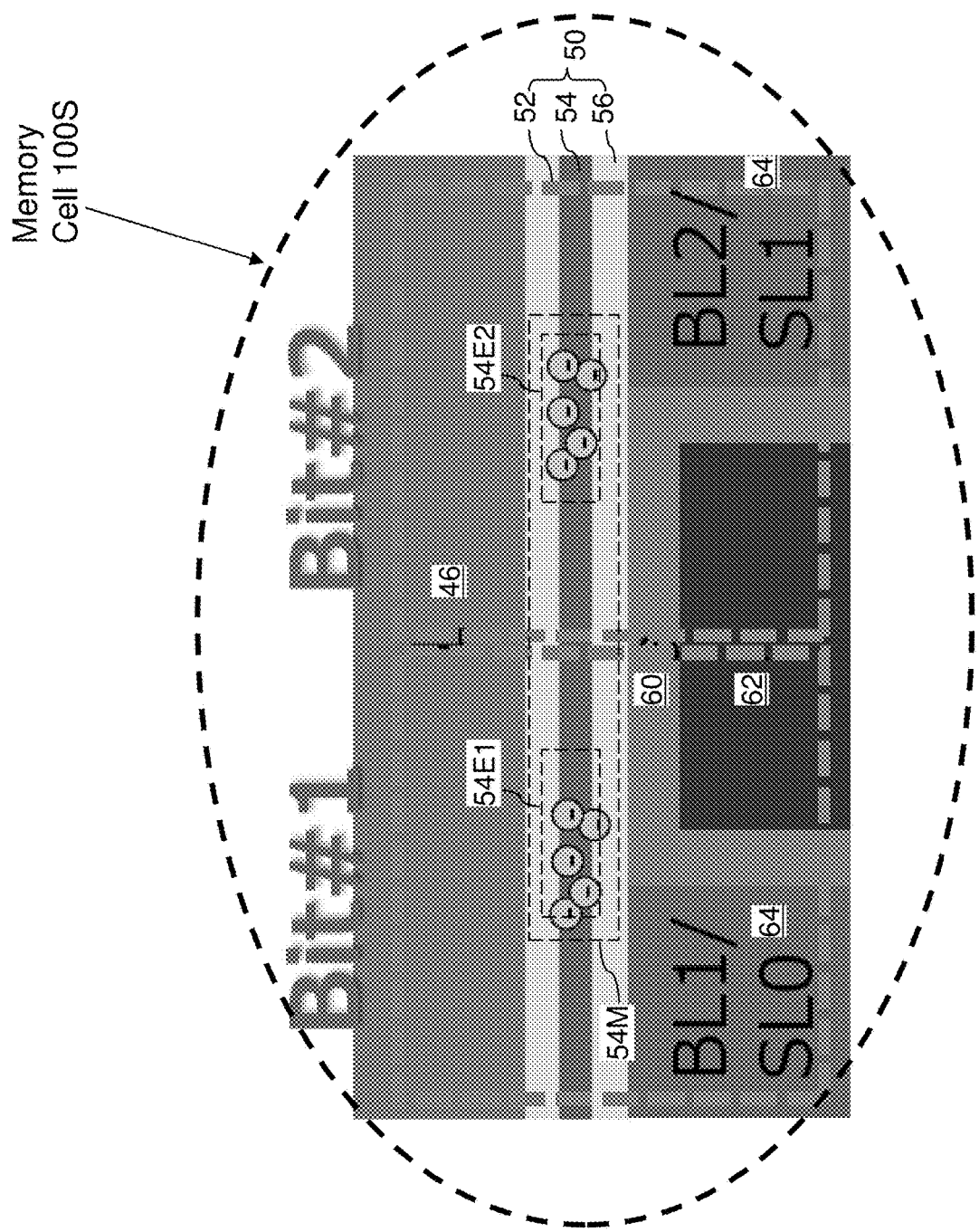
FIG. 24 is a magnified view of a NOR memory cell during operation in a dual-bit-per-cell operational mode.

Referring to FIG. 24, a magnified view of a NOR memory cell 100S of the first embodiment is illustrated during operation in a dual-bit-per-cell operational mode. In this case, each of the field effect transistors (e.g., transistors 1 to 9, such as the selected transistor 6) in the first exemplary structure may include a multi-bit memory element 54M that contains a respective pair of charge storage material portions (54E1, 54E2).

According to an aspect of the present disclosure, each NOR memory cell may be operated in a dual-bit-per-cell operational mode such that each portion of a charge storage layer 54 of the memory film 50 that is proximal to an interface between a source/drain pillar structures 64 and a semiconductor channel 60 may be employed as an independent charge storage element 54E1 or 54E2. Thus, electrical charges (e.g., electrons) representing a "1" value for a first bit (bit #1) may be stored in a first portion 54E1 of a charge storage layer 54 adjacent to a first source/drain pillar structure 64 (e.g., SL0) that is electrically connected to a bit line (e.g., BL1), while separate electrical charges representing a "1" value for a second bit (bit #2) may be stored in a second portion 54E2 of the charge storage layer 54 adjacent to a second source/drain pillar structure 64 (e.g., SL1) that is electrically connected to another bit line (e.g., BL2). Absence of electrical charges in each of the charge storage material portions (54E1, 54E2) represents a "0" value for a respective bit.

Since each semiconductor channel 60 contacts two different memory films 50 of two different memory cells (i.e., of two different charge storage transistors 100), four data bits may be stored in the two memory films 50 which contact the single semiconductor channel 60. This increases the device density. In contrast, prior art NOR memory cells often store only one data bit per cell.

Figure 25:
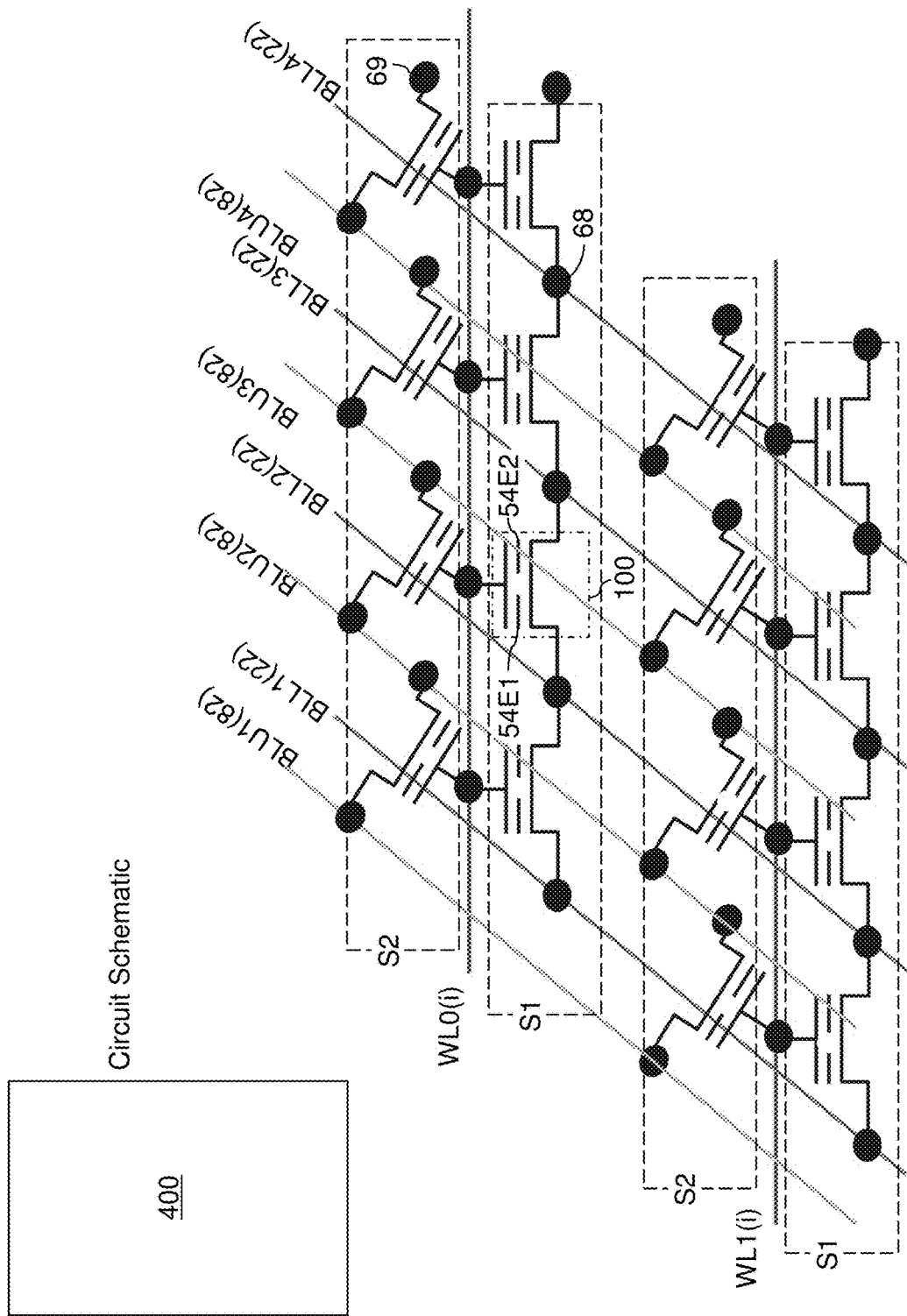
FIG. 25 is a circuit diagram of a NOR memory device including instances of the first exemplary structure in a dual-bit-per-cell operational mode according to the first embodiment of the present disclosure.

Referring to FIG. 25, a circuit diagram of a NOR memory device of the first embodiment is illustrated in a dual-bit-per-cell operational mode. Each charge storage transistor 100 includes multi-bit memory element 54M that contains a respective pair of charge storage material portions (54E1, 54E2).

Figure 26:
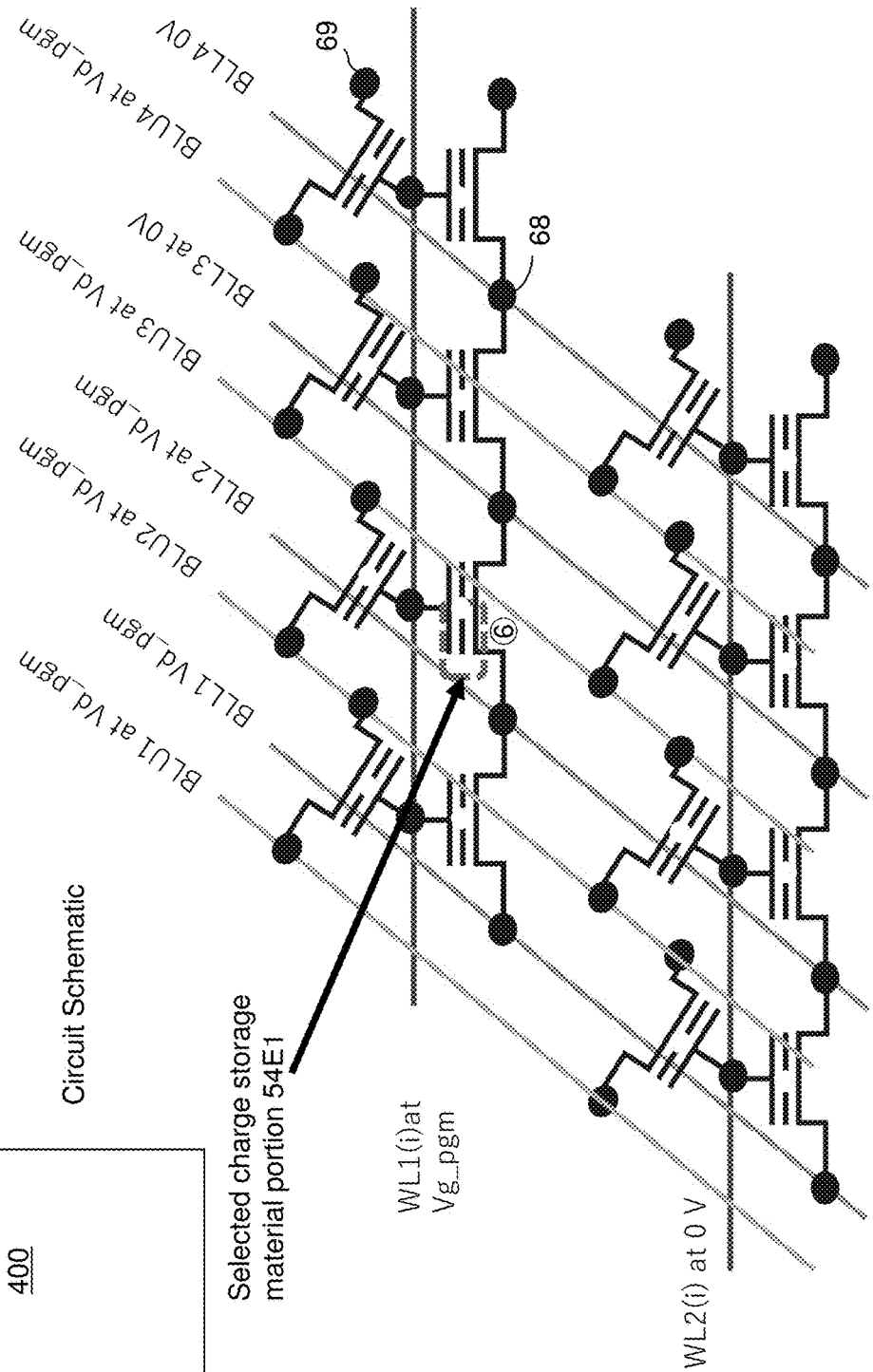
FIG. 26 is a circuit diagram of the NOR memory device with bias voltages during a programming operation for programming an A-cell.
Figure 27:
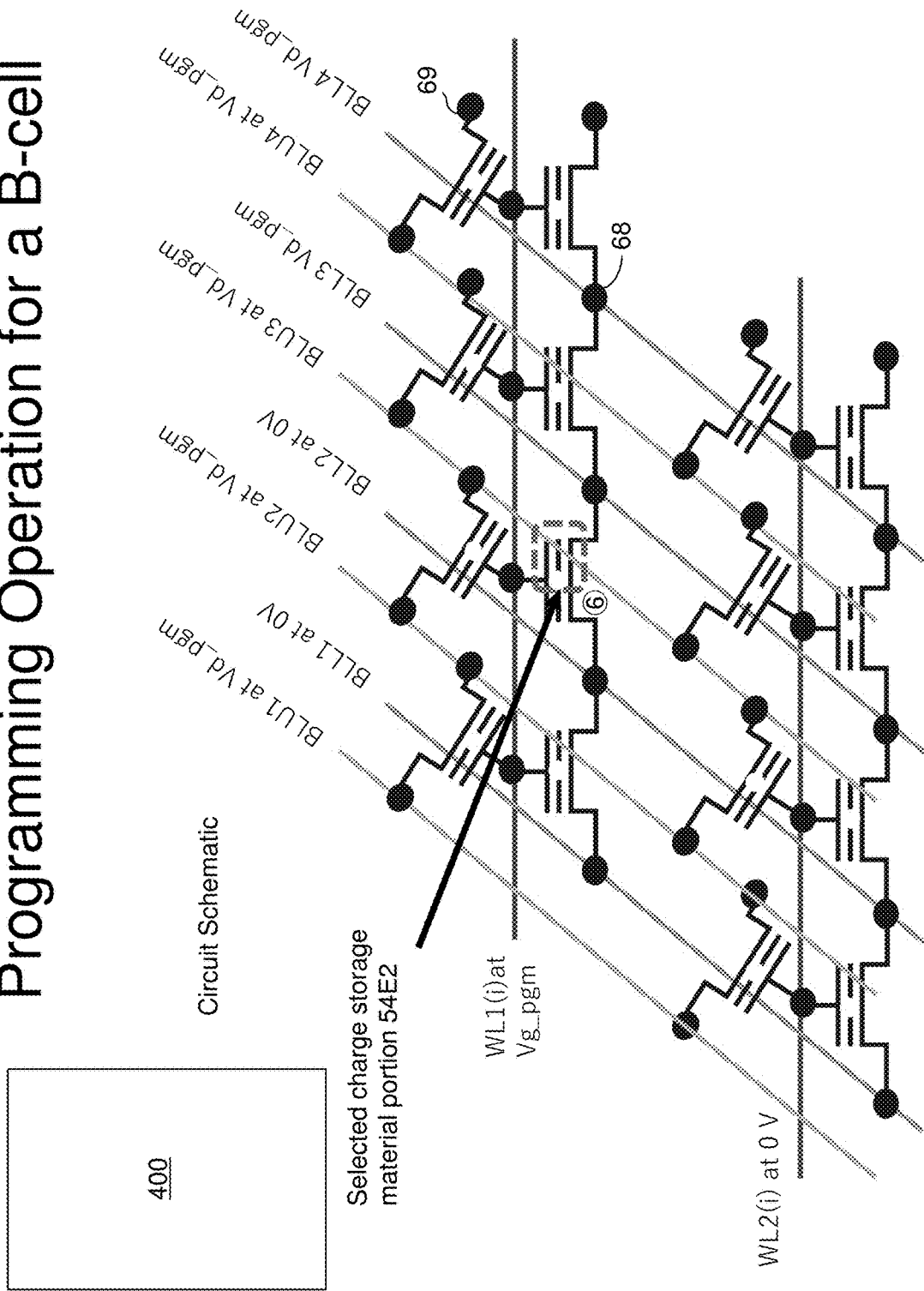
FIG. 27 is a circuit diagram of the NOR memory device with bias voltages during a programming operation for programming a B-cell.

Referring to FIGS. 26 and 27, an exemplary circuit of the first embodiment of the present disclosure is illustrated during a programming operation in a dual-bit-per-cell operational mode. FIG. 26 represents an electrical biasing scheme for programming a first charge storage material portion 54E1 in a selected first field effect transistor 6, and FIG. 27 represents an electrical biasing scheme for programming a second charge storage material portion 54E2 in the selected first field effect transistor 6. The selected charge storage material portion 54E1 or 54E2 can be programmed by applying a gate programming bias voltage (Vg_pgm) of between 6 and 10V, such as 8V, to a word line WL1(*i*) of the selected charge storage material portion 54E, by applying a programming voltage differential between the two first bit lines 22 connected to the source/drain pillar structures 64 of the selected charge storage material portion 54E1 or 54E2, and by applying 0 V to unselected word lines 46.

To program the "A" cell (i.e., the first data bit) as shown in FIG. 26, the source/drain pillar structures 64 that is adjacent to the selected charge storage material portion 54E1 can be biased at Vd_pgm to induce charge tunneling into the selected charge storage material portion 54E1. The programming voltage differential may be provided by applying 0 V to one of the first bit lines 22 electrically connected to a source/drain pillar structure 64 located adjacent to the unselected charge storage material portion 54E2 of the selected memory cell 100S, and applying the drain-side programming bias voltage (Vd_pgm) to first bit lines 22 electrically connected to another source/drain pillar structure 64 located adjacent to the selected charge storage material portion 54E1 of the selected memory cell 100S. All first bit lines 22 located on the unselected charge storage material portion side 54E2 can be biased at 0 V. All first bit lines 22 located on the selected charge storage material portion side 54E1 can be biased at the drain-side programming bias voltage (Vd_pgm). All second bit lines 82 can be biased at the drain-side programming bias voltage (Vd_pgm). The drain-side programming bias voltage Vd_pgm may be lower than the gate programming bias voltage Vg_pgm, and may have a magnitude of 3 to 5V.

To program the "B" cell (i.e., the second data bit) as shown in FIG. 27, the selected charge storage material portion side 54E2 and the unselected charge storage material portion side 54E1 are reversed, and thus, the application of Vd_pgm and 0V to bit lines 22 located on opposite sides of the selected charge storage transistor 6 are also reversed. If a memory cell within a second field effect transistor is selected, a similar programming method can be employed to program the selected memory cell.

In general, the selected first field effect transistor 6 comprises a first charge storage material portion 54E1 located adjacent to the first (e.g., left) side of the semiconductor channel 60, and a second charge storage material portion 54E2 located adjacent to the second (e.g., right) of the semiconductor channel 60. Referring to FIG. 27, the second charge storage material portion 54E2 corresponding to a second data bit is programmed during the programming of the selected first field effect transistor 6 without programming the first charge storage material portion 54E1 corresponding to a first data bit.

Figure 28:
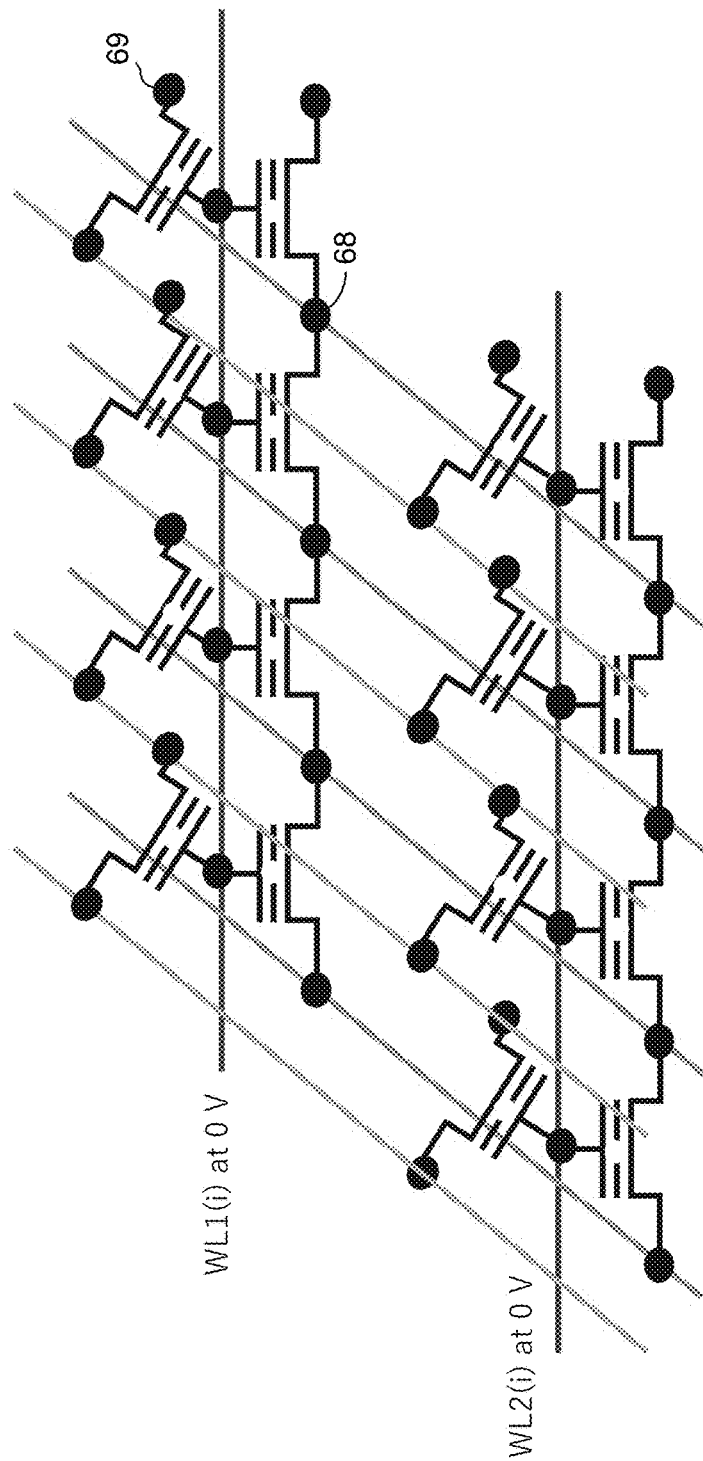
FIG. 28 is a circuit diagram of the NOR memory device with bias voltages during an erase operation.

Referring to FIG. 28, an exemplary circuit of the first embodiment of the present disclosure is illustrated during an erase operation in a dual-bit-per-cell operational mode. An entire memory block in a three-dimensional memory device may be erased by applying the erase bias voltage V_erase (which may be in a range from −15 V to −25 V, such as −20 V) to each of the first bit lines 22 and the second bit lines 82, and by applying 0 V to all word lines WLk(i), as described above.

Figure 29:
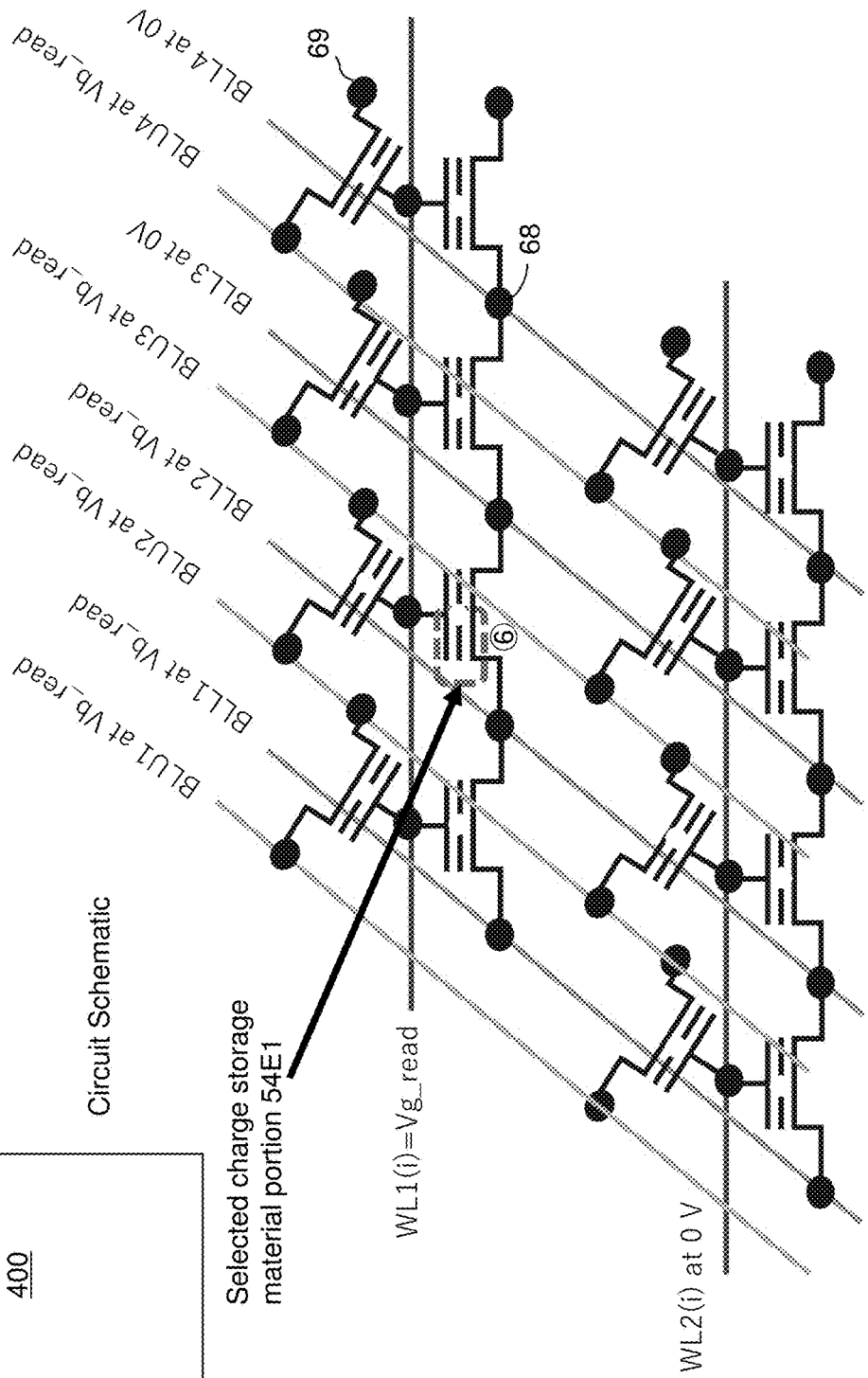
FIG. 29 is a circuit diagram of the NOR memory device with bias voltages during a read operation for reading an A-cell.
Figure 30:
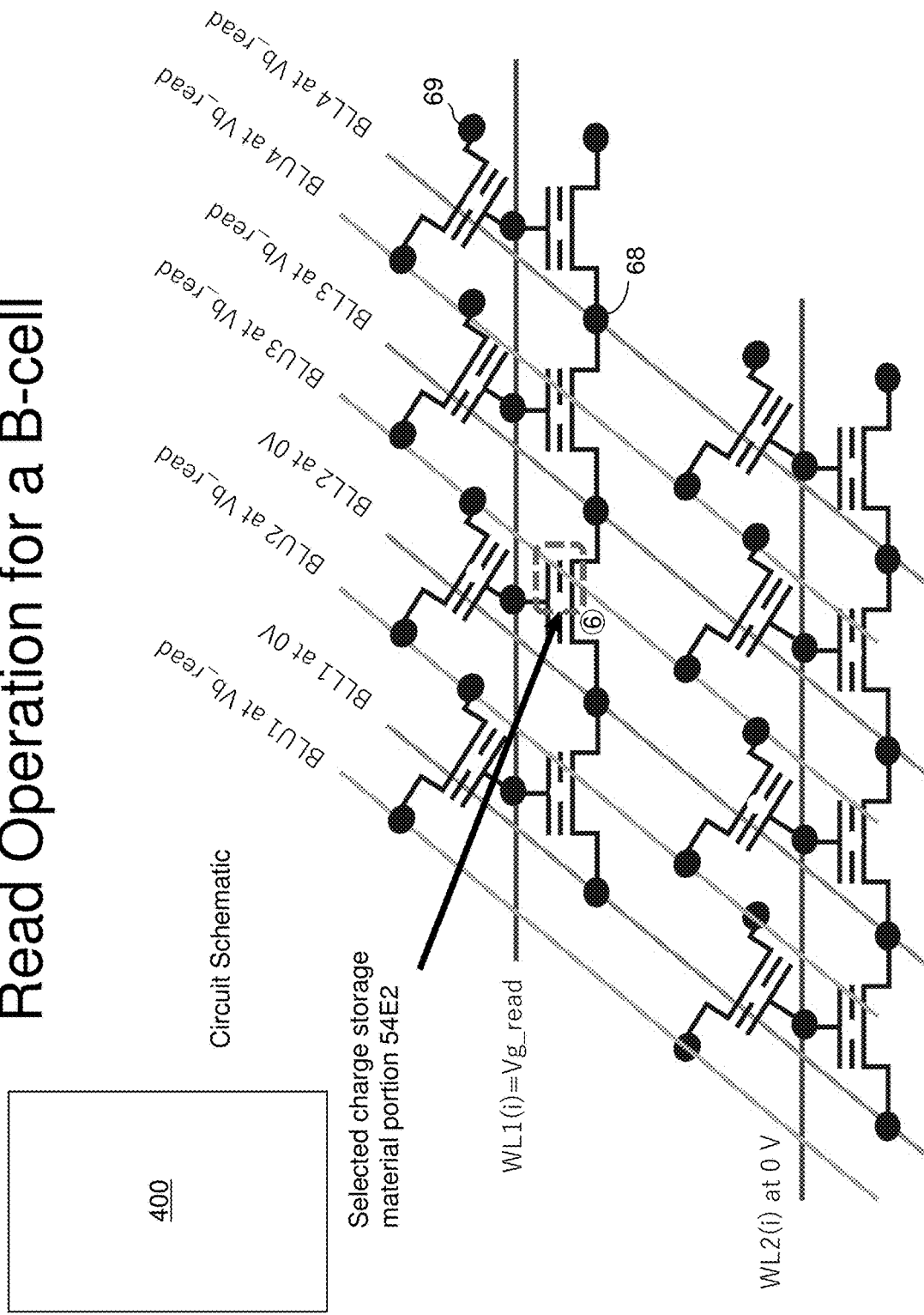
FIG. 30 is a circuit diagram of the NOR memory device with bias voltages during a read operation for reading a B-cell.

Referring to FIGS. 29 and 30, an exemplary circuit of the first embodiment of the present disclosure is illustrated during a read operation in a dual-bit-per-cell operational mode. The read operations for the A and B cells are same as the programming operations for A and B cells, except that a gate read bias voltage (Vg_read) is applied instead of the gate programing bias voltage, and the bit line read bias voltage (Vb_read) is applied instead of the drain programming bias voltage. A first or second data bit of the selected charge storage field effect transistor 6 may be read without reading the other one of the first or second data bit.

Generally, the exemplary circuit of the first embodiment of the present disclosure may be read by applying 0V to each first source/drain region 68 within the first field effect transistor string S1 that is located on the first (e.g., left) side of the semiconductor channel 60 of the selected first field effect transistor 6; applying the bit line read bias voltage to each first source/drain region 68 within the first field effect transistor string S1 that is located on the second (e.g., right) side of the semiconductor channel 60 of the selected first field effect transistor 6; and applying a gate read bias voltage to the first word line (e.g., WL1(i)) of the selected first field effect transistor 6 to read the second data bit of the selected first field effect transistor.

Figures 31A, 31B:
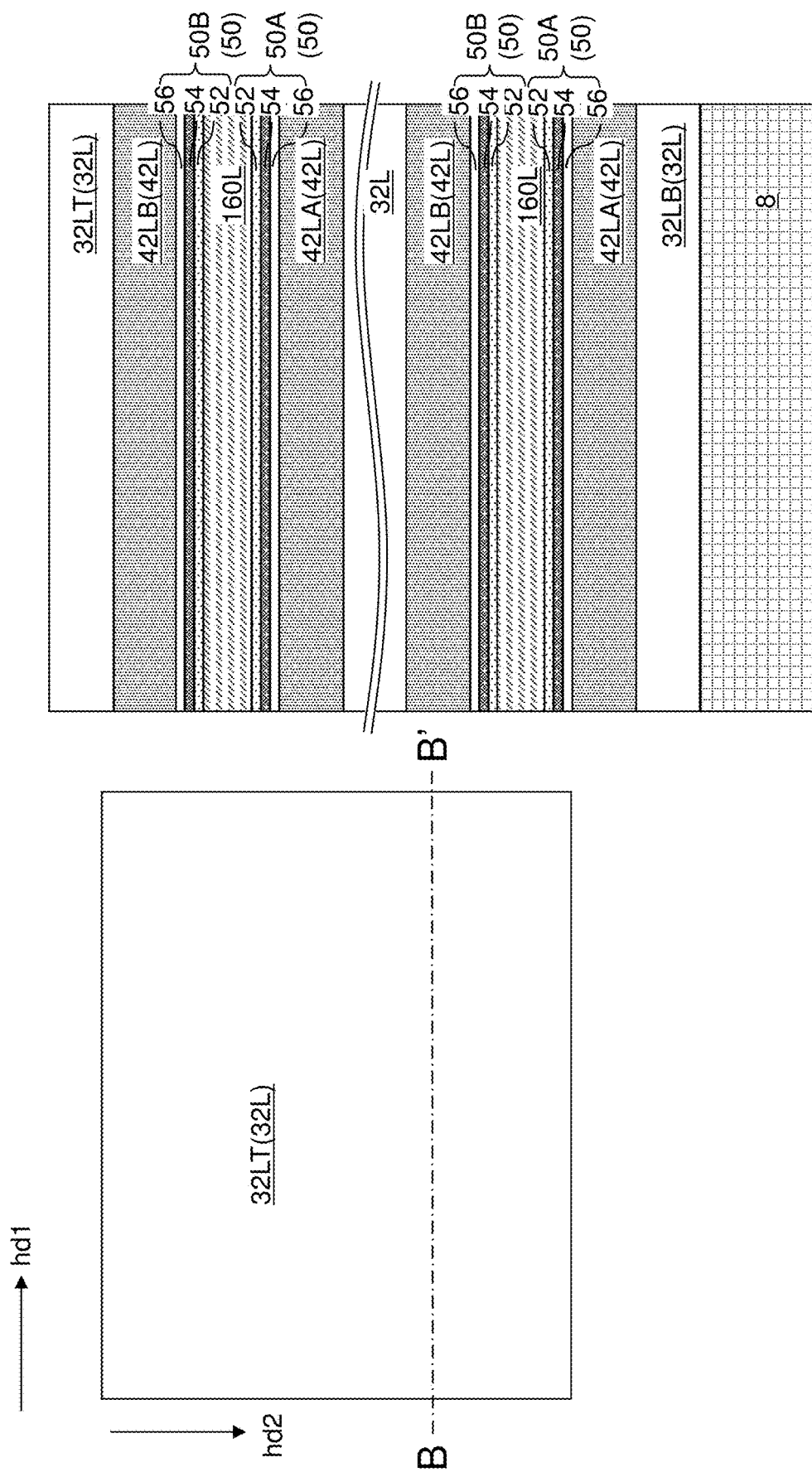
FIGS. 31A and 31B are various views of a second exemplary structure after formation of a vertical repetition of a unit layer stack according to a second embodiment of the present disclosure.

Referring to FIGS. 31A and 31B, a second exemplary structure according to a second embodiment of the present disclosure is illustrated. The second exemplary structure comprises an optional bottommost insulating layer 32LB and a vertical repetition of multiple instances of a unit layer stack (42LA, 50A, 160L, 50B, 42LB, 32L). A topmost insulating layer 32LT may be located over the vertical repetition of multiple instances of the unit layer stack. Each instance of the unit layer stack may comprise, for example, a first sacrificial material layer 42LA, a first memory film 50A, a semiconductor material layer 160L, a second memory film 50B, a second sacrificial material layer 42B, and an insulating layer 32L. The first sacrificial material layers 42LA and the second sacrificial material layers 42LB are collectively referred to as sacrificial material layers 42L. The first memory films 50A and the second memory films 50B are collectively referred to as memory films 50.

The sacrificial material layers 42L in the second exemplary structure may have the same material composition as and may be formed employing a same deposition process as the sacrificial material layers 42L in the first exemplary structure. The insulating layers 32L in the second exemplary structure may have the same material composition as and may be formed employing a same deposition process as the insulating layers 32L in the first exemplary structure. Each memory film 50 in the second exemplary structure may comprise a same layer stack as the memory films 50 in the first exemplary structure. In one embodiment, each first memory film 50A may comprise, from bottom to top, a blocking dielectric layer 56, a charge storage layer 54, and a tunneling dielectric layer 52; and each second memory film 50B may comprise, from bottom to top, a tunneling dielectric layer 52, a charge storage layer 54, and a blocking dielectric layer 56. Thus, the tunneling dielectric layers 52 of both memory films 50A and 50B are located adjacent to the respective semiconductor material layer 160L located between the first memory film 50A and the second memory film 50B. The semiconductor material layers 160L in the second exemplary structure may have the same material composition as the semiconductor channels 60 in the first exemplary structure. Thus, the semiconductor material layers 160L may comprise a doped semiconductor material (e.g., polysilicon or amorphous silicon) having a doping of the first conductivity type. The thickness of each semiconductor material layer 160L may be in a range from 5 nm to 100 nm, such as from 10 nm to 50 nm, although lesser and greater thicknesses may also be employed. The total number of instances of the unit layer stack (42LA, 50A, 160L, 50B, 42LB, 32L) within the vertical repetition may be in a range from 2 to 1,024, such as from 8 to 128. An embodiment is also contemplated in which only a single instance of the unit layer stack (42LA, 50A, 160L, 50B, 42LB, 32L) is employed.

Figures 32A, 32B:
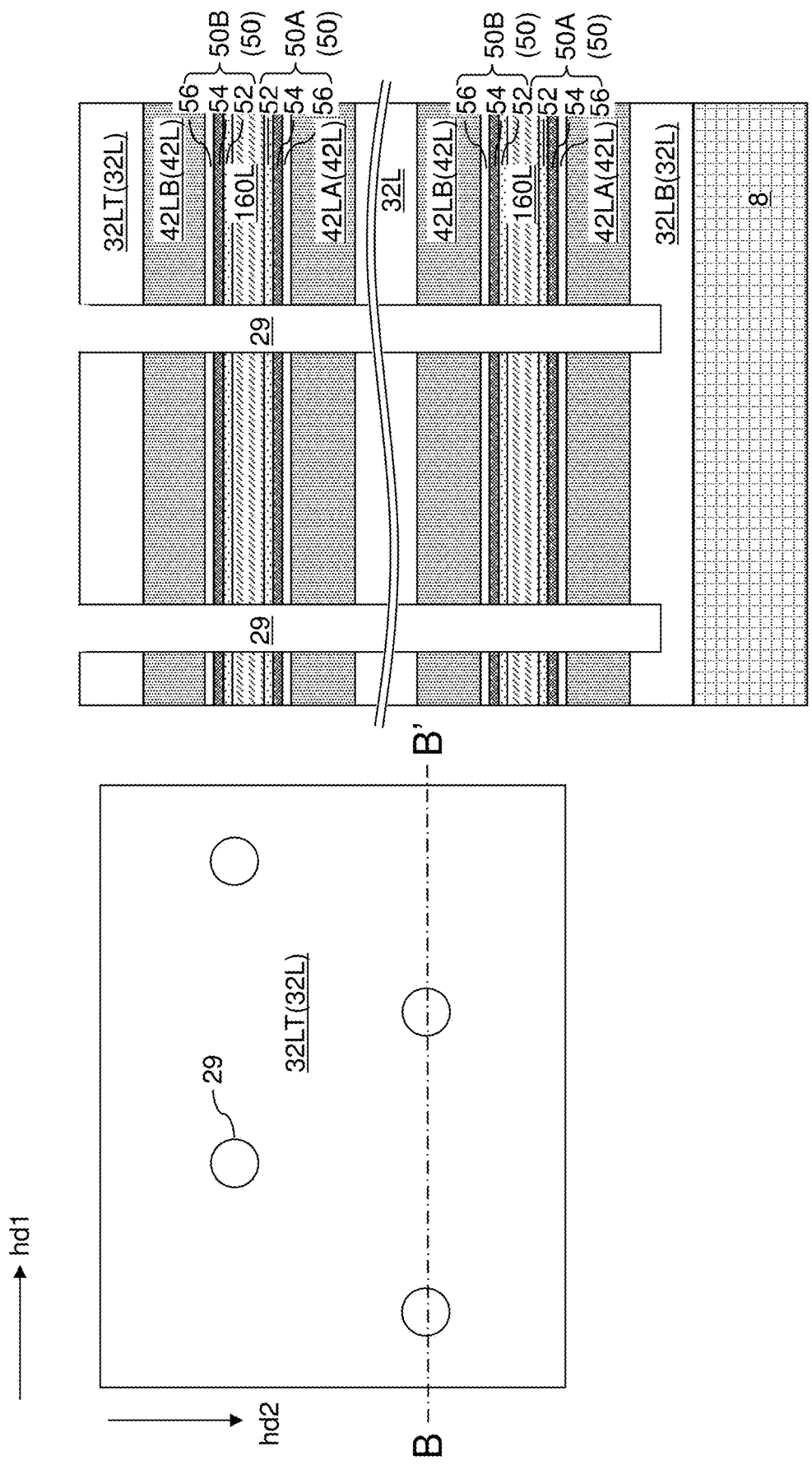
FIGS. 32A and 32B are various views of the second exemplary structure after formation of source/drain openings according to the second embodiment of the present disclosure.

Referring to FIGS. 32A and 32B, a photoresist layer (not shown) can be applied over the second exemplary structure, and can be lithographically patterned to form rows of discrete openings therein. Each row of discrete openings in the photoresist layer may include a plurality of discrete openings that are arranged along a first horizontal direction hd1. The rows of the source/drain openings may be laterally spaced apart along a second horizontal direction hd2 that is perpendicular to the first horizontal direction hd1.

An anisotropic etch process can be performed to transfer the pattern of the discrete openings in the photoresist layer through the topmost insulating layer 32LT and through the vertical repetition of multiple instances of a unit layer stack (42LA, 50A, 160L, 50B, 42LB, 32L). Row of source/drain openings 29 can be formed through vertical repetition of multiple instances of a unit layer stack (42LA, 50A, 160L, 50B, 42LB, 32L). Each row of source/drain openings 29 comprises a respective set of source/drain openings 29 that are arranged along the first horizontal direction hd1, and the rows of source/drain openings 29 are laterally spaced among one another along the second horizontal direction hd2.

In one embodiment, a two-dimensional array of source/drain openings 29 can be formed through the vertical repetition of multiple instances of a unit layer stack (42LA, 50A, 160L, 50B, 42LB, 32L). Bottom surfaces of the source/drain openings 29 may be formed within the bottommost insulating layer 32LB. Each of the source/drain openings 29 may have a circular horizontal cross-sectional shape, an elliptically horizontal cross-sectional shape, a rectangular horizontal cross-sectional shape, a horizontal cross-sectional shape of a rounded rectangle (i.e., a shape that is derived from a rectangle by rounding the four corners), or a horizontal cross-sectional shape of any other two-dimensional shape having a closed periphery. In one embodiment, each of the source/drain openings 29 has a respective circular horizontal cross-sectional shape. The maximum lateral dimension (such as a diameter) of each source/drain opening 29 may be in a range from 20 nm to 200 nm, such as from 80 nm to 120 nm, although lesser and greater thicknesses may also be employed. In one embodiment, the source/drain openings 29 may be arranged as a periodic two-dimensional array such as a hexagonal array or a rectangular array.

Figures 33A, 33B:
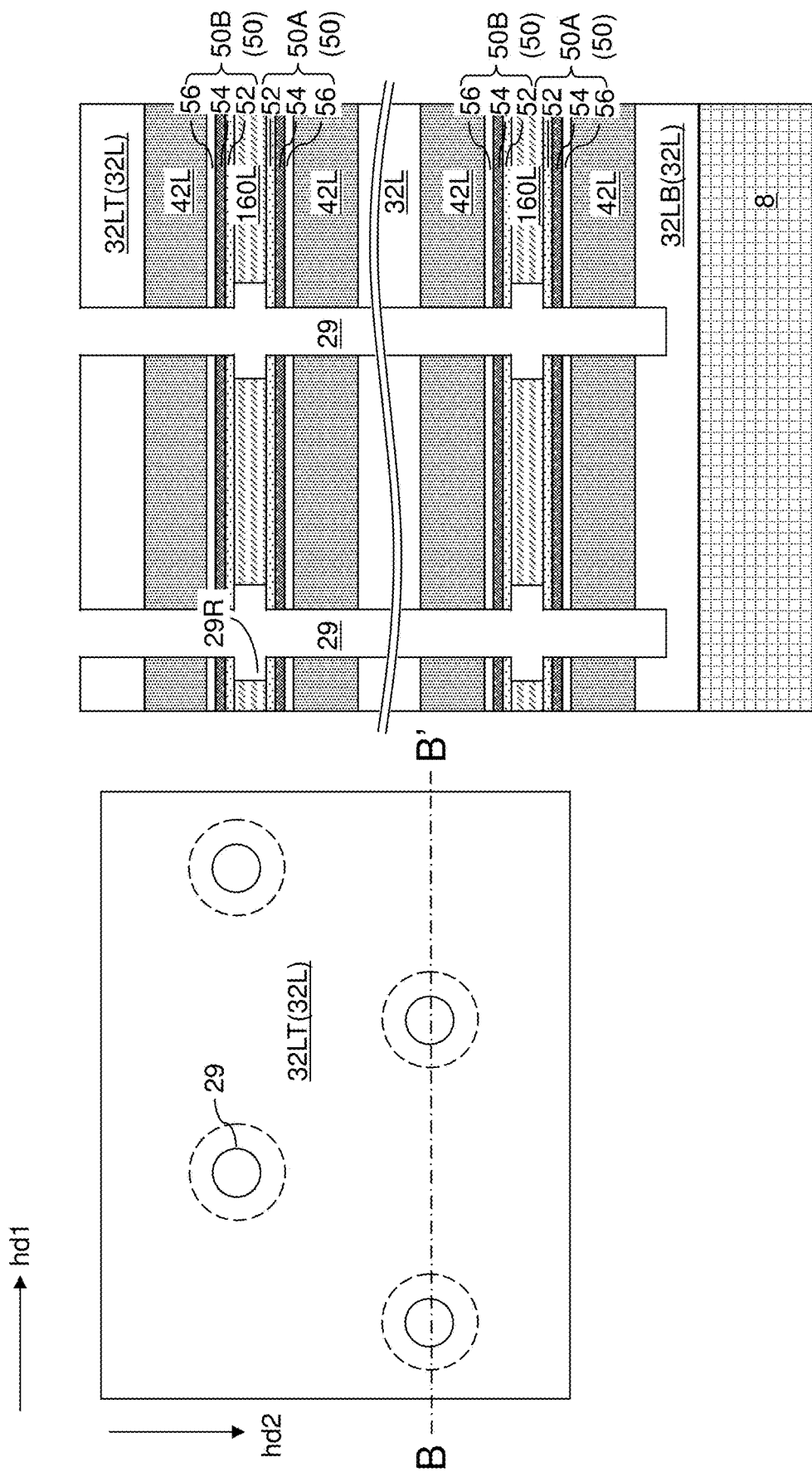
FIGS. 33A and 33B are various views of the second exemplary structure after lateral expansion of the source/drain openings at levels of semiconductor channel material layers according to the second embodiment of the present disclosure.

Referring to FIGS. 33A and 33B, an optional isotropic etch process can be performed to isotropically recess the semiconductor material of the semiconductor material layers 160L selective to materials of the insulating layers 32L, the sacrificial material layers 42L, and the memory films 50. For example, a timed wet etch process employing hot trimethyl-2 hydroxyethyl ammonium hydroxide ("hot TMY") or tetramethyl ammonium hydroxide (TMAH) may be performed to laterally recess the physically exposed sidewalls of the semiconductor material layers 160L around each source/drain opening 29. The lateral recess distance of the isotropic etch process is less than one half of nearest neighbor spacing among the source/drain openings 29, and may be in a range from 2 nm to 100 nm, such as from 10 nm to 50 nm, although lesser and greater lateral recess distances may also be employed. A vertical stack of annular recesses 29R may be formed around each source/drain opening 29. Each annular recess 29R is a laterally-extending portion of a respective source/drain opening 29 that is formed at a level of a semiconductor material layer 160L.

Figures 34A, 34B:
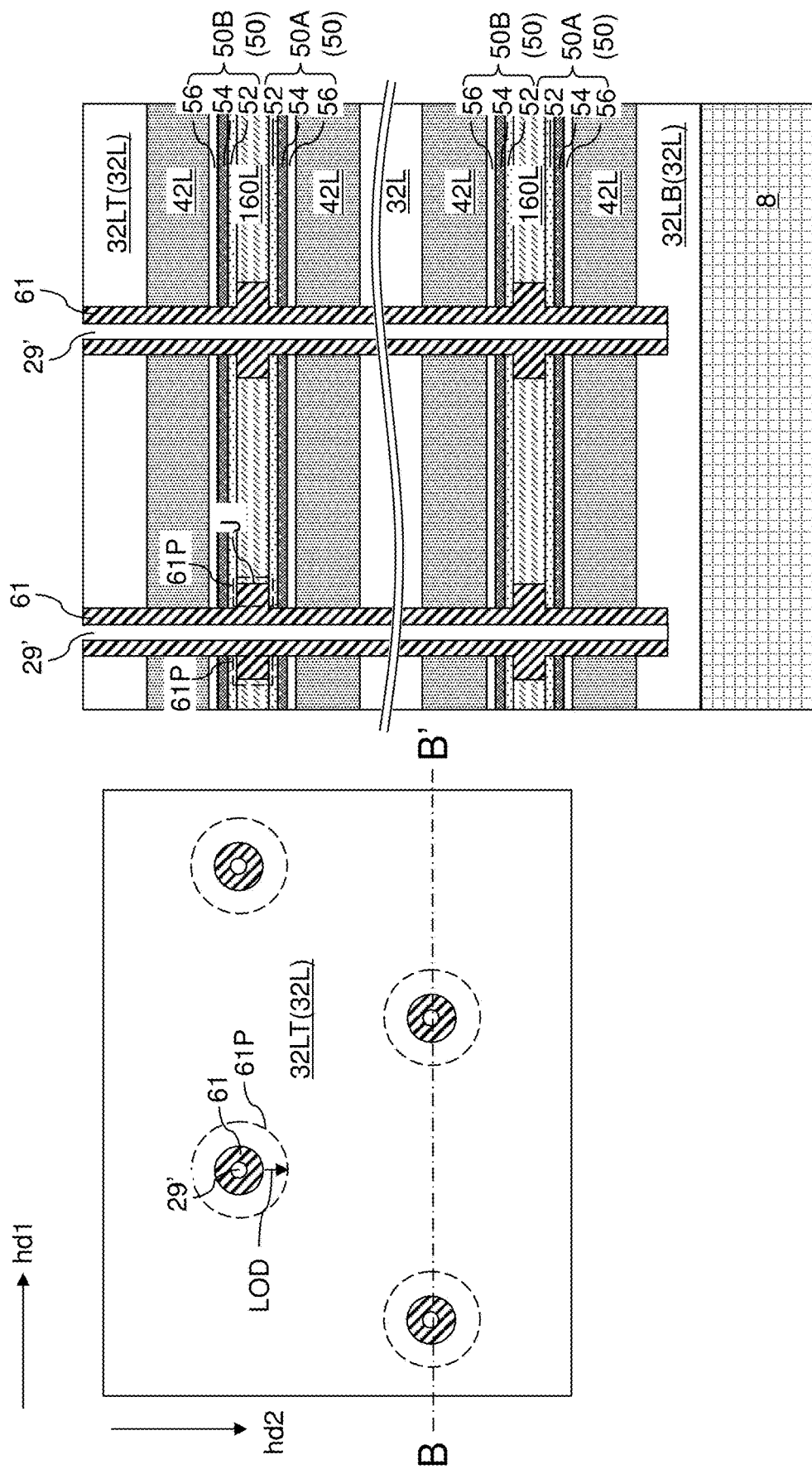
FIGS. 34A and 34B are various views of the second exemplary structure after formation of source/drain pillars according to the second embodiment of the present disclosure.

Referring to FIGS. 34A and 34B, a doped semiconductor material can be conformally deposited in the source/drain openings 29. The doped semiconductor material deposited in the source/drain openings 29 can have a doping of a second conductivity type, which is the opposite of the first conductivity type. In one embodiment, the doped semiconductor material deposited in the source/drain openings 29 can include heavily doped polysilicon or heavily doped amorphous silicon (which is subsequently converted into doped polysilicon). The doped semiconductor material can include dopants of the second conductivity type at an atomic concentration in a range from $5.0 \times 10^{19}/cm^3$ to $2.0 \times 10^{21}/cm^3$, although lesser and greater atomic concentrations can also be employed. The thickness of the deposited doped semiconductor material can be selected such that the annular recesses 29R (i.e., laterally protruding portions) of the source/drain openings 29 are filled within the deposited doped semiconductor material. An anisotropic etch process may be performed to remove horizontally-extending portions of the deposited doped semiconductor material from above the topmost insulating layer 32LT and at the bottom of each source/drain opening 29. Each remaining portion of the deposited semiconductor material constitutes a source/drain pillar structure 61.

In one embodiment, each source/drain pillar structure 61 may have a shape of a cylinder with sidewall protrusions 61P. In one embodiment, the cylinder may be hollow and may laterally enclose an unfilled volume of a respective source/drain opening 29, which is herein referred to as a source/drain cavity 29'. Generally, source/drain pillar structures 61 can be formed at peripheral portions of the source/drain openings 29. The source/drain pillar structures 61 have a doping of a second conductivity type that is an opposite of the first conductivity type. The annular recesses 29R of the source/drain openings 29 are filled with laterally-protruding portions 61P of the source/drain pillar structures 61. In one embodiment, each laterally-protruding portion 61P within the set of laterally-protruding portions 61P has a same vertical thickness as and contacts a vertical sidewall of a semiconductor material layer 160L. A p-n junction J is formed at each cylindrical interface between a laterally-protruding portion 61P of a respective source/drain pillar structure 61 and a respective semiconductor material layer 160L.

Generally, the isotropic etch process that laterally recesses sidewalls of the semiconductor material layers 160L in the source/drain openings 29 from sidewalls of the insulating layers 32L, the sacrificial material layers 42L, and the memory films 50 laterally recesses each physically sidewall of the semiconductor material layers 160L by a same lateral recess distance. As such, sidewalls of the laterally-protruding portions 61P of each source/drain pillar structure 61 that contact a respective semiconductor material layer 160L can be laterally offset from vertical interfaces between the respective source/drain pillar structure 61 and the memory films 50, the insulating layers 32L, and the sacrificial material layers 42L by a uniform lateral offset distance LOD in a plan view, as shown in FIG. 34A.

In one embodiment, the portions of the source/drain openings 29 through the memory films 50, the insulating layers 32L, and the sacrificial material layers 42L may have a respective circular horizontal cross-sectional shape, and the sidewalls of the laterally-protruding portions 61P of each source/drain pillar structure 61 that contact the semiconductor material layers 160L have a respective convex vertical surface. In one embodiment, each of the source/drain pillar structures 61 vertically extends from a bottommost layer within the vertical repetition of multiple instances of the unit layer stack (42LA, 50A, 160L, 50B, 42LB, 32L) to a topmost layer within the vertical repetition of multiple instances of the unit layer stack (42LA, 50A, 160L, 50B, 42LB, 32L). In one embodiment, each of the source/drain pillar structures 61 comprises a respective set of laterally-protruding portions 61P, and each of the laterally-protruding portions 61P comprises a respective horizontal bottom surface that contacts a horizontal top surface segment of a respective one of the first memory films 50A and a respective horizontal top surface that contacts a horizontal bottom surface segment of a respective one of the second memory films 50B.

Figure 34C:
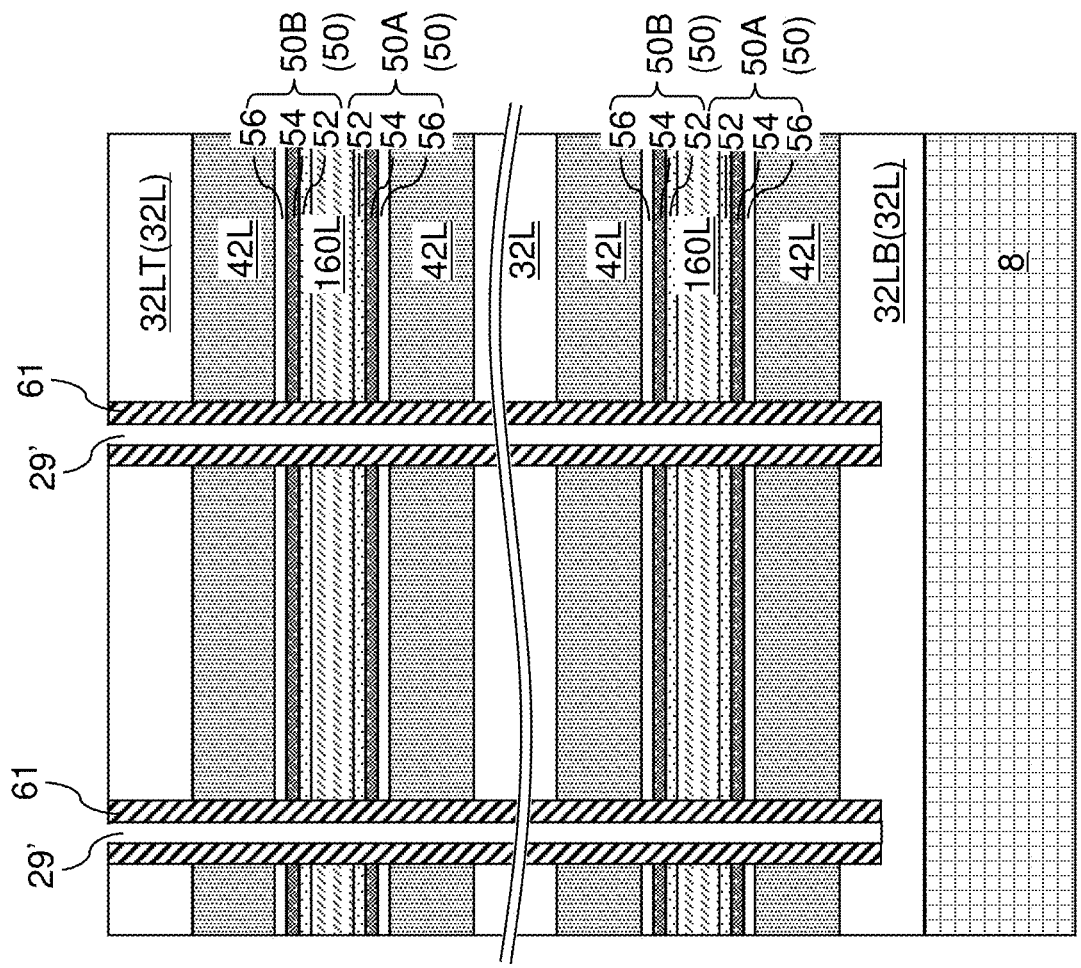
FIG. 34C is a vertical cross sectional view of an alternative configuration of the second exemplary structure after formation of source/drain pillars according to the second embodiment of the present disclosure.

Referring to FIG. 34C, in an alternative configuration of the second embodiment, the formation of the lateral recesses 29R shown in FIGS. 33A and 33B is omitted. In this alternative configuration, the source/drain pillar structures 61 lack the laterally-protruding portions 61P after deposition.

Figures 35A, 35B:
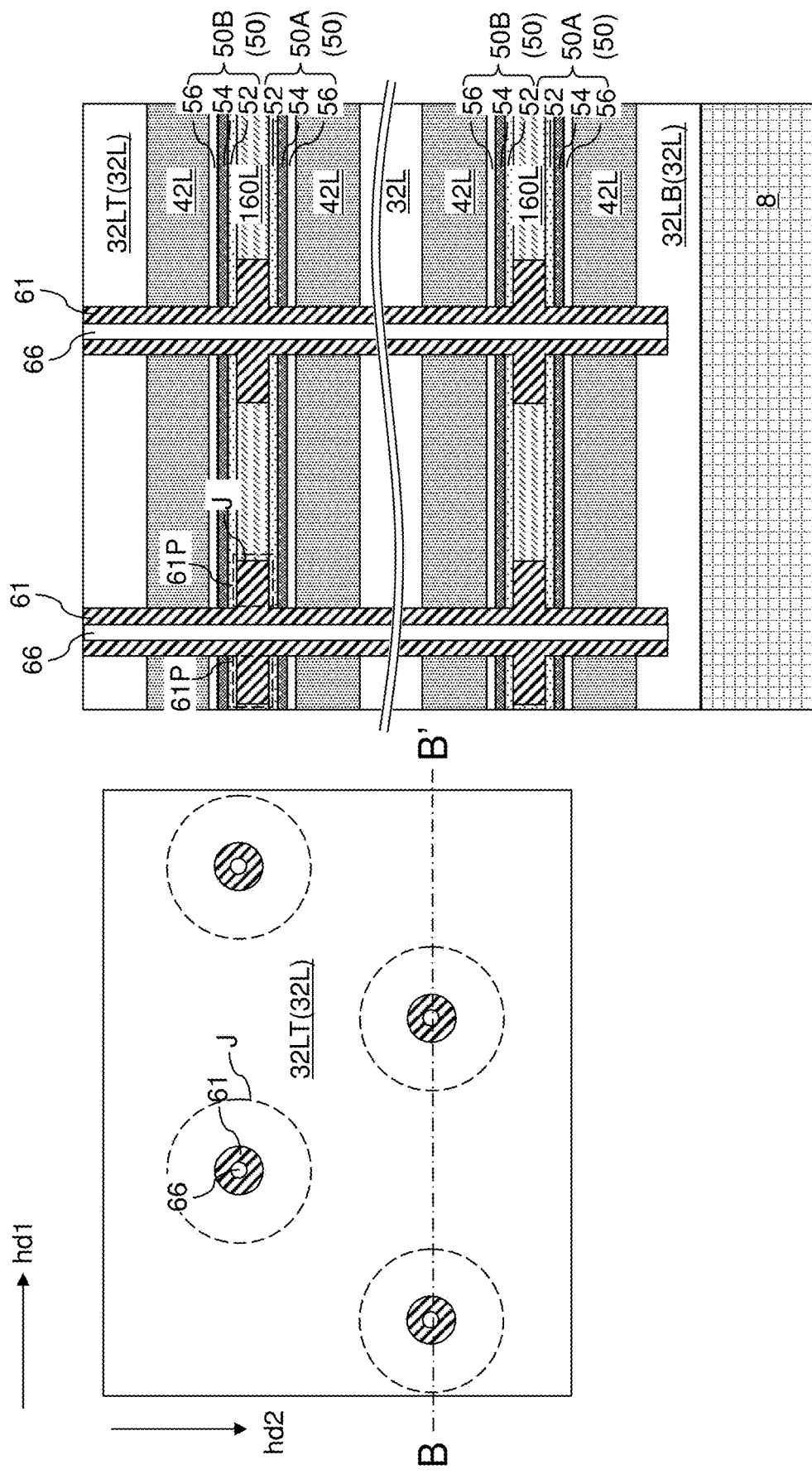
FIGS. 35A and 35B are various views of the second exemplary structure after formation of dielectric cores according to the second embodiment of the present disclosure.

Referring to FIGS. 35A and 35B, an optional dielectric fill material, such as silicon oxide, can be deposited in the source/drain cavities 29' (if present) by a conformal deposition process. Excess portions of the dielectric fill material may be removed from above the horizontal plane including the top surface of the topmost insulating layer 32LT. Each remaining portion of the dielectric fill material that fills a respective source/drain cavity 29' constitutes a dielectric core 66.

An activation anneal process can be performed to electrically activate dopants in the semiconductor material layers 160L and the source/drain pillar structures 61. In one embodiment, the duration and the elevated temperature of the activation anneal process can be selected such that each p-n junction J shifts outward from the vertical axis passing through the geometrical center of a most proximal source/drain pillar structure 61. Thus, each p-n junction J can be formed at a target lateral offset distance from the vertical plane including interfaces between the source/drain pillar structure 61 that is enclosed by the p-n junction and the insulating layers 32L, the sacrificial material layers 42L, and the memory films 50. In one embodiment, each of the source/drain pillar structures 61 laterally surrounds a cylindrical dielectric core 66 that vertically extends through each layer within the vertical repetition of multiple instances of the unit layer stack (42LA, 50A, 160L, 50B, 42LB, 32L).

Generally, the process conditions of the activation anneal process can be selected to optimize the lateral shift distance of the p-n junction. If the formation of the lateral recesses 29R of the source/drain openings 29 is omitted, as shown in FIG. 34C, then the laterally-protruding portions 61P are formed by lateral out-diffusion of the first conductivity type dopants from the source/drain pillar structures 61 into the adjacent semiconductor channels 160 during the activation anneal. Thus, in the alternative configuration of the second embodiment, the laterally-protruding portions 61P are formed after deposition of the source/drain pillar structures 61.

Figure 36B:
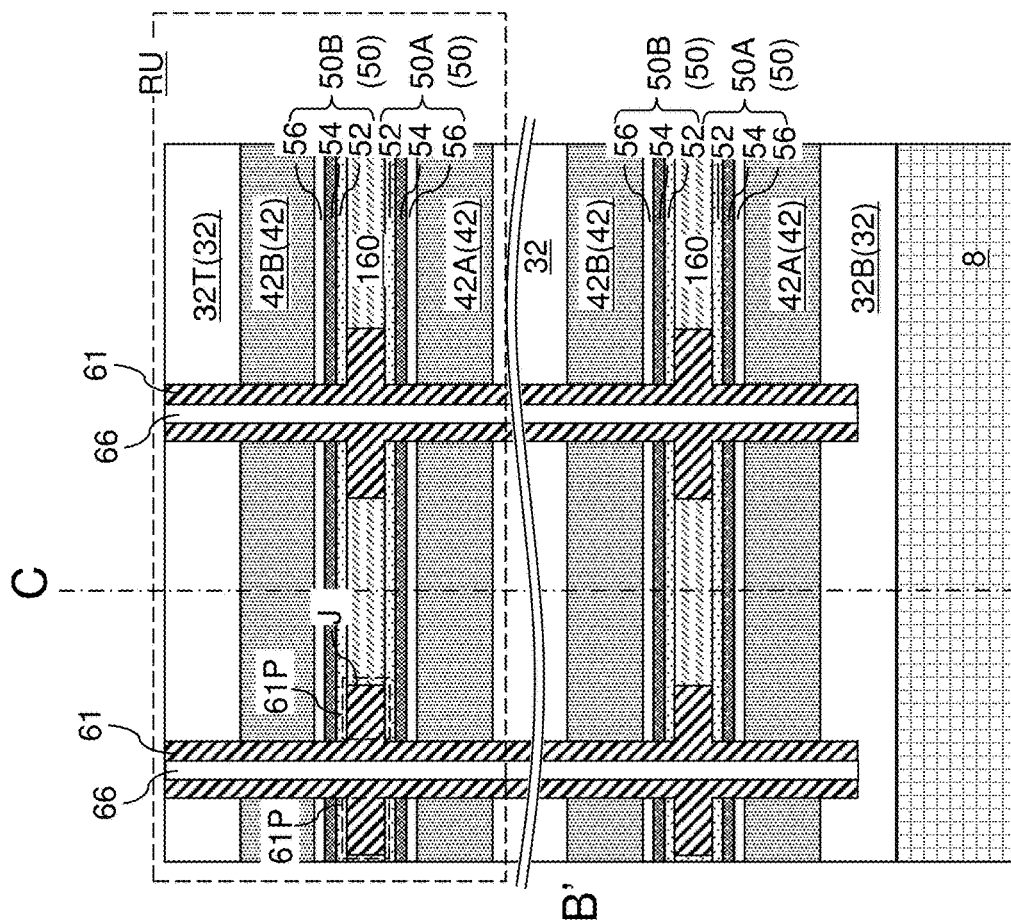
Figure 36A:
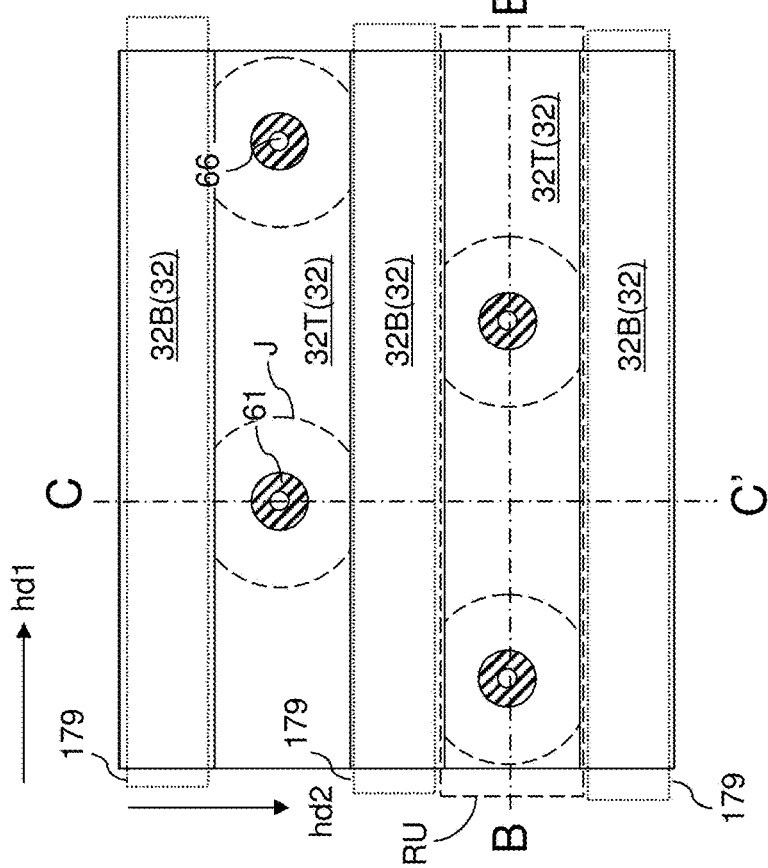

Referring to FIGS. 36A-36C, a photoresist layer (not shown) can be applied over the topmost insulating layer 32LT and the vertical repetition of multiple instances of the unit layer stack (42LA, 50A, 160L, 50B, 42LB, 32L), and can be lithographically patterned to form line-shaped openings that laterally extend along the first horizontal direction hd1. Each line-shaped opening in the photoresist layer can be formed between a respective neighboring pairs of rows of source/drain pillar structures 61, and can laterally extend along the first horizontal direction hd1.

An anisotropic etch process can be performed to transfer the pattern of the line-shaped openings in the photoresist layer through the topmost insulating layer 32LT and the vertical repetition of multiple instances of the unit layer stack (42LA, 50A, 160L, 50B, 42LB, 32L). Line trenches 179 laterally extending along the first horizontal direction hd1 can be formed through the topmost insulating layer 32LT and the vertical repetition of multiple instances of the unit layer stack (42LA, 50A, 160L, 50B, 42LB, 32L). The line trenches 179 are formed between a respective neighboring pair of rows of source/drain pillar structures 61, i.e., between a respective neighboring pair of rows of source/drain openings 29.

According to an aspect of the present disclosure, each backside trench 179 can cut through peripheral portions of two rows of laterally-protruding portions 61P of the source/drain pillar structures 61. Thus, upon formation of the backside trenches 179, each semiconductor material layer 160L can be divided into a two-dimensional array of discrete semiconductor channels 160 contacting a respective pair of source/drain pillar structures 61. Each laterally-protruding portion 61P of the source/drain pillar structures 61 may comprise a pair of flat vertical sidewall segments that are perpendicular to the second horizontal direction hd2.

The vertical stack of multiple instances of the unit layer stack (42LA, 50A, 160L, 50B, 42LB, 32L) is divided into vertical stacks of repetition units RU. The vertical stacks of repetition units RU are interlaced with the line trenches 179 along the second horizontal direction hd2 that is perpendicular to the first horizontal direction hd1. Each instance of the repetition unit RU comprises a first sacrificial material strip 42A, a first memory film 50A, a row of discrete semiconductor channels 160 that are laterally spaced apart from each other along the first horizontal direction hd1, a second memory film 50B, a second sacrificial material strip 42B, and an insulating strip 32. Each instance of the repetition unit RU laterally extends along the first horizontal direction hd1.

Each source/drain pillar structure 61 may comprise a respective set of laterally-protruding portions 61P, and each laterally-protruding portion 61P within the set of laterally-protruding portions 61P contacts a respective one of the discrete semiconductor channels 160, as shown in FIG. 36B. In one embodiment, each laterally-protruding portion 61P within the set of laterally-protruding portions 61P contacts a respective additional one of the discrete semiconductor channels 160 for each source/drain pillar structure 61 other than outermost source/drain pillar structures 61 (i.e., other than the two source/drain pillar structures 61 located at an end of each row of source/drain pillar structures 61 arranged along the first horizontal direction hd1). In one embodiment, the laterally-protruding portions 61P of the source/drain pillar structures 61 may have a uniform width along the second horizontal direction hd2, which may be the same as the width of the discrete semiconductor channels 160 along the second horizontal direction hd2.

Figure 37C:
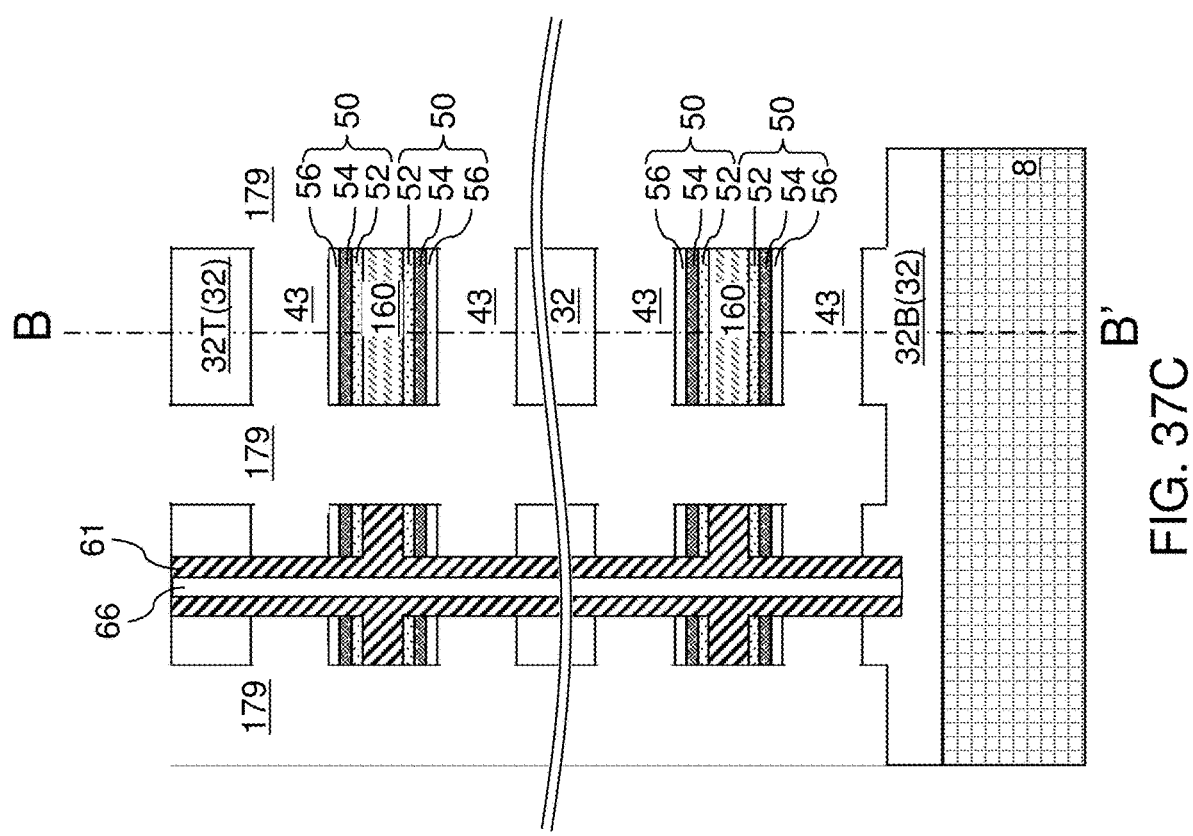

Referring to FIGS. 37A-37C, backside recesses 43 can be formed by performing an isotropic etch process that etches the material of the sacrificial material strips 42 selective to the materials of the insulating strips 32 and the memory films 50. An isotropic etchant can be supplied into the line trenches 179 during the isotropic etch process. In an illustrative example, if the sacrificial material strips 42 include silicon nitride, then a wet etch process employing hot phosphoric acid can be performed to remove the sacrificial material strips 42. A memory film 50 and an insulating layer 32 can be physically exposed to each backside recess 43.

Figure 38C:
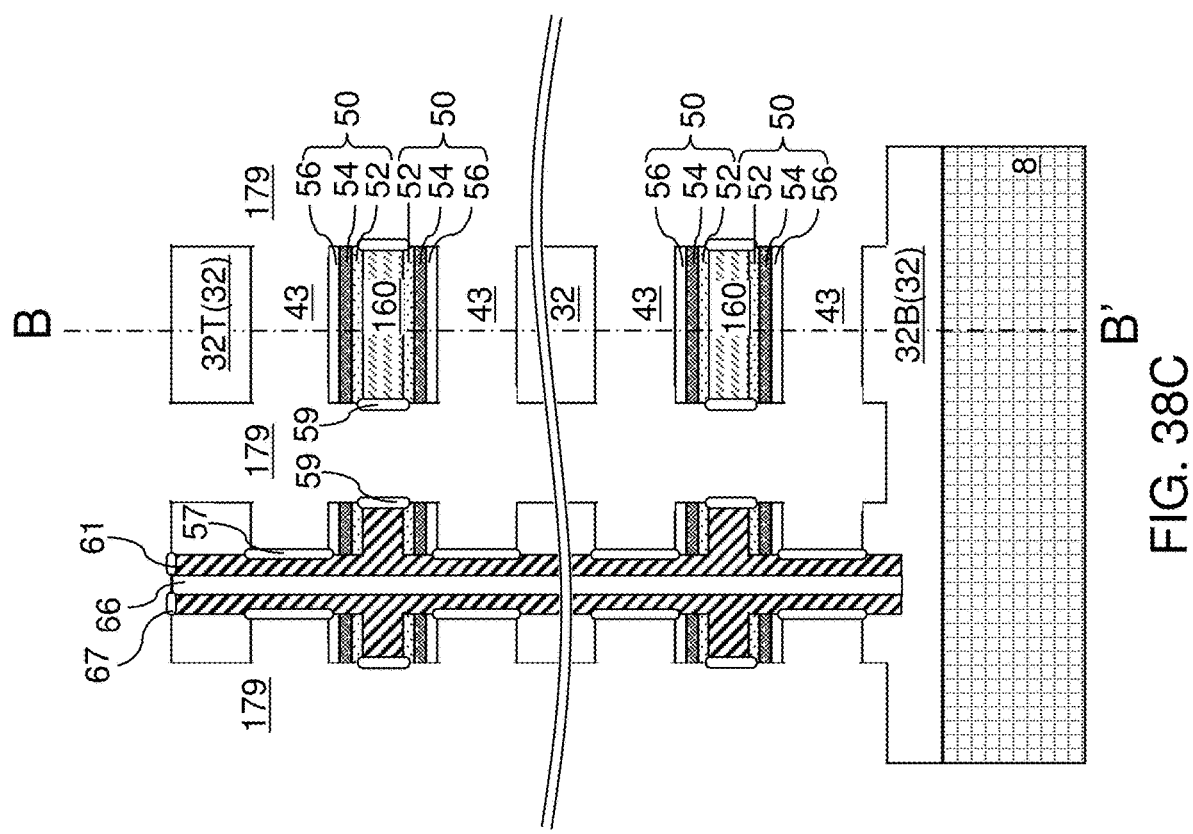

Referring to FIGS. 38A-38C, an oxidation process can be performed to oxidize various physically exposed surface portions of the semiconductor materials of the source/drain pillar structures 61 which are exposed in the backside recesses 43 and the semiconductor materials of the laterally-protruding portions 61P of the source/drain pillar structures 61 and the semiconductor channels 60 which are exposed in the line trenches 179. Various semiconductor oxide liners (57, 59, 67) can be formed by the oxidation process. The various semiconductor oxide liners (57, 59, 67) may comprise, for example, tubular semiconductor oxide liners 57 laterally surrounding a vertically-extending segment of a respective source/drain pillar structure 61 and laterally surrounded by a respective backside recess 43, vertical planar semiconductor oxide liners 59 contacting planar vertical sidewall segments of a respective row of source/drain pillar structures 61 and planar vertical sidewall segments of a respective row of semiconductor channels 160 and physically exposed to a respective line trench 179, and an annular planar semiconductor oxide liner 67 covering an annular top surface of a respective source/drain pillar structure 61. The thickness of each semiconductor oxide liner (57, 59, 67) may be in a range from 8 nm to 30 nm, such as from 10 nm to 20 nm, although lesser and greater thicknesses may also be employed.

Figure 39B:
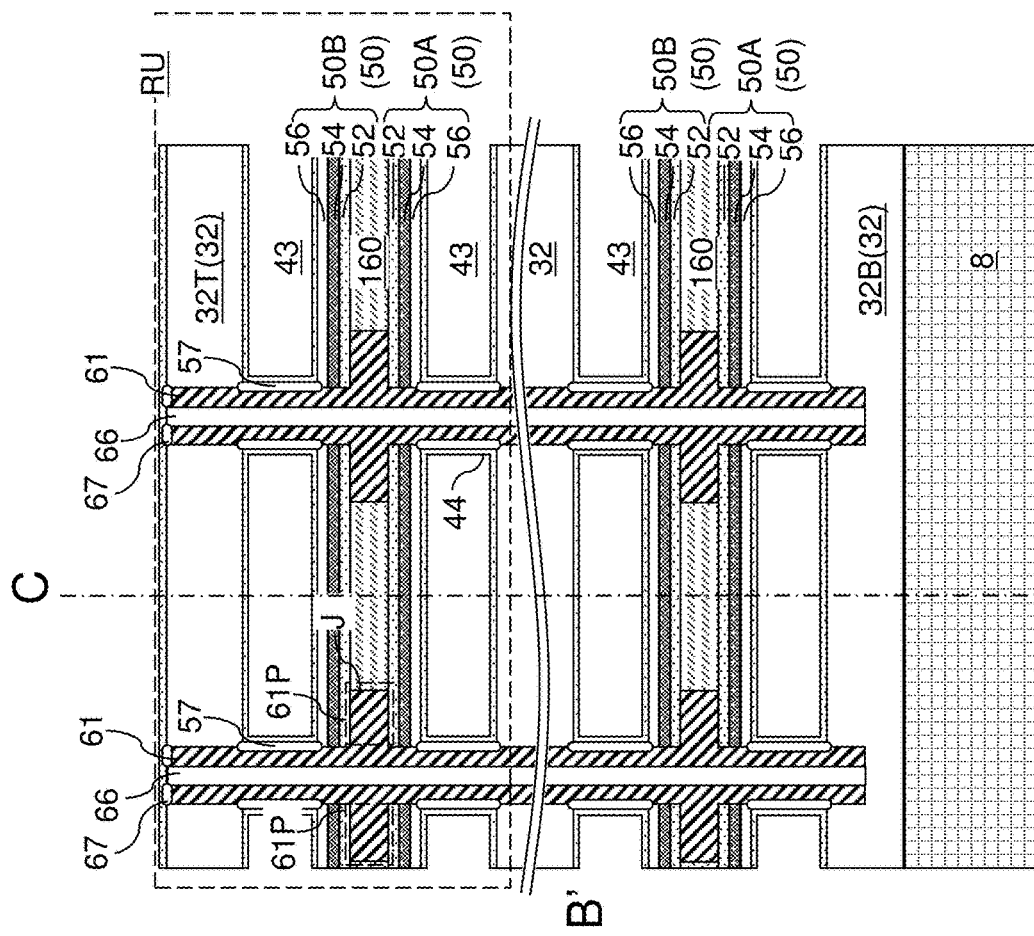
FIGS. 39A, 39B, and 39C are various views of the second exemplary structure after formation of a backside blocking dielectric layer according to the second embodiment of the present disclosure.
Figure 39A:
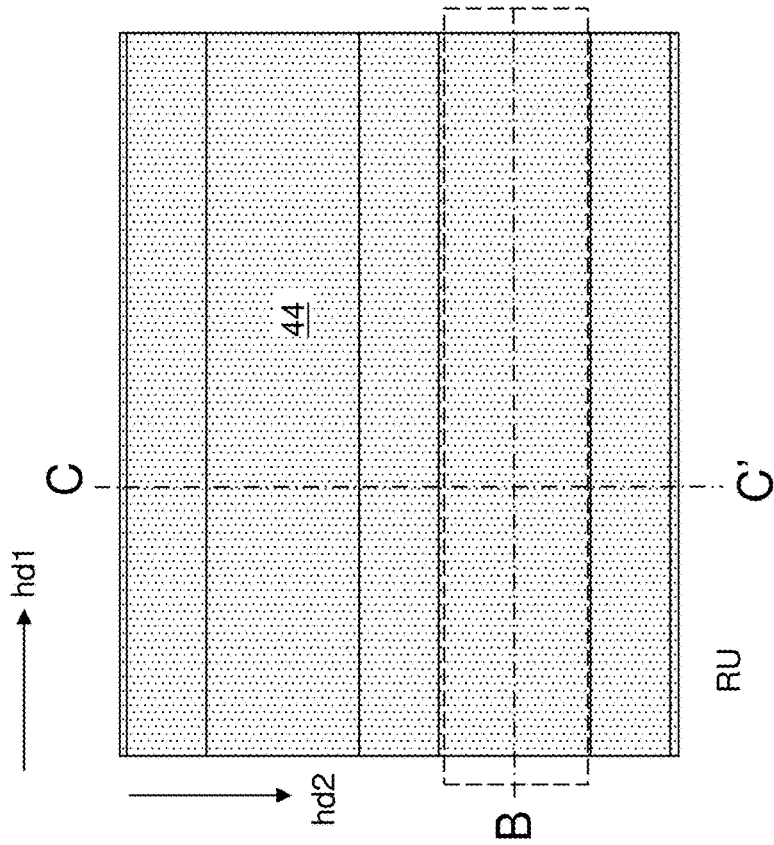
Figure 39C:
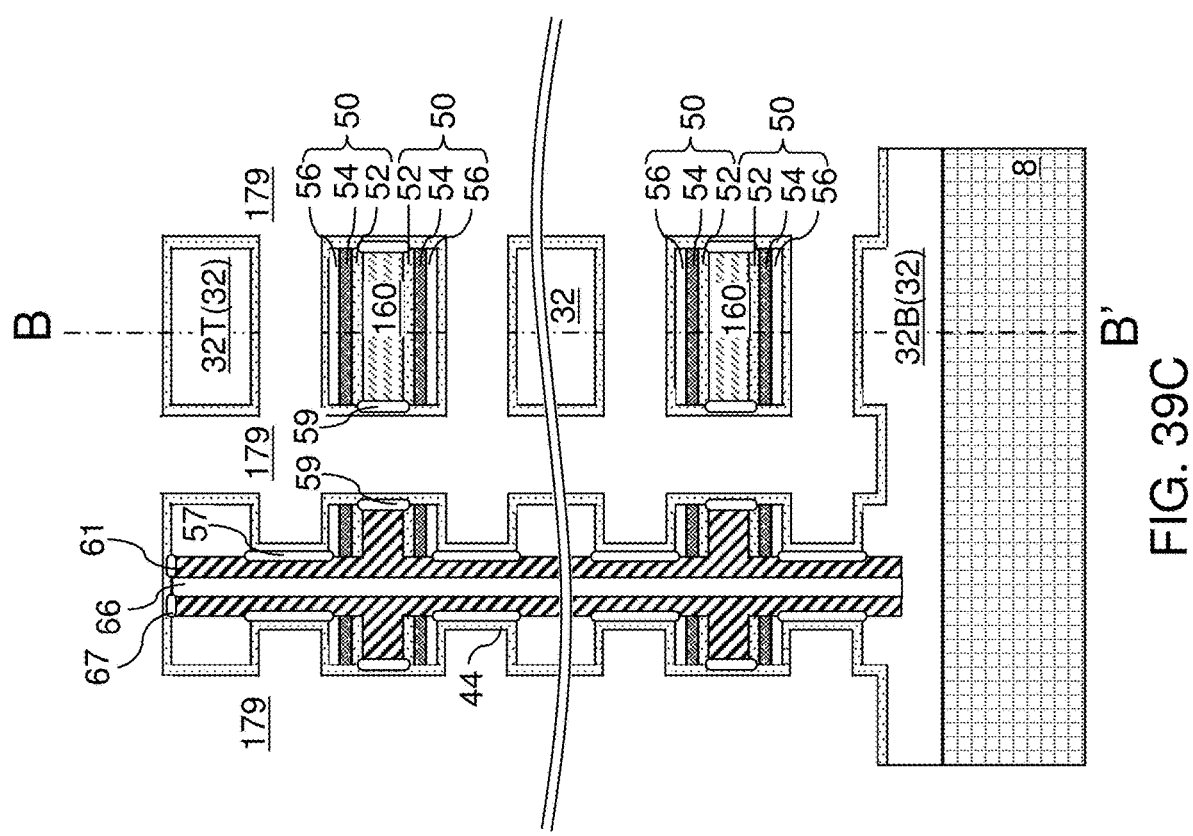

Referring to FIGS. 39A-39C, an optional backside blocking dielectric layer 44 can be deposited on the physically exposed surfaces around the backside recesses 43 and the line trenches 179. The backside blocking dielectric layer 44 may comprise a dielectric metal oxide material such as aluminum oxide, hafnium oxide, lanthanum oxide, yttrium oxide, tantalum oxide, any other dielectric transition metal oxide, or an alloy or a layer stack thereof. The thickness of the backside blocking dielectric layer 44 may be in a range from 2 nm to 10 nm, such as from 2.5 nm to 5 nm, although lesser and greater thicknesses may also be employed.

Figure 40C:
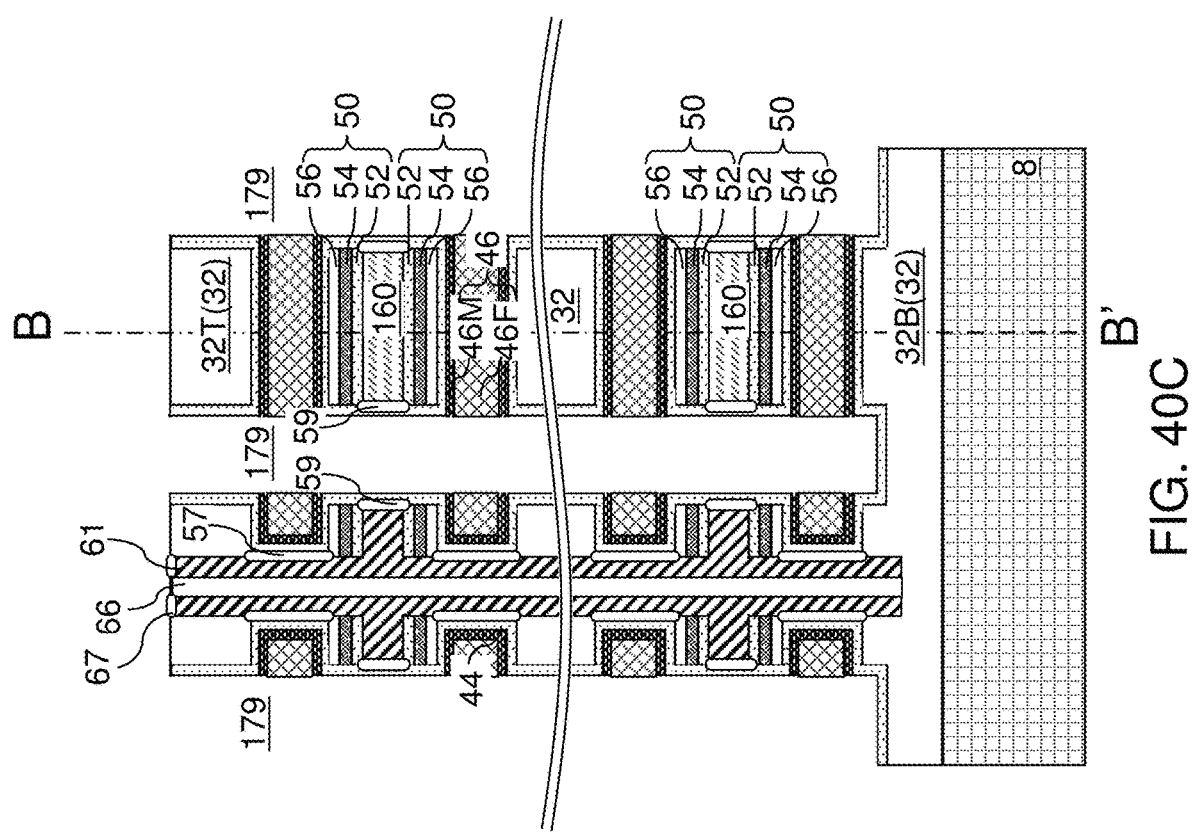

Referring to FIGS. 40A, 40B, and 40C, at least one conductive material can be deposited in the backside recesses 43. The at least one conductive material may comprise a metallic barrier layer and a metal fill material. The at least one conductive material may comprise, for example, metallic materials described with reference to FIGS. 14A-14D. A plurality of electrically conductive strips 46 (i.e., strip shaped electrically conductive layers) can be formed in the plurality of backside recesses 43, and a continuous metallic material layer (not shown) can be formed on the sidewalls of the line trenches 179 and over the topmost insulating strips 32T. The continuous metallic material layer is etched back from the sidewalls of the line trenches 179 and from above the topmost insulating strips 32T, for example, by an isotropic wet etch, an anisotropic dry etch, or a combination thereof. Portions of the backside blocking dielectric layer 44 formed within the line trenches 179 or above the topmost insulating strips 32T can be removed by performing an etch process.

Each remaining portion of the deposited metallic material in the backside recesses 43 constitutes an electrically conductive strip 46. Each electrically conductive strip 46 can be word line. Thus, the sacrificial material strips 42 are replaced with the electrically conductive strips 46 after formation of the semiconductor channels 160. The electrically conductive strips 46 may comprise first electrically conductive strips 46A that replace the first sacrificial material strips 42A, and second electrically conductive strips 46B that replace the second sacrificial material strips 42B. In one embodiment, each of the electrically conductive strips 46 may comprise a respective metallic barrier layer 46M and a respective metallic fill material portion 46F.

Each electrically conductive strip 46 can function as a combination of a plurality of transistor gate electrodes (e.g., control gate electrodes) located at a same level and a word line electrically interconnecting, i.e., electrically shorting, the plurality of gate electrodes located at the same level. The plurality of gate electrodes within each electrically conductive strip 46 are the gate electrodes for the charge storage or ferroelectric field effect transistors in a NOR configuration. In other words, each electrically conductive strip 46 can be a word line that functions as a common gate electrode for a plurality of NOR memory cells.

Generally, the first sacrificial material strips 42A and the second sacrificial material strips 42B can be replaced with first electrically conductive strips 46A and second electrically conductive strips 46B. A vertical stack of repetition units RU can be formed between each neighboring pair of line trenches 179 over a substrate 8. Each instance of the repetition unit RU comprises a first electrically conductive strip 46A, a first memory film 50A, a row of discrete semiconductor channels 160 that are laterally spaced apart from each other along a first horizontal direction hd1, a second memory film 50B, a second electrically conductive strip 46B, and an insulating strip 32. Each instance of the repetition unit RU laterally extends along the first horizontal direction hd1.

A row of source/drain pillar structures 61 vertically extends through each vertical repetition of multiple instances of the repetition unit RU. Each row of source/drain pillar structures 61 arranged along the first horizontal direction hd1 can be interlaced with the vertical stacks of discrete semiconductor channels 160. Each vertical stack of semiconductor channels 160 may contact a pair of source/drain pillar structures 61. The vertical stacks of semiconductor channels 160 may be arranged along the first horizontal direction hd1, and may be interlaced with the row of source/drain pillar structures 61. Each of the first electrically conductive strips 46A, the first memory films 50A, the second memory films 50B, the second electrically conductive strips 46B, and the insulating strips 32 comprises a respective row of source/drain openings 29 through which a respective one of the source/drain pillar structures 61 vertically extends.

In one embodiment, each instance of the first electrically conductive strip 46A may optionally be laterally spaced from each of the source/drain pillar structures 61 by a respective backside blocking dielectric layer 44, and may be vertically spaced from a respective instance of the first memory film 50A by the respective backside blocking dielectric layer 44. In one embodiment, each instance of the second electrically conductive strip 46B may optionally be laterally spaced from each of the source/drain pillar structures 61 by a respective additional backside blocking dielectric layer 44, and may be vertically spaced from a respective instance of the second memory film 50B by the respective additional backside blocking dielectric layer 52.

Figure 41B:
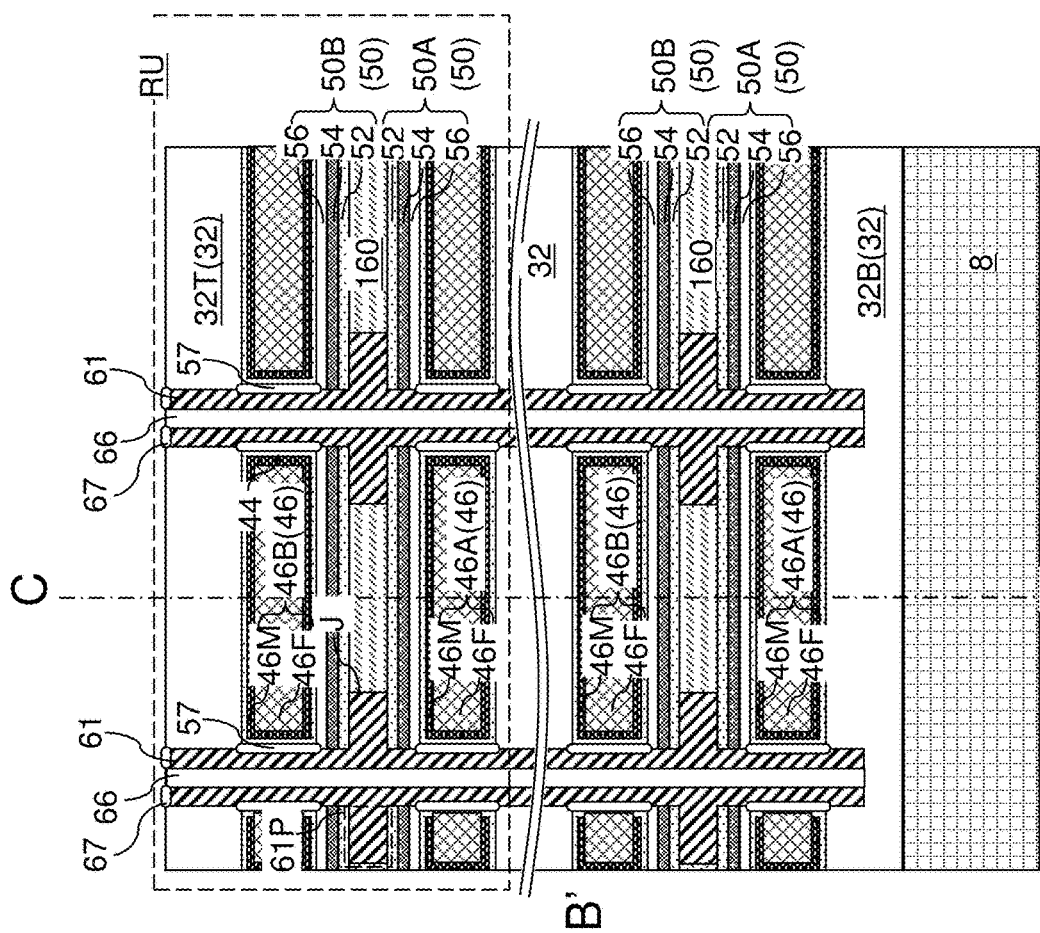
FIGS. 41A, 41B, and 41C are various views of the second exemplary structure after formation of backside trench fill structures according to the second embodiment of the present disclosure.
Figure 41A:
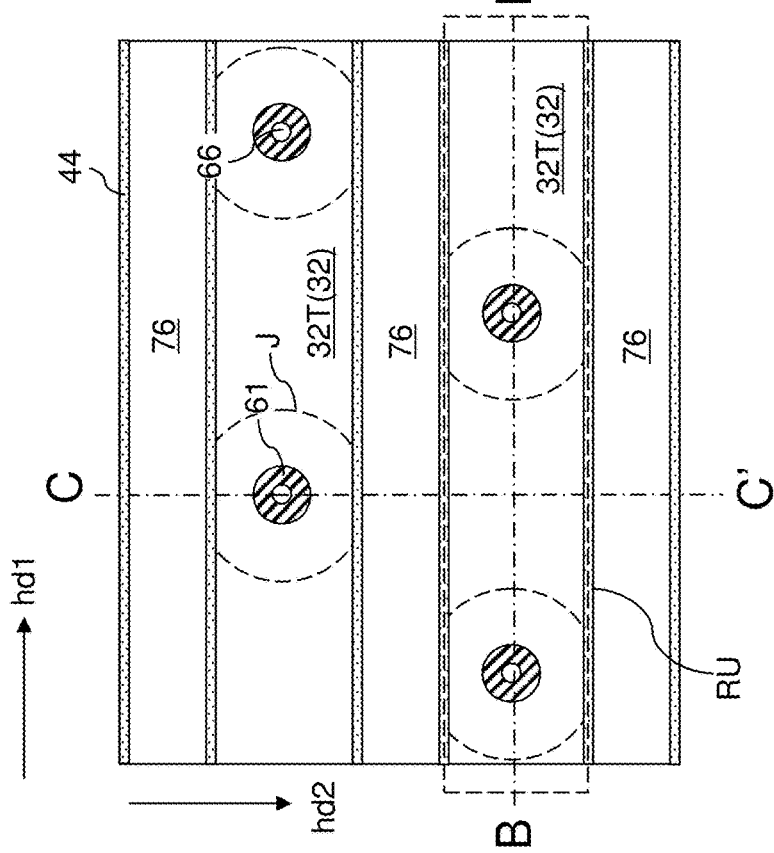
Figure 41C:
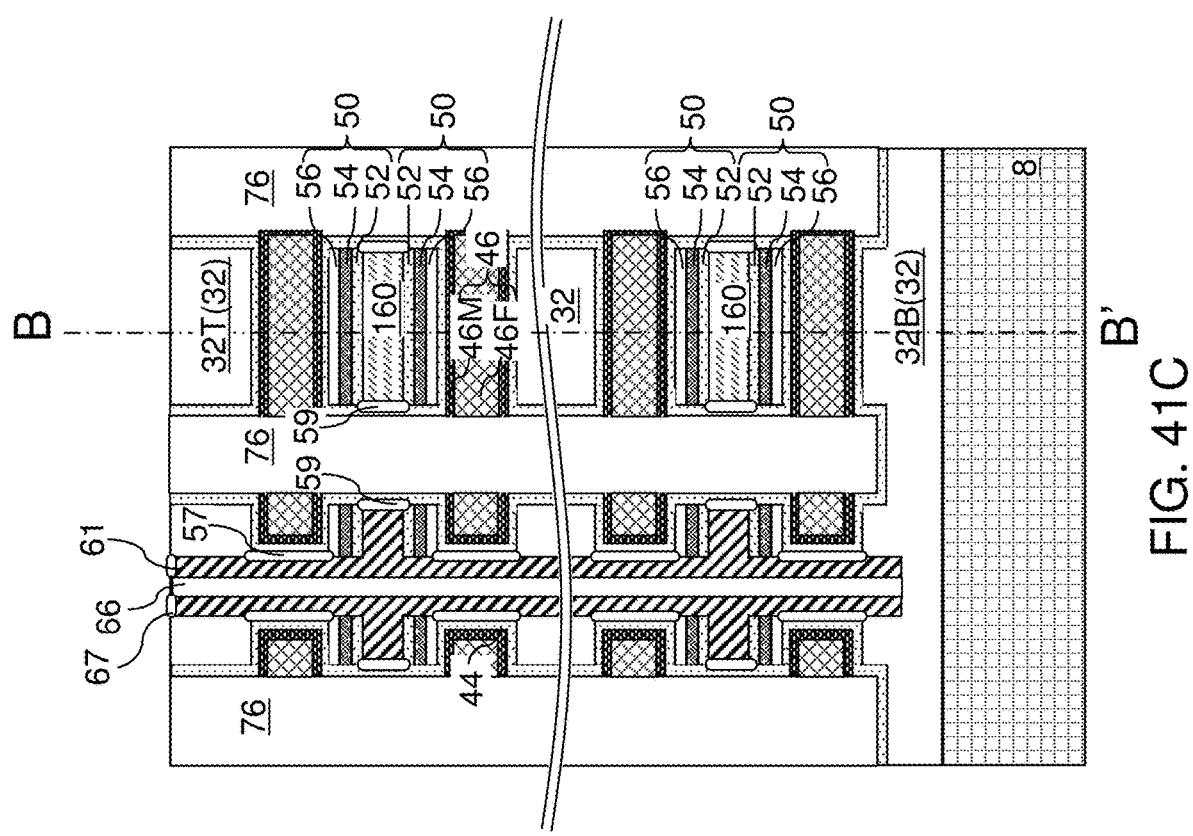

Referring to FIGS. 41A-41C, a dielectric fill material, such as silicon oxide, can be deposited in the line trenches 179 to form dielectric trench fill structures 76. The dielectric trench fill structures 76 can be interlaced with the vertical stacks of the repetition units RU along the second horizontal direction hd2.

Figure 42:
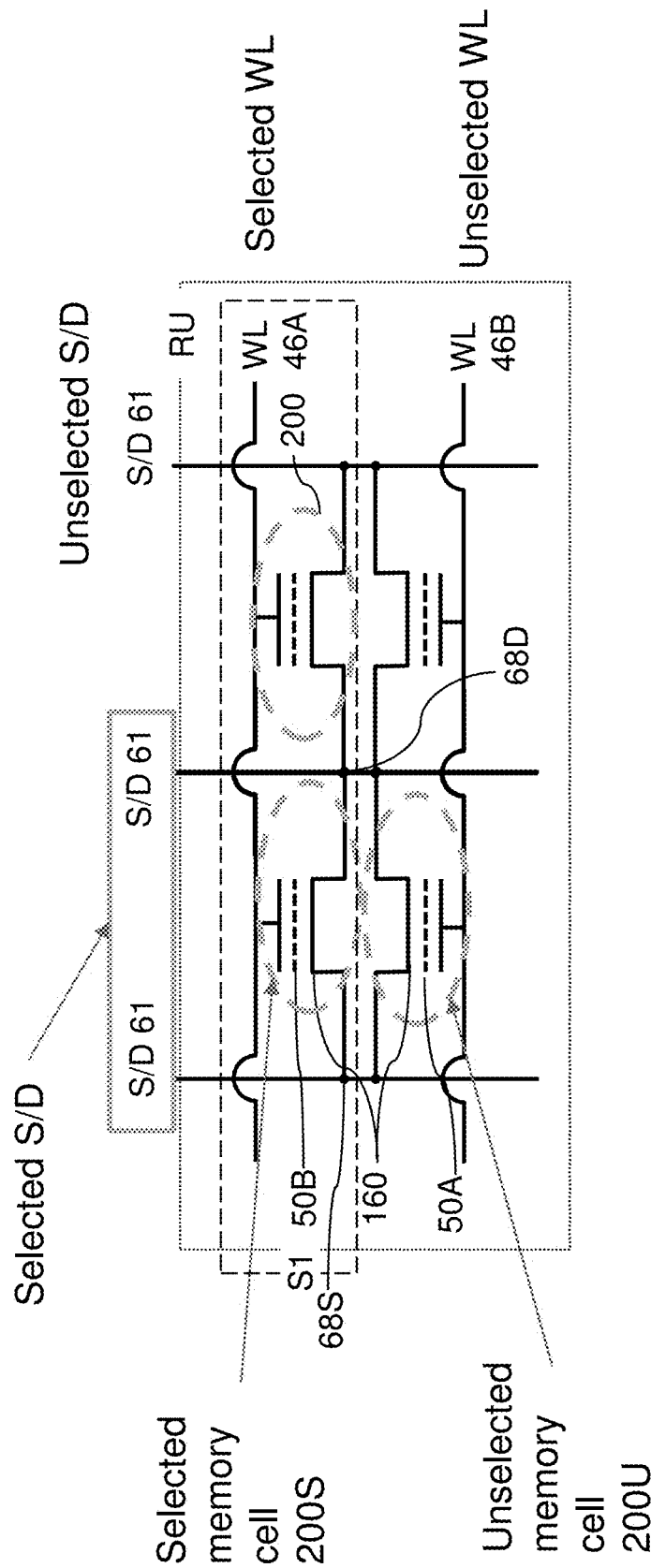
FIG. 42 is a circuit diagram of a NOR memory device of the second exemplary structure according to the second embodiment of the present disclosure.
Figure 43:
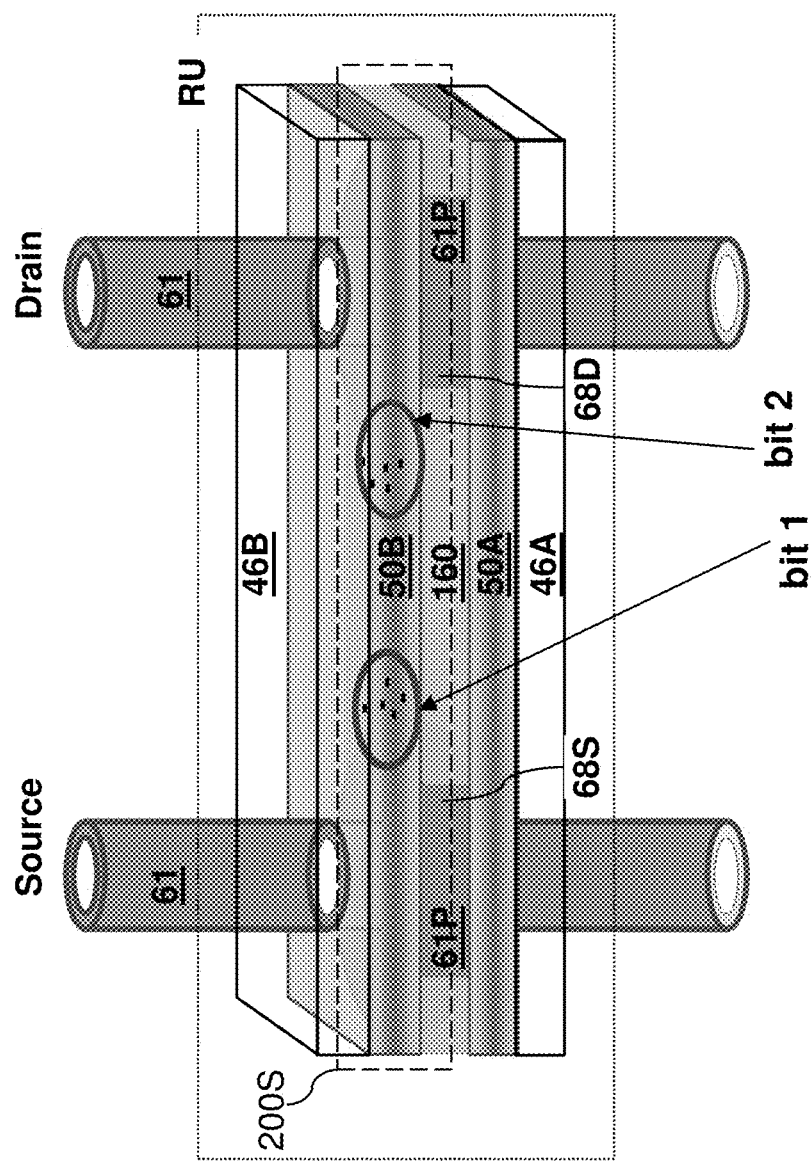
FIG. 43 is schematic perspective view of the NOR memory device of the second exemplary structure according to the second embodiment of the present disclosure

FIG. 42 is a circuit schematic and FIG. 43 is a schematic perspective view of the second exemplary structure of the second embodiment.

As shown in FIGS. 42 and 43, a selected memory cell 200S includes two selected source/drain pillar structures 61 (a portion of one functions as a source 68S and a portion of another one of functions as a drain 68D), a semiconductor channel 160, a second memory film 50B and a second (e.g., selected) word line 46B. The repetition unit RU also includes unselected source/drain pillar structures 61, the first memory film 50A and the first (e.g., unselected) word line 46A in addition to the selected memory cell 200S. Thus, the repetition unit RU also includes an unselected memory cell 200U located below the selected memory cell 200S and sharing the semiconductor channel 160 with the selected memory cell 200S. The bottom surface of the shared horizontal semiconductor channel 160 contacts the first memory film 50A of memory cell 200U, and the top surface of the shared horizontal semiconductor channel 160 contacts the second memory film 50B of memory cell 200S.

In one embodiment, the selected memory cell 200S may be programed and erased by Fowler-Nordheim tunneling. In this embodiment, for programming the selected memory cell 200S, a high programming voltage (e.g., 15 to 25V, such as 20V) is applied to the selected word line 46B, zero volts is applied to the selected source/drain pillar structures 61, and the unselected word line 46A and unselected source/drain pillar structures 61 are allowed to float. For erasing, a high erase voltage (e.g., 15 to 25V, such as 20V) is applied to the selected source/drain pillar structures 61, zero volts is applied to the selected word line 46B, and the unselected word line 46A and unselected source/drain pillar structures 61 are allowed to float. For reading, a low read voltage (e.g., about 2 to 7V, such as 5V) which is lower than the programming voltage is applied to the selected word line 46B, a very low voltage (e.g., less than 1V, such as 0.5 to 0.8V) which is lower than the read voltage is applied to the selected drain (e.g., left or right selected source/drain pillar structure 61), zero volts is applied to the selected source (e.g., the other one of the left or right selected source/drain pillar structures 61) and the unselected word line 46A and unselected source/drain pillar structures 61 are allowed to float.

In another embodiment, the selected memory cell 200S may be programed by channel hot electron (CHE) injection and erased by hot hole tunneling and injection into the charge storage layer 54 of the second memory film 50B. In this embodiment, for programming the drain side of the selected memory cell (e.g., selected transistor) 200S, a positive gate programming bias voltage (e.g., 7V to 15V, such as 9V) is applied to the selected word line 46B, zero volts is applied to the selected source 68S (e.g., the left side selected source/drain pillar structure 61) located on the first (e.g., left) side of the semiconductor channel 160 of the selected field effect transistor 200S, and a positive a drain-side programming bias voltage (e.g., 3 to 6V, such as 5V) lower than the gate programming bias voltage is applied to the selected drain 68D (e.g., the right side selected source/drain pillar structures 61) located on the second (e.g., right) side of the semiconductor channel 160 of the selected field effect transistor 200S. The unselected word line 46A and unselected source/drain pillar structures (i.e., unselected source/drain regions) 61 are allowed to float. This induces charge (e.g., electron) storage in the right side portion second memory film 50B near the drain 68D (e.g., in bit 2 shown in FIG. 43). Thus, the selected field effect transistor 200S comprises a first charge storage material portion (e.g., right side of memory film 50B) located adjacent to the first (e.g., right) side of the semiconductor channel 160, and a second charge storage material portion (e.g., left side of memory film 50B) located adjacent to the second (e.g., left) side of the semiconductor channel 160. The second charge storage material portion corresponding to a second data bit (i.e., bit 2) is programmed by channel hot electron injection during the programming of the selected first field effect transistor 200S without programming the first charge storage material portion corresponding to a first data bit (e.g., bit 1).

For programming the source side of the selected memory cell 200S, a positive gate programming bias voltage (e.g., 7V to 15V, such as 9V) is applied to the selected word line 46B, zero volts is applied to the selected drain 68D (e.g., the right side selected source/drain pillar structure 61 located on the second side of the semiconductor channel 160 of the selected field effect transistor 200S), a positive drain-side programming bias voltage (e.g., 3 to 6V, such as 5V) lower than the programming voltage is applied to the selected source 68S (e.g., the left side selected source/drain pillar structures 61) located on the first side of the semiconductor channel 160 of the selected field effect transistor 200S), and the unselected word line 46A and unselected source/drain pillar structures 61 are allowed to float. This induces charge (e.g., electron) storage in the left side portion of the second memory film 50B near the source 68S (e.g., in bit 1 shown in FIG. 43).

Thus, in this embodiment, two bits may be stored per memory cell 200S. The two bits are laterally physically separated in the memory film 50B of the memory cell 200S. Furthermore, four bits may be stored in the two vertically adjacent memory cells 200S and 200U which share the same semiconductor channel 160 of the repetition unit RU, since two bits may also be stored in the memory cell 200U.

For erasing, a negative erase bias voltage (e.g., 4 to 8V such as 6V) lower than the programming voltage is applied to the selected word line 46B, a positive erase bias voltage (e.g., 3 to 6V, such as 5V) lower than the programming voltage is applied to the selected drain 68D, while the selected source 68S, the unselected word line 46A and unselected source/drain pillar structures 61 are allowed to float. This erases bit 2 in the right side portion of the second memory film 50B near the drain 68D. Alternatively, a negative erase bias voltage (e.g., 4 to 8V such as 6V) lower than the programming voltage is applied to the selected word line 46B, a positive erase bias voltage (e.g., 3 to 6V, such as 5V) lower than the programming voltage is applied to the selected source 68S, while the selected drain 68D, the unselected word line 46A and unselected source/drain pillar structures 61 are allowed to float. This erases bit 1 in the left side of the second memory film 50B near the source 68S.

To read bit 2 near the drain 68D, a low positive gate read bias voltage (e.g., 2 to 5V) lower than the erase voltage is applied to the selected word line 46B, zero volts is applied to the selected drain 68D, a very low positive bit line read voltage (e.g., 1 to 3V) is applied to the selected source 68S, and the unselected word line 46A and unselected source/drain pillar structures 61 are allowed to float. To read bit 1 near the source 68S, a low positive gate read bias voltage (e.g., 2 to 5V) lower than the erase voltage is applied to the selected word line 46B, zero volts is applied to the selected source 68S, a very low positive bit line read bias voltage (e.g., 1 to 3V) is applied to the selected drain, and the unselected word line 46A and unselected source/drain pillar structures 61 are allowed to float.

Referring collectively to FIGS. 31A-43, a semiconductor structure includes a vertical stack of repetition units RU. Each instance of the repetition unit extends along a first horizontal direction hd1 and includes a first electrically conductive strip 46A, a first memory film 50A located over the first electrically conductive strip, discrete semiconductor channels 160 that are laterally spaced apart from each other along the first horizontal direction hd1 and located above the first memory film, a second memory film 50B located above the discrete semiconductor channels, a second electrically conductive strip 46B located above the second memory film, and an insulating strip 32 located above the first electrically conductive strip. Source/drain openings 29 are arranged along the first horizontal direction, interlaced with the discrete semiconductor channels 160, and vertically extending through the vertical stack of repetition units RU, and source/drain pillar structures 61 are located in respective source/drain openings 29, and vertically extending through the vertical stack of repetition units RU.

In one embodiment, the semiconductor structure further comprises a pair of dielectric trench fill structures 76 which extend along the first horizontal direction hd1. Each of the pair of dielectric trench fill structures 76 contacts a respective lengthwise sidewall of the vertical stack of repetition units RU, and the pair of dielectric trench fill structures is laterally spaced apart along a second horizontal direction hd2 that is perpendicular to the first horizontal direction hd1.

In one embodiment, each of the source/drain pillar structures 61 comprises a set of laterally-protruding portions 61P located at a vertical level of the discrete semiconductor channels 160 in each of the repeating units RU; and each laterally-protruding portion 61 within the set of laterally-protruding portions contacts a respective one of the discrete semiconductor channels 160.

In one embodiment, each of the laterally-protruding portions 61P contacts each of the pair of dielectric trench fill structures 76; and each laterally-protruding portion within the set of laterally-protruding portions has a same vertical thickness as the respective one of the discrete semiconductor channels 160. In one embodiment, each laterally-protruding portion 61P within the set of laterally-protruding portions contacts a respective additional one of the discrete semiconductor channels 160.

In one embodiment, each of the laterally-protruding portions 61P comprises a respective horizontal bottom surface that contacts a horizontal top surface segment of a respective one of the first memory films 50A and a respective horizontal top surface that contacts a horizontal bottom surface segment of a respective one of the second memory films 50B. The source/drain openings 29 have a respective circular horizontal cross-sectional shape; and the sidewalls of the laterally-protruding portions 61P that contact the respective discrete semiconductor channel 160P have a convex vertical surface.

In one embodiment, each of the source/drain pillar structures 61 laterally surrounds a cylindrical dielectric core 66 that vertically extends through the vertical stack of the repetition units RU. Each of the source/drain pillar structures 61 vertically extends from a bottommost layer within the vertical stack of repetition units to a topmost layer within the within the vertical stack of repetition units RU.

In one embodiment, the first electrically conductive strips 46A comprise first select gate electrodes; the second electrically conductive strips 46B comprise second select gate electrodes; and each instance of the first memory film 50A and the second memory film 50B comprises a respective layer stack including from one side to another a tunneling dielectric layer 56, a charge storage layer 54, and a blocking dielectric layer 52.

In one embodiment, silicon oxide liners 57 are located between the source/drain pillar structures 61 and the first and second electrically conductive strips (46A, 46B), and the source/drain pillar structures 61 comprise a doped silicon material.

In one embodiment, the semiconductor structure comprises a three-dimensional NOR memory device. In one embodiment, a method of operating the three-dimensional NOR memory device includes programming the three-dimensional NOR memory device using Fowler-Nordheim tunneling; and erasing the three-dimensional NOR memory device using the Fowler-Nordheim tunneling. In another embodiment, a method of operating the three-dimensional NOR memory device includes programming the three-dimensional NOR memory device using channel hot electron injection to store two bits in the second memory film of a selected memory cell; and erasing the three-dimensional NOR memory device using hot hole tunneling and injection into a charge storage layer of the second memory film of the selected memory cell.

The various semiconductor devices of the embodiments of the present disclosure comprise a three-dimensional NOR memory array that can be manufactured with a high device density and potential multi-bit per cell storage capability.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
   first vertical stacks of first field effect transistor strings; and
   second vertical stacks of second field effect transistor strings,
   wherein:
   the first vertical stacks alternate with the second vertical stacks along a first horizontal direction;
   each of the first field effect transistor strings comprises a series connection of a respective set of first field effect transistors that are electrically connected to each other such that each neighboring pair of first field effect transistors share a respective one of a plurality of first source/drain regions;
   each of the second field effect transistor strings comprises a series connection of a respective set of second field effect transistors that are electrically connected to each other such that each neighboring pair of second field effect transistors share a respective one of the second source/drain region;
   the series connection of the respective set of first field effect transistors shares a respective one of a plurality of word lines;
   the first source/drain regions are located in different vertical levels in respective first source/drain pillar structures; and
   the second source/drain regions are located in different vertical levels in respective second source/drain pillar structures.

2. The three-dimensional memory device of claim 1, further comprising:
   first bit lines electrically connected to a respective subset of the first source/drain pillar structures; and
   second bit lines electrically connected to a respective subset of the second source/drain pillar structures.

3. The three-dimensional memory device of claim 2, wherein:
each neighboring pair of one of the first field effect transistor strings and one of the second field effect transistor strings shares the respective one of the plurality of word lines;
the plurality of word lines are laterally spaced apart along the first horizontal direction;
the first bit lines are located below the first source/drain pillar structures; and
the second bit lines are located above the second source/drain pillar structures.

4. The three-dimensional memory device of claim 1, wherein:
each of the first field effect transistor strings comprises a respective first memory film that continuously extends through and is shared by the respective series connection of first field effect transistors; and
each of the second field effect transistor strings comprises a respective second memory film that continuously extends through and is shared by the respective series connection of second field effect transistors.

5. The three-dimensional memory device of claim 1, wherein each of the first field effect transistors comprise a respective pair of charge storage material portions.

6. A method of operating a three-dimensional memory device comprising first vertical stacks of first field effect transistor strings; and second vertical stacks of second field effect transistor strings, wherein: the first vertical stacks alternate with the second vertical stacks along a first horizontal direction; each of the first field effect transistor strings comprises a series connection of a respective set of first field effect transistors that are electrically connected to each other such that each neighboring pair of first field effect transistors share a respective one of a plurality of first source/drain regions; each of the second field effect transistor strings comprises a series connection of a respective set of second field effect transistors that are electrically connected to each other such that each neighboring pair of second field effect transistors share a respective one of the second source/drain region; the series connection of the respective set of first field effect transistors shares a respective one of a plurality of word lines; the first source/drain regions are located in different vertical levels in respective first source/drain pillar structures; and the second source/drain regions are located in different vertical levels in respective second source/drain pillar structures, the method comprising:
applying 0V to a first source/drain region located on a first side of a semiconductor channel of a selected first field effect transistor;
applying a drain-side programming bias voltage to another first source/drain region located on a second side of the semiconductor channel of the selected first field effect transistor; and
applying a gate programming bias voltage to a first word line of the selected first field effect transistor to program the selected first field effect transistor.

7. The method of claim 6, further comprising:
allowing the first and the second source/drain regions of respective unselected ones of the first and second field effect transistors to float during the programming of the selected first field effect transistor; and
allowing to float all of the plurality of word lines other than the first word line during the programming of the selected first field effect transistor.

8. The method of claim 7, wherein:
the selected first field effect transistor comprises a first charge storage material portion located adjacent to the first side of the semiconductor channel, and a second charge storage material portion located adjacent to the second side of the semiconductor channel; and
the second charge storage material portion corresponding to a second data bit is programmed by channel hot electron injection during the programming of the selected first field effect transistor without programming the first charge storage material portion corresponding to a first data bit.

9. The method of claim 8, further comprising:
applying 0V to the first source/drain region located on the second side of the semiconductor channel of the selected first field effect transistor;
applying the drain-side programming bias voltage to the first source/drain region located on the first side of the semiconductor channel of the selected first field effect transistor; and
applying the gate programming bias voltage to the first word line of the selected first field effect transistor to program the first charge storage material portion corresponding to the first data bit by channel hot electron injection without programming the second charge storage material portion corresponding to the second data bit.

10. The method of claim 9, further comprising:
allowing the first and the second source/drain regions of respective unselected ones of the first and second field effect transistors to float during the programming of the first data bit of the selected first field effect transistor; and
allowing to float all of the plurality of word lines other than the first word line during the programming of the first data bit of the selected first field effect transistor.

11. The method claim 8, further comprising:
applying a positive erase bias voltage to the first source/drain region located on the first side of the semiconductor channel of the selected first field effect transistor;
allowing to float the first source/drain region located on the second side of the semiconductor channel of the selected first field effect transistor; and
applying the negative erase bias voltage to the first word line of the selected first field effect transistor to erase the second data bit by hot hole injection without erasing the second data bit of the selected first field effect transistor.

12. The method of claim 11, further comprising:
allowing the first and the second source/drain regions of respective unselected ones of the first and second field effect transistors to float during the erasing of the second data bit of the selected first field effect transistor; and
allowing to float all of the plurality of word lines other than the first word line during the erasing of the second data bit of the selected first field effect transistor.

13. The method of claim 8, further comprising:
applying 0V to the first source/drain region located on the first side of the semiconductor channel of the selected first field effect transistor;
applying a bit line read bias voltage to the first source/drain region located on the second side of the semiconductor channel of the selected first field effect transistor; and applying a gate read bias voltage to the first word line of the selected first field effect transistor to read the second data bit of the selected first field effect transistor.

14. The method of claim 13, further comprising:

allowing the first and the second source/drain regions of respective unselected ones of the first and second field effect transistors to float during the reading of the second data bit of the selected first field effect transistor; and allowing to float all of the plurality of word lines other than the first word line during the reading of the second data bit of the selected first field effect transistor.

15. The method of claim 6, further comprising:

applying 0V to each first source/drain region within the first field effect transistor string that is located on the first side of the semiconductor channel of the selected first field effect transistor; and applying the drain-side programming bias voltage to each first source/drain region within the first field effect transistor string that is located on the second side of the semiconductor channel of the selected first field effect transistor.

16. The method of claim 15, further comprising:

applying the drain-side programming bias voltage to each of the second source/drain regions during programming of the selected first field effect transistor; and applying 0V to all of the plurality of word lines other than the first word line during the programming of the selected first field effect transistor.

17. The method of claim 16, wherein:

the selected first field effect transistor comprises a first charge storage material portion located adjacent to the first side of the semiconductor channel, and a second charge storage material portion located adjacent to the second side of the semiconductor channel; and the second charge storage material portion corresponding to a second data bit is programmed during the programming of the selected first field effect transistor without programming the first charge storage material portion corresponding to a first data bit.

18. The method of claim 17, further comprising:

applying 0V to each first source/drain region within the first field effect transistor string that is located on the first side of the semiconductor channel of the selected first field effect transistor;

applying a bit line read bias voltage to each first source/drain region within the first field effect transistor string that is located on the second side of the semiconductor channel of the selected first field effect transistor; and applying a gate read bias voltage to the first word line of the selected first field effect transistor to read the second data bit of the selected first field effect transistor.

19. The method of claim 16, wherein the second data bit of the selected first field effect transistor is read without reading the first data bit of the selected first field effect transistor.

20. The method of claim 15, further comprising erasing the three-dimensional memory device by:

applying an erase bias voltage to the first and the second source/drain regions; and applying 0V each of the plurality of word lines.

* * * * *